(12) United States Patent
Kern et al.

(10) Patent No.: US 10,903,859 B2
(45) Date of Patent: Jan. 26, 2021

(54) ERROR DETECTION BY MEANS OF GROUP ERRORS

(71) Applicant: Infineon Technologies AG, Neubiberg (DE)

(72) Inventors: Thomas Kern, Aschheim (DE); Michael Goessel, Mahlow (DE); Thomas Rabenalt, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/380,089

(22) Filed: Apr. 10, 2019

(65) Prior Publication Data

US 2019/0312601 A1  Oct. 10, 2019

(30) Foreign Application Priority Data

Apr. 10, 2018 (DE) .......................... 10 2018 108 446
Dec. 10, 2018 (DE) .......................... 10 2018 131 613

(51) Int. Cl.
 *H03M 13/29* (2006.01)
 *H03M 13/25* (2006.01)
 *H03M 13/27* (2006.01)
 *G06F 11/10* (2006.01)
(52) U.S. Cl.
 CPC ..... *H03M 13/2942* (2013.01); *G06F 11/1004* (2013.01); *H03M 13/251* (2013.01); *H03M 13/2735* (2013.01)

(58) Field of Classification Search
 CPC .......... H03M 13/2942; H03M 13/251; H03M 13/2735; G06F 11/1004
 See application file for complete search history.

(56) References Cited

U.S. PATENT DOCUMENTS

| 6,378,103 | B1* | 4/2002 | Han | G11B 20/18 |
| | | | | 714/769 |
| 6,615,387 | B1* | 9/2003 | Williamson | H03M 13/091 |
| | | | | 714/758 |
| 9,594,642 | B1* | 3/2017 | Bentley | G06F 11/106 |
| 2004/0187065 | A1* | 9/2004 | Hwang | G11B 27/3027 |
| | | | | 714/762 |
| 2007/0094573 | A1* | 4/2007 | Chen | G11B 20/1833 |
| | | | | 714/769 |
| 2014/0013181 | A1* | 1/2014 | Fredrickson | H03M 13/03 |
| | | | | 714/753 |

OTHER PUBLICATIONS

Fujiwara, Eiji; "Code Design for Dependable Systems, Theory and Practical Applications"; Wiley-Interscience; John Wiley & Sons, Inc., Publication, p. 65.

(Continued)

*Primary Examiner* — Kyle Vallecillo
(74) *Attorney, Agent, or Firm* — Eschweiler & Potashnik, LLC

(57) ABSTRACT

A solution is proposed for processing data bits, in which the data bits are transformed into first data bytes by means of a first transformation, in which the first data bytes are stored in a memory, in which second data bytes are read from the memory, in which each of the second data bytes, when there is no error, is a codeword of a block error code and in which one error signal per second data byte is determined that indicates whether or not this second data byte is a codeword.

26 Claims, 19 Drawing Sheets

(56) References Cited

OTHER PUBLICATIONS

Lin, Shu, et al.; "Error Control Coding Fundamentals and Applications"; 1983, Prentice-Hall, Inc., pp. 32-33.
Rao, T.R.N. et al.; "Error-Control Coding for Computer Systems"; Max-Planck Gesellschaft, Prentice-Hall International, Inc. pp. 222-226.
Okano, Hirokazu et al. "A Construction Method of High-Speed Decoders Using ROM's for Bose-Chaudhuri-Hocquenghem and Reed-Solomon Codes"; Oct. 1987; IEEE Transactions on Computers, vol. C-36, No. 10; pp. 1165-1171.

* cited by examiner

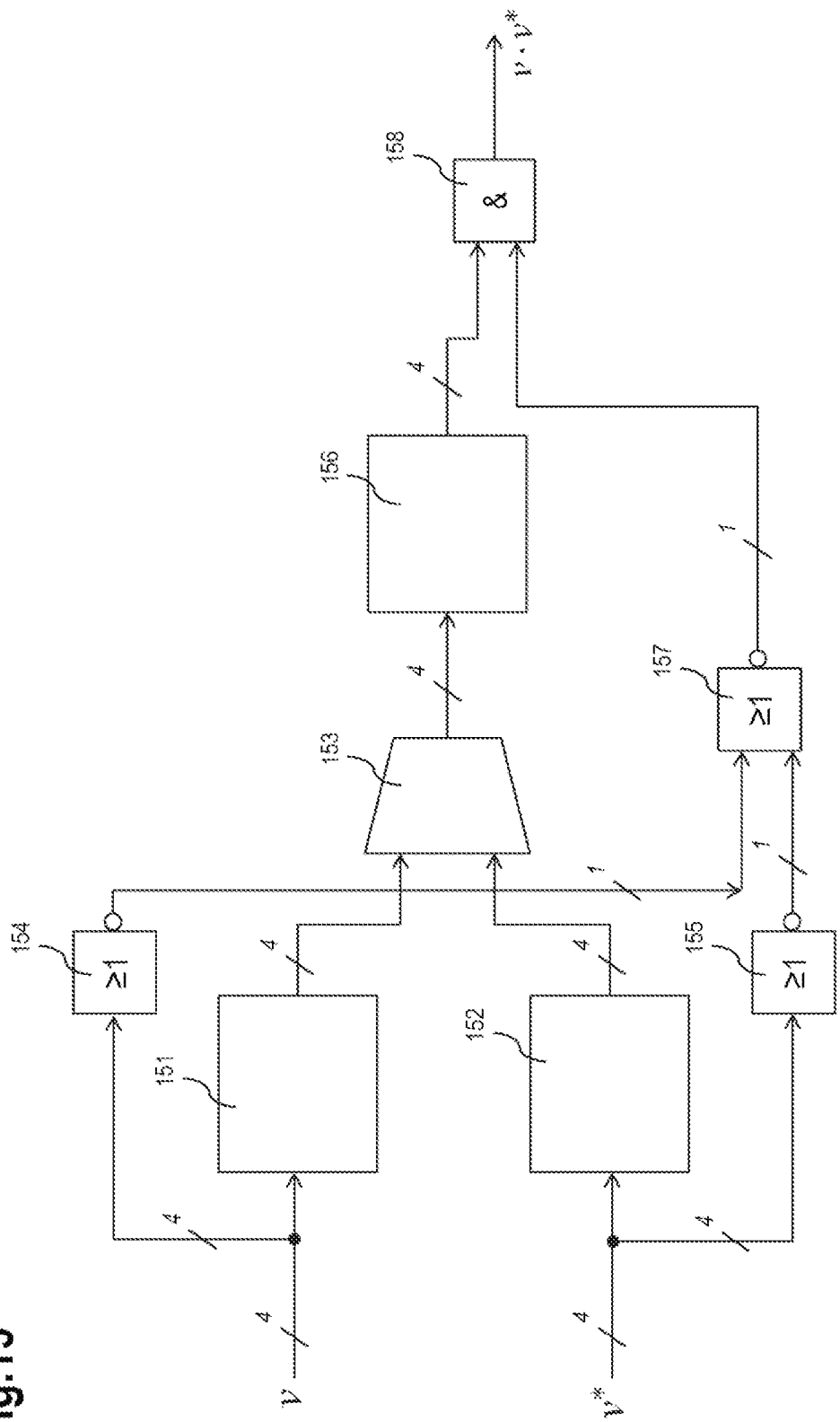

ERROR DETECTION BY MEANS OF GROUP ERRORS

REFERENCE TO RELATED APPLICATIONS

This application claims priority to DE 10 2018 181 613.5 filed on Dec. 10, 2018, which claims priority to DE 10 2018 108 446.3 filed on Apr. 10, 2018, the contents of which are incorporated by reference in their entirety.

SUMMARY

The object of the disclosure is to improve an error correction.

The object is achieved by proposing a method for processing data bits,
in which the data bits are transformed into first data bytes by means of a first transformation,
in which the first data bytes are stored in a memory,
in which second data bytes are read from the memory,
in which each of the second data bytes, when there is no error, is a codeword of a block error code, and
in which one error signal per second data byte is determined that indicates whether or not this second data byte is a codeword.

A data byte comprises multiple data bits. The data bits and data bytes can comprise any information, e.g. data, programs, keys, etc.

The data bits can be transformed into the first data bytes in particular reversibly uniquely. The transformation can ensure that each of the first data bytes forms a codeword of the block error code. The first data bytes can be bytes of memory cell values that are then written to the memory.

The first data bytes can be the same as the second data bytes. The second data bytes can differ from the first data bytes, for example if the memory has an error or if an error has arisen generally during reading of the second data bytes.

When there is no error, the read second data bytes are the same as the written first data bytes. Therefore, the error-free read second data bytes are codewords of the block error code (or of the multiple block error codes if e.g. a separate block error code is used for each data byte).

In one embodiment, each of the second data bytes is checked by means of a separate error detection circuit for whether or not it is a codeword. There is thus provision for multiple error detection circuits, one per second data byte. The error detection circuits can be used to check whether the second data bytes are codewords of a block error code or multiple block error codes. By way of example, one separate block error code can be checked per error detection circuit.

The transformation allows the data bits to be transformed into the first data bytes such that the number of bits in the data bits is smaller than the number of bits per transformed first data byte. One option is for the number of data bits transformed into a first data byte to be at least two bits smaller than the number of bits in the first data byte. As such, for example 4 respective data bits can be transformed into first data bytes that each have 6 data bits; accordingly, 4 respective bits are transformed into 6 bits, these 6 bits (if transformation is successful) representing a codeword of the block error code used.

If for example 32 data bits are transformed into first data bytes, these 32 data bits can be divided into 8 blocks, each of which comprises 4 bits. Each block having the size 4 bits is then transformed into a first data byte that, in example fashion, comprises 6 bits. In total, the 32 data bits forming 8 blocks of 4 data bits each are thus transformed into 8 first data bytes, each of which has 6 bits. From the 32 data bits, 48 bits are thus obtained that are stored in the memory.

According to this example, 8 second data bytes are then read from the memory, each of the second data bytes again comprising 6 bits. One error signal per second data byte is determined that indicates whether the respective second data byte is a codeword of the (respective) block error code.

The second data bytes are then transformed back into inverse data bytes (also referred to as bytes of read, possibly erroneous data bits or as back-transformed data bits or data bytes), the inverse data bits being able to be corrected by means of an error correction. For the error correction, the error signals can be used to concentrate the error correction on those inverse data bytes (what are known as group errors) that have already been detected as erroneous.

If for example one of the second data bytes is erroneous, then this is transformed back into an erroneous inverse data byte by means of the inverse transformation. Since the second data byte is not a codeword of the block error code, for example the value of the inverse data byte is 0. It is thus possible to detect that there is an error here that needs to be corrected where possible.

Ultimately, it is therefore particularly efficiently possible not only to detect errors but also to narrow them down to applicable bytes. By way of example, it is therefore possible to use the data bits of error-free bytes or just not to use the data bits of erroneous data bytes.

The correction of group errors is possible in particular more efficiently than the correction of errors whose byte position is not known beforehand. Particular error codes can be used to correct more group errors than errors whose byte positions are not known beforehand. It is therefore possible to improve the reliability of the stored data.

In one embodiment, each bit and/or each memory cell value can be provided for storing at least two values. When there are more than two values, each bit is a multibit. In particular, there can be provision for multibit memory cells.

One development is that the data bits are transformed into first data bytes by means of the at least one block error code.

It is possible that different block error codes are used for different first data bytes. It is also possible for the same block error code to be used for the first data bytes for the transformation.

One development is that the at least one block error code is an m-of-n code.

In the case of the m-of-n code, a group of bits is reversibly uniquely transformed into another group of bits, with— provided that the transformation was error-free—the group of transformed bits having a number of n bits with a number of m first values and a second number (n−m) of second values. In the total of n bits, there is thus a number of m first values. The first values can be e.g. 0 or the value 1, provided that the values are binary.

In this example, the error signal can indicate that there is an error in the second data byte if the number of read first values per second data byte is not equal to m.

One development is that the at least one error signal is taken as a basis for performing an error correction.

One development is that the data bits were coded by means of an error code.

The error code is for example determined on the basis of the data bits, the data bits being able to form groups of bits.

The error code is an additional error code to the block error codes. The error code is for example a byte-error-correcting and/or byte-error-detecting code. The error code can also be a bit-error-correcting and/or bit-error-detecting code. The error code is a code superordinate to the block error codes, i.e. the error code is used in addition to the block error codes. The block error codes are used to determine the error signal, and the error code allows the at least one erroneous second data byte to be corrected based on the error signal (or multiple error signals for multiple second data bytes).

The error code can be used to correct byte errors with a known erroneous byte position, what are known as group errors. The error code can also be used to correct byte errors with an unknown erroneous byte position.

By way of example, the data bits can be or comprise codewords of the error code.

It is also possible for each of the first data bytes to be multivalued. In this case, the read second data bytes are also multivalued. Therefore, for example more than two digital values per memory cell of the memory can be stored. It is therefore possible for a read second data byte to have for example a number of n1 zeros, n2 ones and n3 twos. An error can then be detected if the number of read zeros is not equal to n1, if the number of read ones is not equal to n2 or if the number of read twos is not equal to n3.

One development is that the error code is a byte-error-correcting code, in particular a Reed-Solomon code.

One development is that the second data bytes are transformed into inverse second data bytes by means of a second transformation, which is the inverse of the first transformation.

Therefore, the first transformation is used to transform the data bits into first data bytes and the second transformation is used to transform the possibly erroneous second data bytes read from the memory back into inverse second data bytes. These inverse second data bytes can then be corrected by means of the error code.

One development is that the error signal is used to correct the inverse second data byte by means of the error code, provided that the second data byte is not a codeword of the block error code.

One development is that at least one inverse second data byte is corrected on the basis of the error signal by means of the error code if the error signal indicates that the second data byte on which the inverse second data byte is based is not a codeword of the block error code.

One development is that if error signals indicate an erroneous i-th and an erroneous j-th second data byte, then a byte correction value ei is determined for an i-th inverse second data byte Xi' on the basis of subsyndromes s1 and s2 of an error syndrome, the byte position i and a component-by-component XOR sum αi+αj, where α is the generating element of the Galois field used.

One development is that the byte correction value ei for correcting the i-th inverse second data byte Xi' is determined such that it holds that:

$$e^i = s_1 + \frac{s_2 + \alpha^i \cdot s_1}{\alpha_i + \alpha_j}.$$

One development is that the byte correction value ei is determined according to:

$$e^i = s_1 + s_2 \cdot \Sigma^{-1} + \alpha^i \cdot s_1 \cdot \Sigma^{-1},$$

where it holds that $$\Sigma = E_0 \cdot \alpha^0 + E_1 \cdot \alpha^1 + \ldots + E_{L-1} \cdot \alpha^{L-1},$$

and where $E_0, E_1, \ldots, E_{L-1}$ denote the block error signals for the (L−1) second data bytes.

It is advantageous that the byte correction value ei can be determined to the i-th byte, when there is a group error or when there are two group errors (for the i-th and for the j-th second data byte), according to an identical functional relationship and hence also by means of a circuit type on the basis of $\Sigma$, if $\Sigma$ is determined as $$\sum = E_0 \cdot \alpha^0 + \ldots + E_{L-1} \cdot \alpha^{L-1} = \begin{cases} \alpha^i & \text{for group error in } i\text{-}th \text{ bytes} \\ \alpha^i + \alpha^j & \text{for group errors in } i\text{-}th \text{ and } j\text{-}th \text{ bytes} \end{cases}$$

where $E_i$ and $E_j$ are the error signals for the i-th second data byte and for the j-th second data byte.

If there is only one group error at the position of the i-th second data byte, then the error signal Ei=1, and all other error signals are equal to 0. If there are two group errors at the positions of the i-th second data byte and the j-th second data byte, then the error signals Ei=Ej=1, and all other error signals are equal to 0.

One development is that at least two byte correction values are determined in parallel, wherein at least one byte correction value is determined for an inverse second data byte that is correct and does not require correction.

In this context, in parallel means in particular that the determination and/or provision of byte correction values can be effected with overlapping timing, in particular substantially at the same times, at least in some cases. Therefore, an advantageous option is that only a constant multiplier, two XOR circuits and an AND circuit are needed per byte for the correction.

One development is that
the first data bytes and the first check bits, which are determined based on the first data bytes, are stored in the memory,
second data bytes and second check bits are read from the memory, and
the error signal and the second check bits are used to correct the second data byte, provided that the second data byte is not a codeword of the block error code.

Therefore, a correction is made based on the second data bytes and the check bits. This involves corrected second data bytes being determined. The corrected second data bytes are in particular second data bytes that have been handled by means of a byte correction value formation unit (see e.g. reference sign 37 in FIG. 3b). In this case, individual bits of the respective second data byte can be changed (i.e. corrected). It is also possible for this correction step not to result in a change (in individual or multiple) second data bytes; nevertheless, the second data bytes correspond, after the correction step (that is to say handling by the byte correction value formation unit 37 and the XOR circuits 380 to 38L−1 shown in FIG. 3b), to the "corrected second data bytes" denoted below. The reason for this is that the correction circuit (comprising byte correction value formation unit 37 and the XOR circuits 380 to 38L−1) allows (substantially or actually) parallel correction of the second data bytes, even if the XOR circuits ensure that an error-free second data byte is ultimately not changed (the correction value 0 is XORed with the error-free second data byte on a component-by-component basis). In this respect, the correction circuit generates the aforementioned "corrected second data bytes"

from the second data bytes, irrespective of whether the individual corrected second data byte differs from the second data byte.

One option is to perform the error correction using an error code for the data bits and/or using check bits for the data bytes.

One development is that the corrected second data bytes are transformed into inverse corrected second data bytes by means of a second transformation, which is the inverse of the first transformation.

One development is that at least one second data byte is corrected on the basis of the error signal by means of the check bits if the error signal indicates that the second data byte is not a codeword of the block error code.

One development is that at least two byte correction values are determined for at least two second data bytes in parallel, wherein at least one byte correction value is determined for a second data byte that is correct and does not require correction.

One development is that the check bits are used to correct the second data byte, for which the error signal was determined, by means of the check bits.

One development is also that at least two error signals are used to correct those second data bytes for which these at least two error signals were determined, by means of the check bits.

One development is that an error correction is performed for at least two group errors or for an error at an unknown byte position.

The group error is an error whose byte error position is known.

One development is that if the error signal indicates that a particular second data byte is not a codeword of the applicable block error code, then at least one erroneous bit of this second data byte is corrected taking into consideration the group error.

One development is that erroneous second data bytes are corrected in parallel or substantially in parallel.

In this context, in parallel means in particular that the determination and/or provision of byte correction values can be effected with overlapping timing, in particular substantially at the same times, at least in some cases.

In particular, multiple byte correction value formation units can be implemented in parallel for bytes to be corrected. In particular, the byte correction values can be determined during at least one clock cycle, for example during a succession of common clock cycles or during a succession of a portion of common clock cycles (that is to say with overlapping timing). The at least partially overlapping timing allows parallel processing. In this case, it should be noted that the term parallel determination in particular also covers partially parallel (that is to say e.g. partially simultaneous) handling.

By way of example, a correction value not equal to 0 can be provided for the erroneous second data bytes and a correction value equal to 0 can be provided for the error-free second data bytes. Therefore, correction values can be determined, and provided at various outputs of a correction circuit, for all second data bytes to be corrected. The correction values can be reversibly uniquely combined, for example by an XOR circuit, with the bits of the bytes that are to be corrected. The error signals can be used to determine whether a second data byte is supposed to be corrected. If a second data byte is not supposed to be corrected, then for example the individual bits of the second data byte can be XORed with the value 0.

If the error signal indicates that there is a group error at the byte position of the affected second data byte, the corrected bits determined by the correction circuit for the group error are combined, for example by an XOR circuit, with the bits of the byte to be corrected.

If the error signal indicates that there is no group error at the byte position of the second data byte, then for example the correction circuit can provide bits having the value 0, which can be XORed with the error-free bits without changing them.

If there is no error signal, there can nevertheless be a byte error that has not been detected by the block error codes, however. In this case, the byte error can be corrected by means of the error code without the assistance of a byte error position determined beforehand.

One option is for the correction of second data bytes to be performed only in so far as useful data bits are affected and check bits accordingly not to be corrected. Alternatively, useful data bits and check bits can also be corrected.

One development is that neither the first data byte nor the second data byte comprises more than 12 bits each.

It may be advantageous in one embodiment that no more than 6, 7, 8, 9, 10, 11 or 12 bits are used per first and/or second data byte. A byte in the Reed-Solomon code is considered to be an element of the Galois field $GF(2b)$ (where b denotes the number of bits per byte in this case). An implementation, for example a parallel implementation of an error correction circuit, where correction values for individual, possibly erroneous bytes are provided at different outputs for the different bytes, may be very complex for larger values than e.g. of 10 bits or 12 bits.

One development is that at least two error signals are determined for at least two of the second data bytes in parallel or substantially in parallel. In this context, parallel or substantially in parallel means in particular that the determination of the error signals can be effected with overlapping timing, in particular substantially at the same times, at least in some cases.

The object is also achieved by proposing an apparatus for processing data bits,
comprising a processing unit, wherein the processing unit is configured
to transform the data bits into first data bytes by means of a first transformation,
to store the first data bytes in the memory,
to read second data bytes from the memory, wherein each of the second data bytes, when there is no error, is a codeword of a block error code, and
to determine one error signal per second data byte, wherein the error signal indicates whether or not this second data byte is a codeword.

The processing unit cited here can be embodied in particular as a processor unit and/or an at least partially hard-wired or logical circuit arrangement that is configured, for example, such that the method is performable as described herein. Said processing unit can be or comprise any type of processor or calculator or computer with accordingly necessary peripherals (memory, input/output interfaces, input/output devices, etc.).

One option is that for each second data byte there is provision for an error detection circuit configured to determine the error signal for this second data byte.

Furthermore, one option is that there is provision for a correction value formation unit for correcting memory cell values. The correction value formation unit determines, for example when an error signal indicates that a byte of memory cell values is erroneous, a byte correction value not equal to 0 for correcting the byte of erroneous memory cell values.

One option is also that the correction value formation unit is used for correcting data bits. The correction value formation unit determines, for example when an error signal indicates that a byte of memory cell values is erroneous, a byte correction value not equal to 0 for correcting the erroneous data byte previously transformed into an erroneous byte of memory cell values.

Using error signals from block error codes, a combined error signal for bytes of memory cell values can be formed that assumes a first value when one of the error signals used indicates an error and assumes a second value when all error signals indicate no error.

The error signals can be binary and the combined error signal can be determined as an XOR combination or as an OR combination of the error signals.

The explanations above concerning the method apply to the apparatus accordingly. The apparatus can be embodied in one component or distributed in multiple components.

The aforementioned object is also achieved by means of a system comprising at least one of the apparatuses described here.

One development is that the memory comprises at least one of the following components:
 a cache memory,
 a register or a register array,
 a flash memory,
 an MRAM,
 an SRAM,
 a RE-RAM,
 a PC-RAM,
 an FE-RAM,
 a CB-RAM,
 a multibit memory, and
 a multilevel memory One development is that the memory is part of the apparatus or is embodied separately therefrom.

One development is that the processing unit is further configured to transform the second data bytes into inverse second data bytes by means of a second transformation, which is the inverse of the first transformation.

One development is that the processing unit is further configured
 to store the first data bytes and first check bits, wherein the first check bits are determined based on the first data bytes,
 to read the second data bytes and second check bits from the memory, and
 to correct the second data byte on the basis of the error signal and on the basis of the second check bits, provided that the second data byte is not a codeword of the block error code.

Further, an apparatus is proposed for processing data bits, comprising
 means for transforming the data bits into first data bytes by means of a first transformation,
 means for storing the first data bytes in the memory,
 means for reading second data bytes from the memory, wherein each of the second data bytes, when there is no error, is a codeword of a block error code, and
 means for determining one error signal per second data byte, wherein the error signal indicates whether or not this second data byte is a codeword.

Furthermore, a computer program product is proposed that is directly loadable into a memory of a digital computer, comprising program code parts suitable for performing steps of the method described here.

A non-transitory computer-readable storage medium is also specified, comprising computer-executable instructions suitable for the computer to perform steps of the method described here.

The properties, features and advantages of this disclosure that are described above and the way in which they are achieved are described below in connection with a schematic description of example embodiments that are explained in more detail in connection with the drawings. For the sake of clarity, elements that are the same or that have the same effect can be provided with the same reference signs in this case.

BRIEF DESCRIPTION OF THE DRAWINGS

FIG. 5a shows an example implementation of the transformation circuit 22 shown in FIG. 2a;

Figure 10:
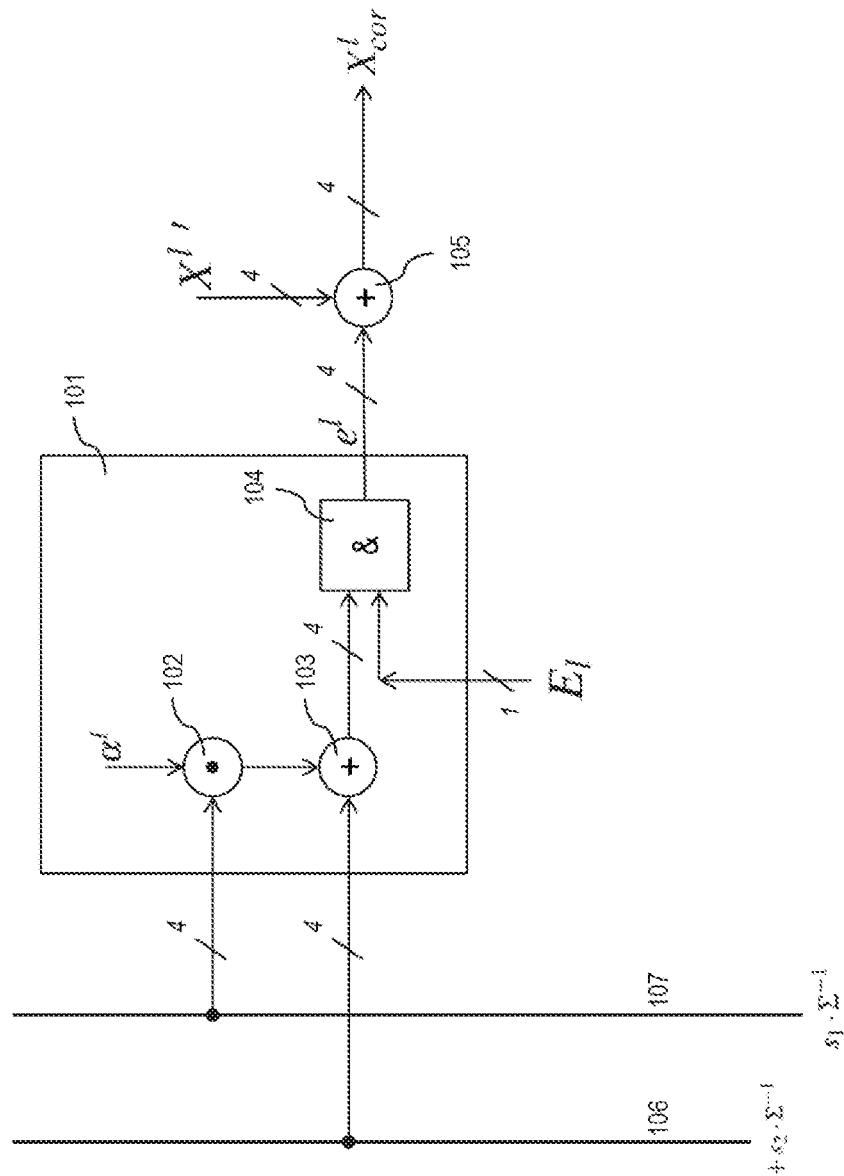
Figure 11:
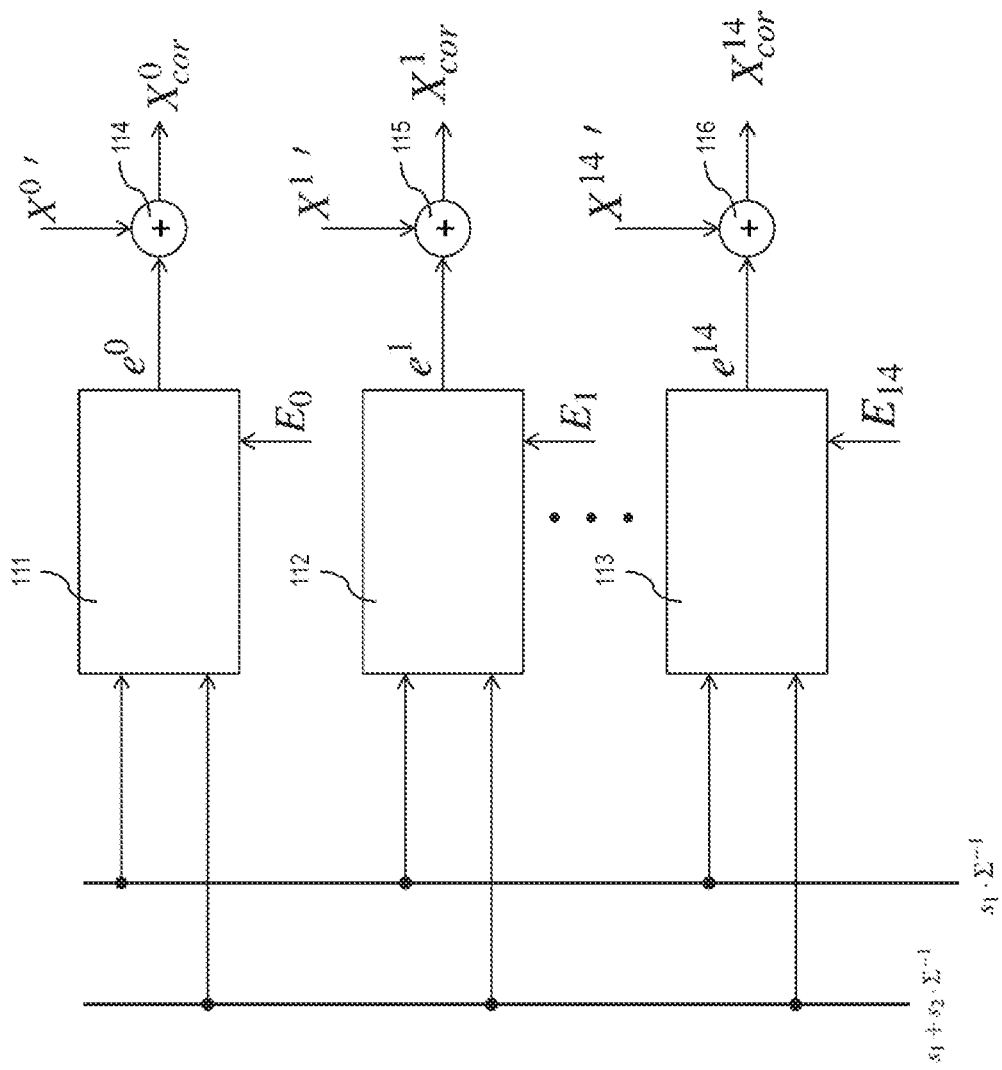
Figure 12:
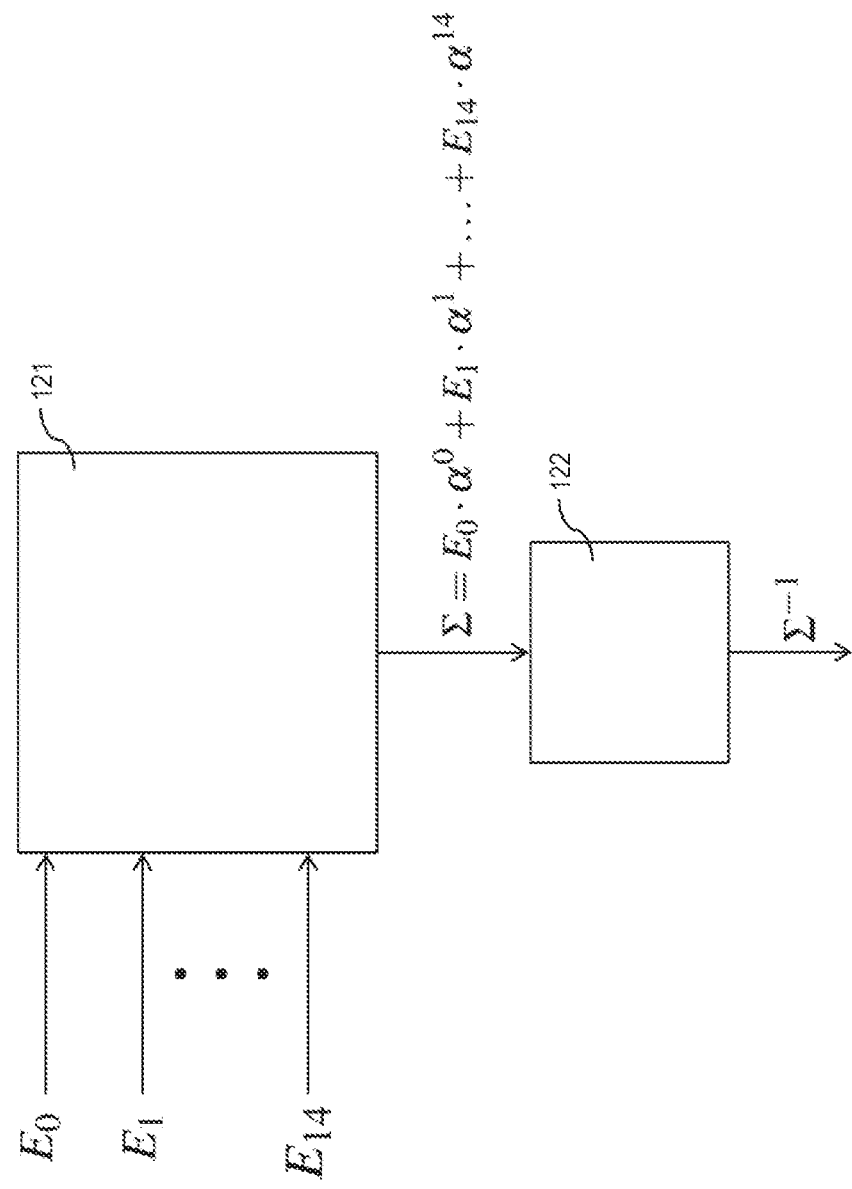
Figure 13:
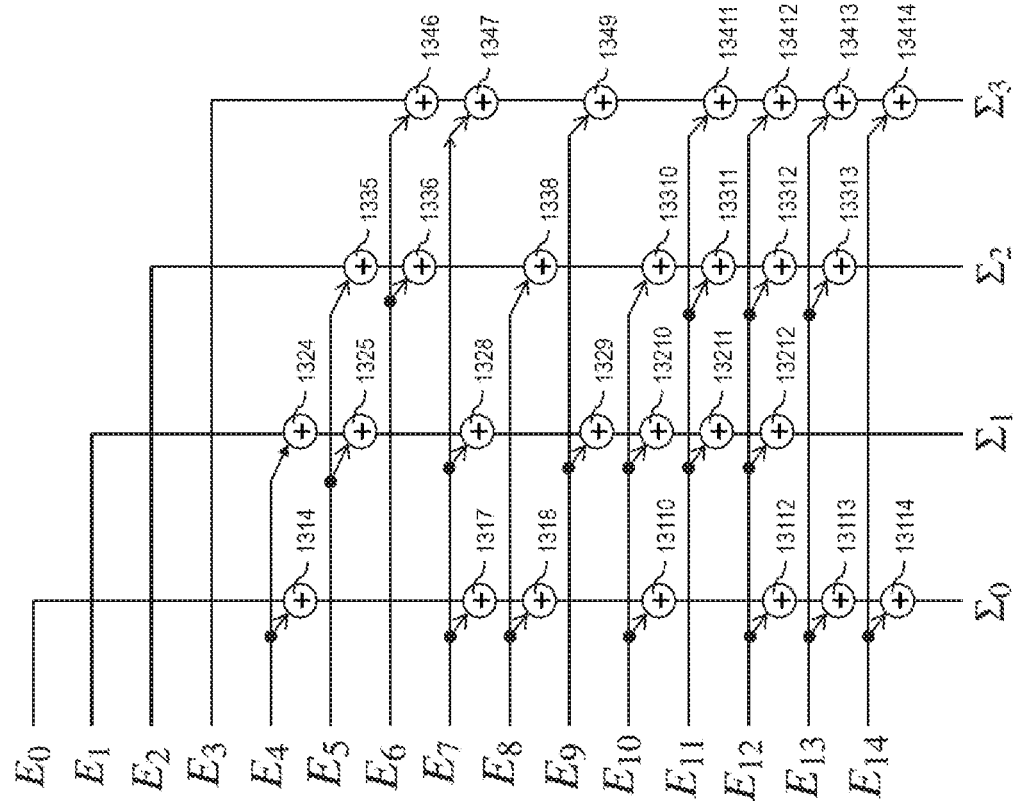
Figure 14:
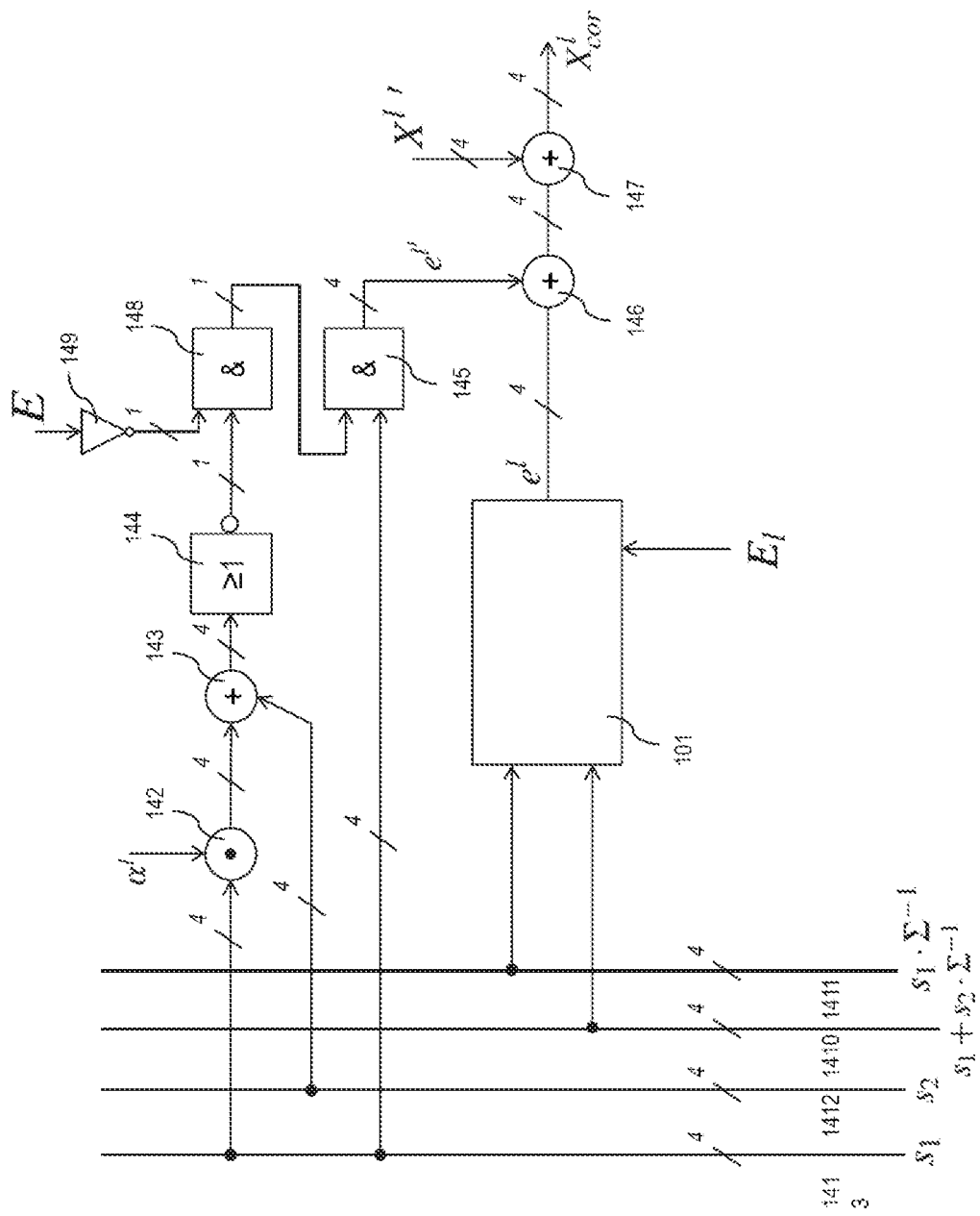
Figure 16A:
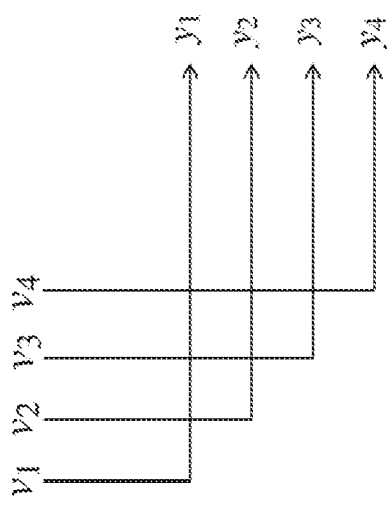
Figure 16B:
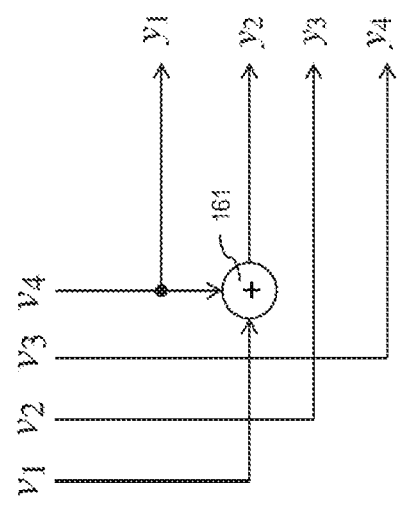
Figure 16C:
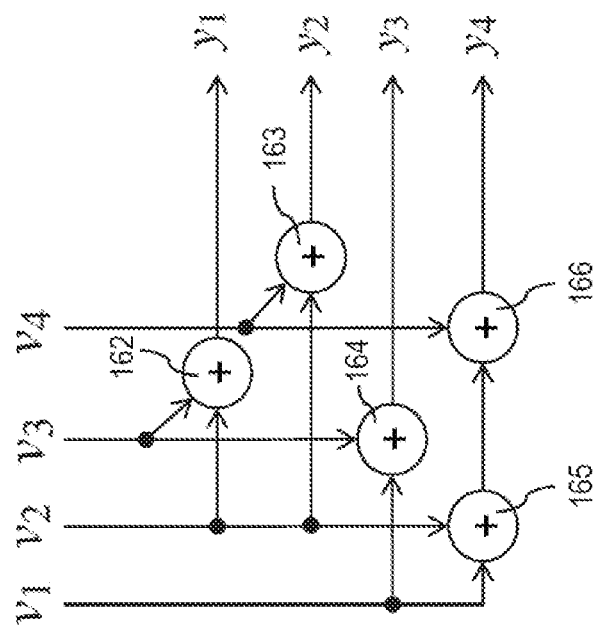

when a byte error in the i-th, j-th and k-th bytes is indicated by the error signals $E_i = E_j = E_k = 1$;

FIG. 10 shows an example circuit arrangement that determines the byte correction value for an arbitrary, possibly erroneous (-th byte on the assumption that an erroneous byte position or two erroneous byte positions is/are known and hence a group error or two group errors has/have occurred;

FIG. 11 shows an example circuit arrangement for a parallel realization of 15 byte correction value formation units;

FIG. 12 shows an example circuit arrangement for determining $\Sigma$-1;

FIG. 13 shows an example implementation of the combination circuit 121 from FIG. 12 for forming Σ from the error signals E0 to E14 using XOR circuits;

FIG. 14 shows an example circuit arrangement for correcting group errors on the basis of error signals E0 to EL−1 determined by the error detection circuits 130 to 13L−1 and for correcting errors not detectable as group errors by the error detection circuits 130 to 13L−1;

FIG. 15 shows an example circuit arrangement for multiplying two elements of a Galois field, wherein these elements are provided in their vector representation;

FIG. 16a shows a possible realization for a constant multiplier for the constant α0 with the vector representation α=1000;

FIG. 16b shows a possible realization for the constant multiplier for the constant α1 with the vector representation α=0100;

FIG. 16c shows a possible realization for the constant multiplier for the constant α6 with the vector representation α=0011.

DETAILED DESCRIPTION

General Notes on Error Codes

The error codes used here (also referred to as codes) are linear or nonlinear codes.

By way of example, it is possible to describe a linear code C by means of a generator matrix G (also referred to as G matrix) or by means of an H-matrix H. In the examples, to simplify representation, linear codes, in particular linear codes in which useful data are binary useful data bits (or useful data bytes), are considered first of all. In this case, a byte comprises a number of b bits, where b≥2. The useful data bits are also referred to as information bits.

If the code C has a number of q useful data bits $$u = u_1, \ldots, u_q$$

then a codeword $$x = x_1, \ldots, x_k$$

can be determined using the generator matrix G by means of the relationship $$x = x_1, \ldots, x_k = u \cdot G = [u_1, \ldots, u_q] \cdot G \quad (1),$$

The generator matrix G is a (q, k) matrix.

If the code C is a linear systematic code, then a codeword of the code C comprises the q useful data bits u and additional p check bits $c_1, \ldots, c_p$, the number of bits in the codeword being determined by k=q+p.

When a codeword of a systematic code is formed, the useful data bits are supplemented by check bits, which are a linear combination of useful data bits, for example.

For a linear systematic code, the generator matrix has the form $$G = (I_q, P_{q,p}), \quad (2)$$

where $P_{q,p}$ is a (q,p) matrix, which is also referred to as a parity matrix of the code C, where p=k−q and where $I_q$ is a q-dimensional unity matrix.

The code C is then determined by a set of words $$u_1, \ldots, u_q, c_1, \ldots, c_p,$$

which are codewords of the code C. For the check bits $c_1$ to $c_p$, it holds that:

$$c_1, \ldots, c_p = [u_1, \ldots, u_q] \cdot P_{q,p},$$

If G=(Iq, Pq,p) is the generator matrix of the code C in systematic form, then an H-matrix H of the code C can be determined according to $$H = (P_{p,q}^T, I_p) \quad (3)$$

where $P_{p,q}^T$ is the transposed matrix of the parity matrix $P_{q,p}$ and $I_p$ is the p-dimensional unity matrix. The transposed parity matrix $P_{p,q}^T$ is obtained from the parity matrix $P_{q,p}$ by virtue of their rows and columns being interchanged.

Like any code, a linear block code of length k can also be described by the set of its codewords, which is a subset of the set of all possible k-component words. In other words: the code C can be described by the subset of the words x1, . . . , xk of all possible words of length k for which the equation $$H \cdot [x_1, \ldots, x_k]^T = 0 \quad (4)$$

holds. The linear code C is therefore determined by the subset of all k-bit words for which equation (4) is satisfied. The vector $[x_1, \ldots, x_k]^T$ is in this case the transposed column vector of the row vector $[x_i, \ldots, x_k]$.

A codeword x1, . . . , xk where H·[x1, . . . , xk]T=0 can also be referred to as a code vector with k components x1, . . . , xk.

A component xi where 1≤i≤k is binary if xi can assume only the values 0 or 1. The component xi can also be multi-valued. If the component xi is 3-valued, it can assume three different values, for example 0, 1 or 2. If the component xi is K-valued (where K≥2), it can assume K different values, for example 0, 1, . . . , K−1.

It is possible that the component xi of the codeword represents a b-bit byte with a number of b bits, as is the case for example with byte-error-correcting or byte-error-detecting codes, such as e.g. Reed-Solomon codes.

As for each code, it also holds for the linear code C that an error that disrupts a codeword x to produce an erroneous word x'=x$_1$', . . . , x$_k$' can be detected if this erroneous word is not a codeword of the code C. The error cannot be detected if the disrupted word x' is also a codeword of the code C.

If H is the H-matrix of the code C, then the error can be detected from the fact that it holds that $$H \cdot [x']^T = s \neq 0.$$

The error is, by contrast, not detected if it holds that $$H \cdot [x']^T = s = 0.$$

In this case, s denotes an error syndrome of the erroneous word x'. [x']T is the transposed column vector of the row vector x'.

Example: Multi-Valued Code

By way of example, a code Cc is described by means of a 3-bit alphabet 0, 1 and 2. This code is not linear. The code Cc can be referred to as a
(2,1,1)—of—4 code:
A codeword of this code Cc then has two twos, a one and a zero. There are $$\binom{4}{2} \cdot \binom{2}{1} = 6 \cdot 2 = 12$$

codewords as follows:

$$C_c = \{2110, 2201, 2120, 2102, 2021, 2012, 1220, 1202, \\ 0221, 0212, 0122, 1022\}.$$

The set $\{0,1,2\}^4$ of all words of length 4 using the alphabet $\{0,1,2\}$ $$\{0,1,2\}^4 = \{0000, 0001, 0010, \ldots, 0002, \ldots, 2222\}.$$

has $3^4=81$ elements. The code $C_c$ is a subset of this set $\{0,1,2\}^4$ of all words of length 4.

It is also possible to consider codes using an alphabet of bytes, wherein a byte can comprise b bits and it is possible that b≥2. An example of such a code is the Reed-Solomon code.

Error Detection of Bytes of Memory Cell Values

Figure 1:
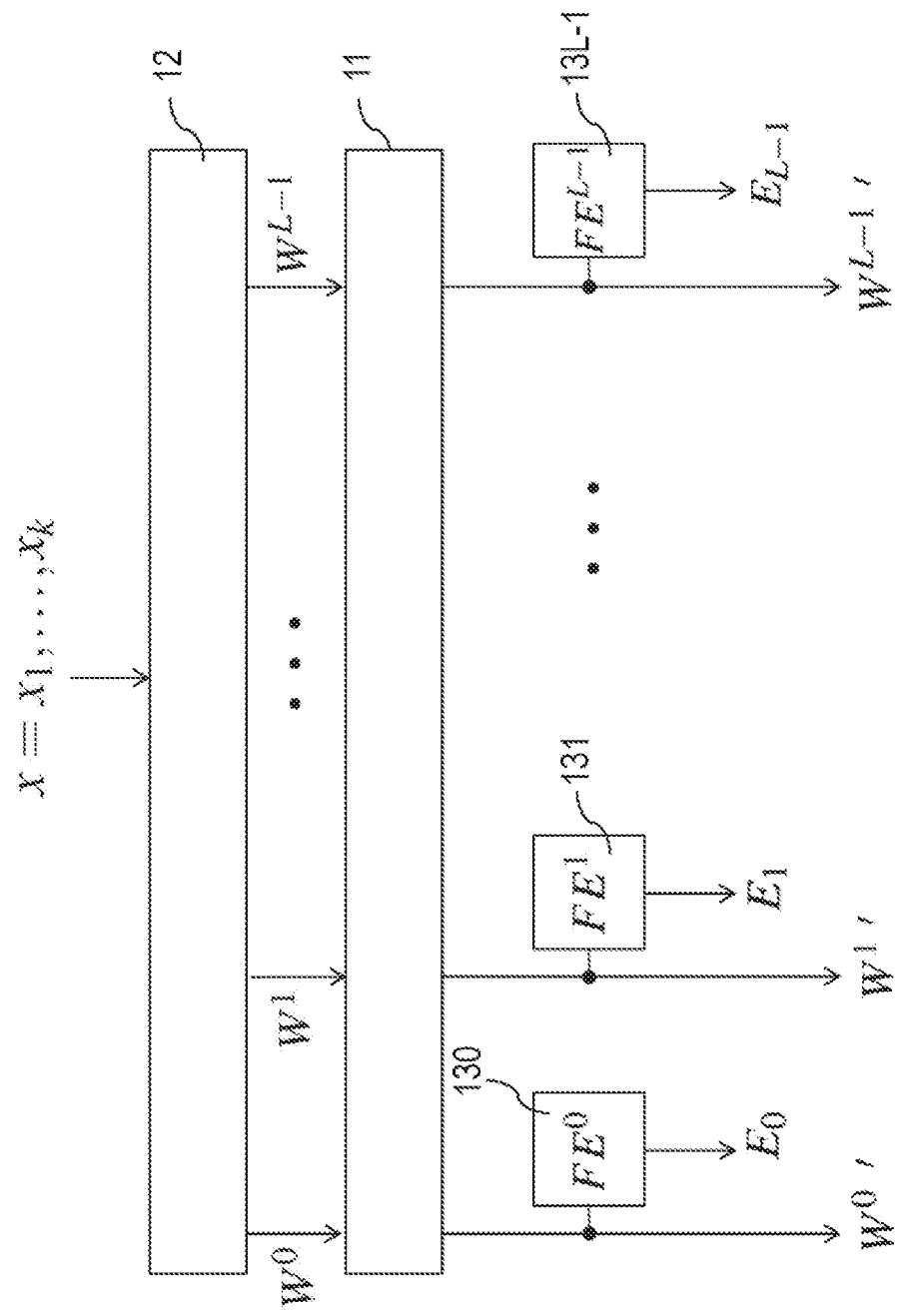
FIG. 1 shows an example circuit for storing data in a memory.

FIG. 1 shows an example circuit for storing data in a memory 11. The memory 11 has memory cells for storing memory cell values. If a memory cell is binary, then it can store two different memory cell values (e.g. 0 or 1). If a memory cell K (where K>2) stores different memory cell values, then it can be referred to as a K-valued memory cell (also as a multi-valued memory cell). The K different memory cell values can be 0, 1, 2, . . . , K−1, for example.

The memory 11 can have binary and/or multi-valued memory cells. In particular, one option is that the memory 11 has K-valued memory cells, wherein a first portion of the K-valued memory cells can be described only by a subset of the multi-valued values 0, 1, . . . , K−1, for example only by the values 0 or K−1, and a second portion of the memory cells can be described by all possible K different memory cell values.

It is subsequently assumed by way of example that the memory cells of the memory 11 are binary.

Furthermore, the circuit shown in FIG. 1 has a transformation circuit 12 and a number of L error detection circuits FE0 130, FE1 131, . . . , FEL−1 13L−1. In this context, it should be noted that the notation of a number in combination with "L−1" indicates that this is the L-th component, in this case the L-th error detection circuit. If there are for example L=4 error detection circuits, then these are provided with the reference signs 130, 131, 132 and 133; the latter reference sign is obtained from 13L−1 where L=4, to give 133. This notation allows a multiplicity of L components to be indicated, which can be variable and can be presented in confusing fashion, in particular for large values of L.

The transformation circuit 12 has a k-bit input for inputting k data bits x=x1, . . . , xk and an n-bit output for outputting n memory cell values w=w1, . . . , wn.

It is possible that the k=q+p data bits of the codeword x form a number of q information bits u1, u2, . . . , uq and a number of p check bits c1, . . . , cp of a separable error code C1, so that it holds that $$x = x_1, \ldots, x_k = u_1, \ldots, u_q, c_1, \ldots, c_p.$$

where $$u_1, \ldots, u_q, c_1, \ldots, c_p.$$

is a codeword of the error code $C^1$.

The error code C1 can also be referred to as a data bit error code. The error code C1 is an error-correcting and/or error-detecting code. The information bits u1, . . . , uq are supplemented by the check bits c1, . . . , cp to produce a codeword x of the error code C1 that is applied to the input of the transformation circuit 12. By way of example, it is possible that the error code C1 is a byte-error-correcting and/or a byte-error-detecting code. It is also possible that x is a codeword of an inseparable code.

It is further possible that, instead of the k bits of the codeword x1, . . . , xk, q bits of the useful data bits u1, . . . , uq are also present. In other words, it is not necessary for a codeword x to be supplied to the transformation circuit 12, but rather it could also be a set of useful data bits u.

The input of the transformation circuit 12 has k data bits x=x1, . . . , xk applied to it. It holds that:
$m_0$ of these data bits form a zeroth byte $X^0$,
$m_1$ of these data bits form a first byte $X^1$, etc.
until finally $m_{L-1}$ of these data bits form an (L−1)-th byte. Further, it holds that:

$$m_0 + m_1 + \ldots + m_{L-1} = k,$$

$$X^0 = x_1^0, \ldots, x_{m_0}^0,$$

$$X^1 = x_1^1, \ldots, x_{m_1}^1,$$

$$\vdots$$

$$X^{L-1} = x_1^{L-1}, \ldots, x_{m_{L-1}}^{L-1},$$

and $$x = x_1, \ldots, x_k = x_1^0, \ldots, x_{m_0}^0, x_1^1, \ldots, x_{m_1}^1, \ldots, x_1^{L-1}, \ldots, x_{m_{L-1}}^{L-1}.$$

At least two bytes of data bits are formed, so that L≥2. Additionally, one byte of data bits, according to this example embodiment, has at least two bits, so that it holds that:

$$m_0, m_1, \ldots, m_{L-1} \geq 2.$$

One byte of data bits, for example the "byte of data bits X1", is also referred to by "data byte X1" or "group of data bits X1".

It is possible, but not necessary, that the bits of the groups of bits or of the bytes X0, X1, . . . , XL−1 of data bits are arranged in succession.

Merely by way of example, it is assumed in some example embodiments that the bits of a byte of data bits are each arranged in succession and that it holds that $$x_1, \ldots, x_k = x_1^0, \ldots, x_{m_0}^0, x_1^1, \ldots, x_{m_1}^1, \ldots, x_1^{L-1}, \ldots, x_{m_{L-1}}^{L-1} = X^0, X^1, \ldots, X^{L-1}.$$

The transformation circuit 12 transforms the k data bits of the codeword x that are applied to its k inputs into n memory cell values w=w1, . . . , wn and outputs them on its n output lines, which are connected to corresponding data input lines of n memory cells of the memory 11. Therefore, the transformation circuit 12 transforms assignments of the data bits into assignments of the memory cell values.

If only a number Anz1<2k of assignments of the k data bits arises, it is sufficient for the transformation circuit 12 to be designed such that it transforms the assignments that arise into corresponding assignments of the memory cell values biuniquely. For the assignments that do not arise, the operation of the transformation circuit can be stipulated arbitrarily.

The transformation circuit 12 is fashioned such that it
transforms the assignments of the zeroth byte $X^0 = x_1^0, \ldots, x_{m_0}^0$ of data bits into assignments of a zeroth byte $W^0 = w_1^0, \ldots, w_{n_0}^0$ of memory cell values such that the assignments of the memory cell values of the zeroth byte $W^0$ are codewords of an error code $CF^0$ of length $n_0$,
transforms the assignments of the first byte $X^1 = x_1^1, \ldots, x_{m_1}^1$ of data bits into assignments of a first byte $W^1 = w_1^1, \ldots, w_{n_1}^1$ of memory cell values such that the assignments of the memory cell values of the first byte $W^1$ are codewords of an error code $CF^1$ of length $n^1$, etc., until it finally transforms the assignments of the (L−1)-th byte $X^{L-1}=x_1^{L-1},\ldots,x_{m-L1}^{L-1}$ of data bits into assignments of an L−1-th byte $W^{L-1}=w_1^{L-1},\ldots,w_{n_{L-1}}^{L-1}$ of memory cell values such that the assignments of the $n_{L-1}$-th byte $W^{L-1}$ of the memory cell values are codewords of an error code $CF^{L-1}$ of length $n_{L-1}$.

The error code CF0, CF1, ..., CFL−1 is also referred to as a block error code in each case.

In the example embodiment under consideration, it holds that:

$n_0 \geq m_0,$ $n_1 \geq m_1,$ $\vdots$ $n_{L-1} \geq m_{L-1}$ and $n = n_0 + n_1 + \ldots + n_{L-1}.$ A byte of memory cell values can be stored in a group of memory cells. In this case, there are preferably at least L=2 bytes and at least 2 groups of memory cells in which the applicable bytes of memory cell values can be stored.

It is also possible that there are more than 2 bytes of data bits and of memory cell values. By way of example, there can be different numbers of bytes, each byte being transformed into a corresponding byte of memory cell values and the memory cell values of a byte being codewords of a block error code.

A byte of memory cells preferably has at least 3 memory cell values.

The memory 11 has at least n=n0+n1+...+nL−1 memory cells. The block error code CF0 is a block code of length n0, the block error code CF1 is a block code of length n1, etc., up to the block error code CFL−1, which is a block code of length nL−1.

It is possible that for example the block error code CF1 is a q1—of −n1 code, so that a codeword of this block error code has a number of q1 ones and a number of n1−q1 zeroes.

It is also possible that for example the block error code CF2 is determined as a particular subset of the set of all n2-bit binary words.

By way of example, the codewords of the block error code can be 3-of-6 codewords that have 3 ones and 3 zeroes each time. Overall, there are 20 such codewords. In example fashion, 4-bit bytes of data bits are supposed to be transformed into 6-bit bytes of memory cell values. There are 24=16 different 4-bit bytes that are reversibly uniquely transformed into 16 of the altogether 20 6-bit bytes of memory cell values. Therefore (20−16=) 4 of the 3-of-6 codewords are not used for the transformation. The block error code CF2 therefore comprises only a subset of the 3-of-6 codewords of the 3-of-6 code. In this example, the block error code CF2 consists of the 16 3-of-6 codewords into which one of the possible 16 data bytes is transformed.

A block error code of length n* can be a genuine subset of n*-bit binary words; by way of example, the block error code of length n*=6 can be a subset of 16 of the 20 possible codewords of the 3-of-6 code. The 20 possible codewords are in turn a subset of the 26=64 possibly binary words of the 6 bits of the memory cell values.

By way of example, the block error code is a Berger code or another known code.

One option is that it holds that n0=n2=...=nL−1, so that all block error codes have the same block length. It is also possible that it holds that CF0=CF1=...=CFL−1 and the block error codes used for the L bytes of memory cell values are the same and the same transformation is performed by means of the transformation circuit 12 for each of the assignments of the L bytes of data bits.

It is further possible that different bytes of data bits are transformed into bytes of memory cell values by different transformations.

Another option is that only a number Anz0 of assignments of the zeroth byte X0 of data bits where Anz0<2m0 arises at the m0 first inputs of the transformation circuit 12 and only the assignments that arise are reversibly uniquely transformed into Anz0 assignments of the byte of memory cell values by the transformation circuit 12, and that the transformation does not need to be defined for assignments that do not arise at the applicable inputs. The same can hold, mutatis mutandis, for the respective other bytes of data bits.

The memory cell values $W^0=w_1^0,\ldots,w_{n_0}^0$, provided by the transformation circuit 12 at its applicable outputs can be stored in n0 memory cells, which are referred to as zeroth memory cells.

The memory cell values $W^1=w_1^1,\ldots,w_{n_1}^1$ provided by the transformation circuit 12 at its applicable outputs can be stored in n1 memory cells, which are referred to as first memory cells.

This is continued until finally the memory cell values WL−1 provided by the transformation circuit 12 at its applicable outputs are stored in nL−1 memory cells, which are also referred to as (L−1)-th memory cells.

The memory cell values $W^{0'}=w_1^{0'},\ldots,w_{n_0}^{0'}$ stored in the n0 zeroth memory cells can be read therefrom.

On account of an error, the read memory cell values W0' can differ from the previously written memory cell values W0.

If there is no error, it holds that W0=W0', and the read memory cell values W0' form a codeword of the block error code CF0. If the read memory cell values W0' do not form a codeword of the block error code CF0, then there is an error, which can be detected by means of the block error code CF0. The memory cell values W0' read from the first n0 memory cells are applied to an n0-bit input of the error detection circuit FE0 130. This error detection circuit FE0 130 is configured such that it outputs a first value of an error signal E0 at its output if the read memory cell value W0' is a codeword of the block error code CF0, and outputs a second value at its output if the read memory cell value W0' is not a codeword of the block error code CF0. The output of the second value therefore indicates that the memory cell values output via the zeroth n0 memory cells are erroneous.

The memory cell values W1' to WL−1' stored in the n1 first memory cells to nL−1 (L−1)-th memory cells can be read therefrom. It is possible that the read memory cell values W1',..., WL−1' differ from the written memory cell values W1,..., WL−1 on account of an error.

If there is no error, then the written memory cell values are the same as the read memory cell values, and the read memory cell values each form a codeword of the applicable block error code.

The above explanations hold for the remaining error detection circuits FE1 131 to FEL−1 13L−1 accordingly: the error detection circuit FE1 131 determines an error signal E1 from read memory cell values W1' (based on the block error code CF1) and the error detection circuit FEL-1 13L-1 determines an error signal EL-1 from read memory cell values WL-1' (based on the block error code CFL-1).

Figure 2A:
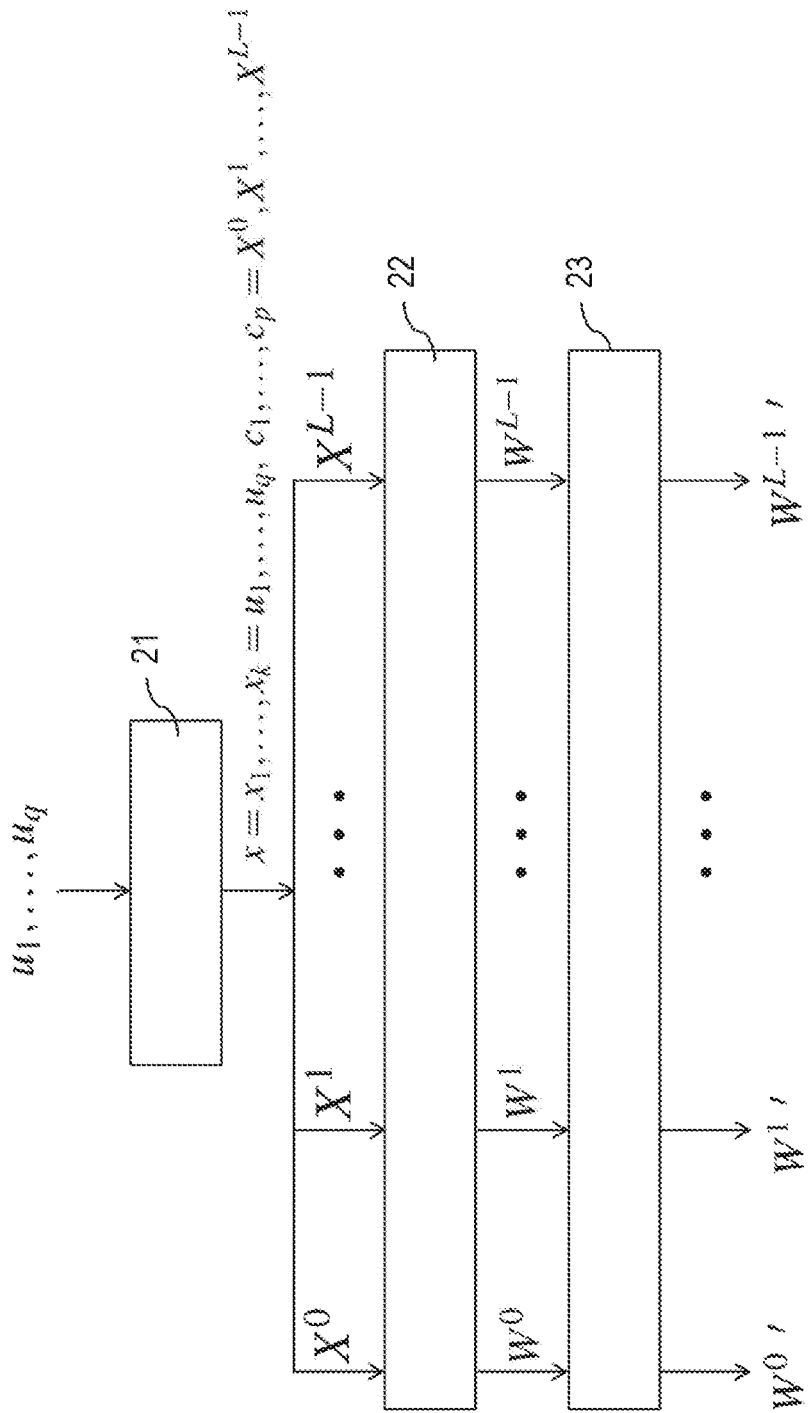
FIG. 2a shows a first portion of a schematic diagram illustrating a correction of the data bits of a codeword, wherein check bits are used for information bits.
Figure 2B:
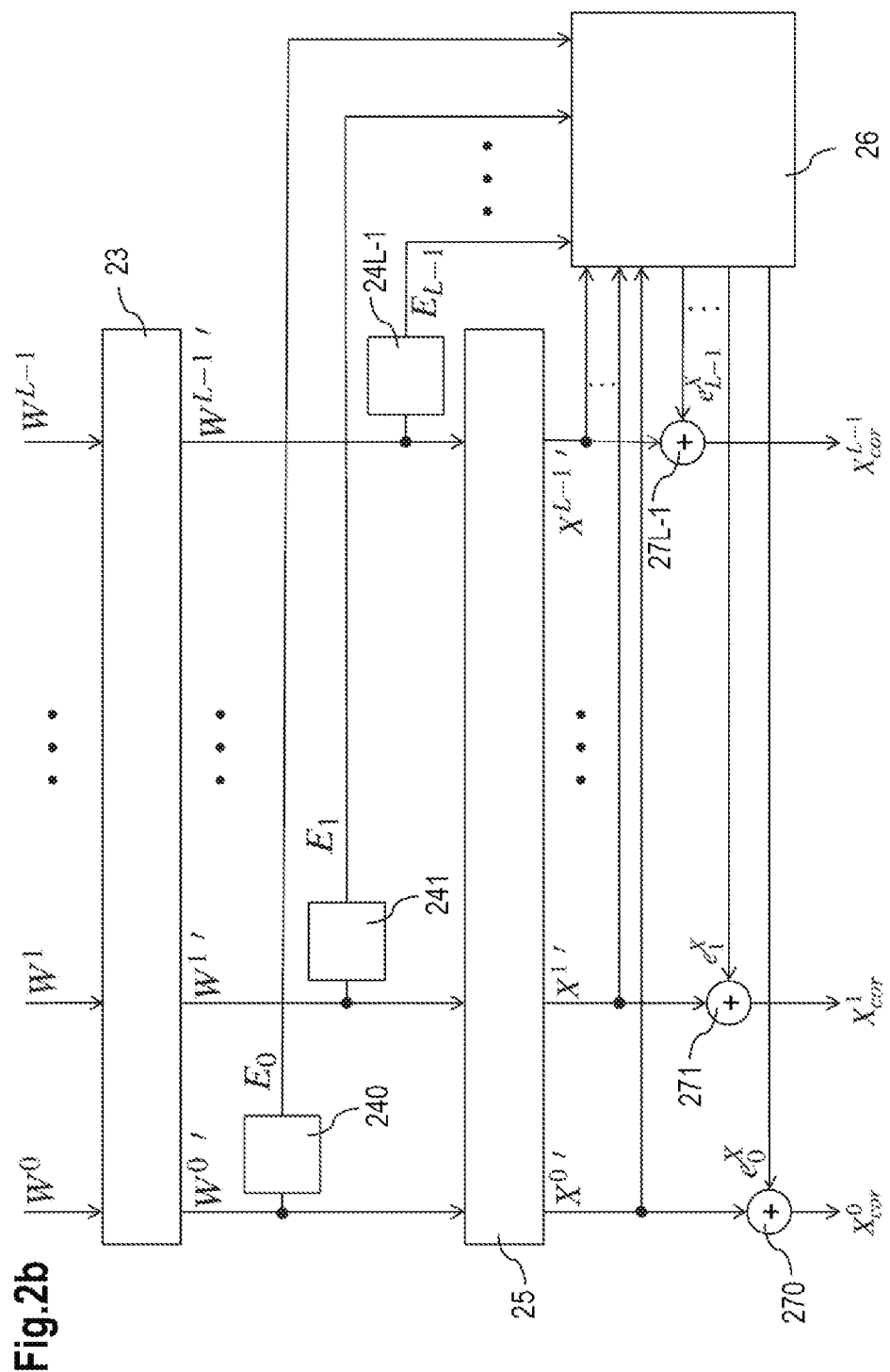
FIG. 2b shows a second portion of a schematic diagram that illustrates a correction of the data bits of a codeword, wherein check bits are used for information bits.

FIG. 2a and FIG. 2b: Check Bits for Information Bits u

The memory cell values output from the memory form bytes or groups of memory cell values W0', . . . , WL-1'. If not all bits of such a byte are error-free, there is what is known as a group error.

If for example not all values $w_1^{i'}, \ldots, w_{n_i}^{i'}$ of the read byte Wi' are error-free, then there is a group error in the i-th byte of the read memory cell values (also referred to as the i-th group of the read memory cell values).

The group error of the i-th byte indicates that at least one memory cell value of this byte is erroneous. The group error is therefore an error with a detected byte position, i.e. the group error indicates that a particular byte is erroneous. However, the group error alone does not yet indicate which bit or which bits is/are erroneous.

In other words, the group error provides information regarding which byte or which bytes from a set of bytes is or are erroneous.

By way of example, in the case of a 3-of-6 code, the group error indicates a 6-bit byte that is erroneous without already showing which at least one bit of the 6 bits is actually erroneous.

The presence of a group error can also be indicated by a byte error position signal, as described in example fashion below.

FIG. 2a shows a schematic diagram that illustrates a correction of the data bits of a codeword. FIG. 2a comprises a coding unit 21, a transformation circuit 22 and a memory 23.

The useful data bits u are coded into data bits of a codeword x by the coding unit 21 by means of an error code. Subsequently, the codeword x is supplied to the transformation circuit 22, which is used to transform them into memory cell values W0, W1, . . . , WL-1 that are to be written.

In this example, the coding unit 21 is configured such that the useful data bits u are transformed into the codeword x, where $$x = x_1, \ldots, x_k = u_1, \ldots, u_q, c_1, \ldots, c_p = X^0, X^1, \ldots, X^{L-1}$$

(comprising the useful data bits u and check bits c) of the error code $C^1$. The codeword x therefore comprises
  $m_1$ bits forming a group $X^0$ of data bits,
  $m_2$ bits forming a group $X^1$ of data bits, etc.,
  $m_L$ bits forming a group $X^{L-1}$ of data bits.
It therefore holds that:

$$m_1 + m_2 + \ldots + m_L = k,$$

where k is the number of bits of the codeword x.

The codeword comprises useful data bits and check bits if the error code C1 is a separable code. It is also possible that a distinction is not drawn between useful data bits and check bits of a codeword if the error code C1 is an inseparable code.

It is possible that it holds that m1=m2= . . . =mL=b, and X0, X1, . . . , XL-1 each form a byte comprising b bits, where b≥2.

The groups X0, X1, . . . , XL-1 are bytes, each byte comprising at least two bits. The bits of the bytes X0, X1, . . . , XL-1 are applied to appropriate m1-bit, m2-bit, mL-bit inputs of the transformation circuit 22. The transformation circuit 22 provides memory cell values W0 to be written at its n1-bit output n1, memory cell values W1 at its n2-bit output n2, etc., until it outputs memory cell values WL-1 at its nL-bit output nL.

The transformation circuit is in this case preferably fashioned such that
  the set of memory cell values $W^0$ to be written involves one codeword of the block error code $CF^0$ each,
  the set of memory cell values $W^1$ to be written involves one codeword of the block error code $CF^1$ each, etc.,
  the set of memory cell values $W^{L-1}$ to be written involves one codeword of the block error code $CF^{L-1}$ each.

The transformation circuit 22 is coupled to the memory 23 such that the memory cell values W0, W1, . . . , WL-1 to be written can be written to memory cells of the memory 23.

It is possible that the memory 23 comprises an addressable memory, a register array and/or a register.

Memory cell values W0', W1', . . . , WL-1' can be read from the memory 23. As explained above, the read memory cell values may be erroneous. If one of the bytes of read memory cell values W0', W1', . . . , WL-1' is not a codeword of the respective block error code (see explanations above), an error is detected in the byte of the read block.

FIG. 2b shows in example fashion a schematic circuit arrangement comprising the memory 23, a multiplicity of L error detection circuits 240, 241, . . . , 24L-1, an inverse transformation circuit 25, a byte correction value formation unit 26 and L Exclusive-OR circuits 270, 271, . . . , 27L-1.

The read memory cell values W0', W1', . . . , WL-1' are provided at the outputs of the memory 23. They are supplied to appropriate inputs of the inverse transformation circuit 25. Each of these read memory cell values is also supplied to one of the error detection circuits 240 to 24L-1. Each of the error detection circuits 240 to 24L-1 provides an error signal E0 to EL-1 at its output. The error signal indicates whether the read memory cell values W0' to WL-1' are codewords of the block error codes CF0 to CFL-1.

By way of example, it holds for the read memory cell values W0' supplied to the error detection circuit 240 that: the error signal E0 assumes the first value if the read memory cell values W0' represent a codeword of the block error code CF0; otherwise, the error signal E0 assumes the second value.

Therefore, the error detection circuits 240 to 24L-1 can be used to determine whether or not the respective read bytes of memory cell values W0' to WL-1' are erroneous.

The error signals E0 to EL-1 of the error detection circuits 240 to 24L-1 are supplied to the byte correction value formation unit 26.

The inverse transformation circuit 25 is fashioned such that it transforms bytes of possibly erroneous read memory cell values W0', W1', . . . , WL-1' into bytes of read data bits X'=X0', X1', . . . , XL-1' such that it holds that:

$$X^0 = X^{0\prime}, X^1 = X^{1\prime}, \ldots, X^{L-1} = X^{L-1\prime}$$

for $$W^0 = W^{0\prime}, W^1 = W^{1\prime}, \ldots, W^{L-1} = W^{L-1\prime}$$

If no errors have occurred, then it holds that: the transformation circuit 22 transforms the bytes X0, . . . , XL-1 into bytes of memory cell values W0, . . . , WL-1 and stores them in memory cells of the memory 23. The bytes of memory cell values W0', . . . , WL-1' that are read from the memory 23 are transformed by the inverse transformation circuit 25 into the bytes X0', . . . , XL-1'.

The bytes of read data bits X' are provided to the byte correction value formation unit 26 by the inverse transformation circuit 25. These bytes of read data bits X' are also routed to first inputs of the Exclusive-OR circuits (also referred to as XOR circuits) 270 to 27L−1.

The byte correction value formation unit 26 is configured such that, on the basis of the error signals $E_0$ to $E_{L-1}$ and bytes of read (and possible erroneous) data bits X' applied to its inputs, byte correction values $$e_0^X, e_1^X, \ldots, e_{L-1}^X$$

are provided at its outputs in accordance with the error code $C^1$ for correcting data bytes. To this end, the outputs of the byte correction value formation unit 26 are connected to second inputs of the XOR circuits 270 to 27L−1. The outputs of the XOR circuits 270 to 27L−1 have corrected bytes $$X_{cor} = X_{cor}^0, X_{cor}^1, \ldots, X_{cor}^{L-1}$$

provided at them, where it holds that:

$$X_{cor}^0 = X^{0'} + e_0^X,$$

$$X_{cor}^1 = X^{1'} + e_1^X,$$

$$\vdots$$

$$X_{cor}^{L-1} = X^{L-1'} + e_{L-1}^X.$$

Additionally, it holds that $$X_{cor}^0 = X^0, X_{cor}^1 = X^1, \ldots, X_{cor}^{L-1} = X^{L-1},$$

if the error that has possibly occurred is corrigible by the respective error code $C^1$.

By way of example, the transformation circuit 22 can be fashioned such that the byte of memory cell values W0 is determined solely by the byte X0 of data bits and is not dependent on further data bits. The same can hold, mutatis mutandis, for the other bytes of memory cell values W1 to WL−1 in regard to the dependency thereof on the bytes X1 to XL−1.

If the byte of the read memory cell values is the same as the byte of the memory cell values to be written, i.e.

$$W^{0'} = W^0,$$

then there is no error in the read byte, i.e. the error signal $E_0$ of the error detection circuit 240 corresponds to the first value, which indicates that the byte of the read memory cell values $W^{0'}$ is a codeword of the block error code $CF^0$. A correction is therefore not required.

If, on the other hand, it holds that $$W^{0'} \neq W^0,$$

then the byte of the read memory cell values $W^{0'}$ is not a codeword of the block error code $CF^0$. The error signal $E_0$ corresponds to the second value. The byte correction value formation unit 26 generates the correction signal $e_0^X \neq 0$ for correcting bits of the 0-th read byte $X^{0'}$ and supplies it to the XOR circuit 270. In this case, the correction signal $e_0^X$ is determined such that for a corrigible error of the error code the corrigible byte is determined as:

$$X_{cor}^0 = X^{0'} + e_0^X = X^0.$$

The same holds, mutatis mutandis, for the further bytes of the read memory cell values, i.e. for W1' to WL−1'.

If the error signals E0 to EL−1 indicate by means of their first value that the applicable read bytes are codewords of the applicable block error codes, then the byte correction value formation unit 26 does not determine any byte correction values that are different than zero. A byte correction value of zero that is supplied to one input (of two inputs) of an XOR circuit leads to the signal of the other input being output at the output of the XOR circuit. In other words, the byte correction value zero does not alter the output of the XOR circuit. This is also wanted, since no error is supposed to be corrected in this case, of course.

Accordingly, a correction is performed if the error signal E0 to EL−1 outputs the second value. The affected byte of data bits can then be corrected.

Ultimately, the error signals E0 to EL−1 thus indicate whether and, if so, which bytes need to be corrected. This can advantageously increase the correction capability of the error code.

A further advantage is that the error signals E0 to EL−1 can be determined from the bytes of read memory cell values before the memory cell values are transformed into bytes of data bits X' by the inverse transformation circuit 25.

In this case, in example fashion, the useful data bits u=u1, . . . , uq and the check bits c=c1, . . . , cp form data bits $$x = x_1, \ldots, x_k = u_1, \ldots, u_q, c_1, \ldots, c_p$$

of the error code $C^1$, which is a byte-error-correcting and/or byte-error-detecting code.

The data bits x are divided into bytes X0, . . . , XL−1, which are transformed into bytes W0, . . . , WL−1 of memory cell values using the transformation circuit 22. These bytes W0 to WL−1 are in this case codewords of the block error codes CF0 to CFL−1 and are stored in memory cells of the memory 23.

Bytes of possibly erroneous memory cell values W1' to WL−1' are read from the memory 23, and the error detection circuits 240 to 24L−1 are used to check, per byte W1' to WL−1', whether it is a codeword of the block error code CF0 to CFL−1 in each case. The error signals E0 to EL−1 are used to indicate whether or not the respective read (and possibly erroneous) byte W1' to WL−1' is a codeword.

These bytes of possibly erroneous memory cell values W1' to WL−1' are transformed by the inverse transformation circuit 25 into possibly erroneous bytes X0' to XL−1' of data bits. The respective error signals E0 to EL−1 are used to indicate to the byte correction value formation unit 26 for which of the bytes X0' to XL−1' a group error has been detected and for which byte no such group error has been detected. It is also possible that a group error has not been detected for a byte even though this byte is erroneous (e.g. if a codeword has distorted a further codeword on account of multiple errors).

The possibly erroneous bytes X0' to XL−1' and the error signals E0 to EL−1 are supplied to the byte correction value formation unit 26, which forms therefrom byte correction values $e_0^X$ to $e_{L-1}^X$ corresponding to the error code C1, these being XORed with the bytes X0' to XL−1' on a component-by-component basis using the XOR circuits 270 to 27L−1.

The error correction and hence also the determination of the byte correction values are effected using the error code C1. Using the error detection circuits 240 to 24L−1 and by means of the block error codes CF0 to CFL−1 it is possible for group errors to be determined, so that, for the error correction on the basis of the error code C1, it is known which byte or which bytes is/are erroneous and hence needs/need to be corrected.

In other words: the error correction of possibly erroneous data bytes is effected using the error code C1. The detection of the group errors in the read data bytes can be effected using the block error codes CF0 to CFL−1 before they are even transformed back into erroneous bytes.

One option is for at least one of the error detection circuits 240 to 24L−1 and the inverse transformation circuit 25 to be realized together, so that at least parts of the circuits can be used together.

Figure 3A:
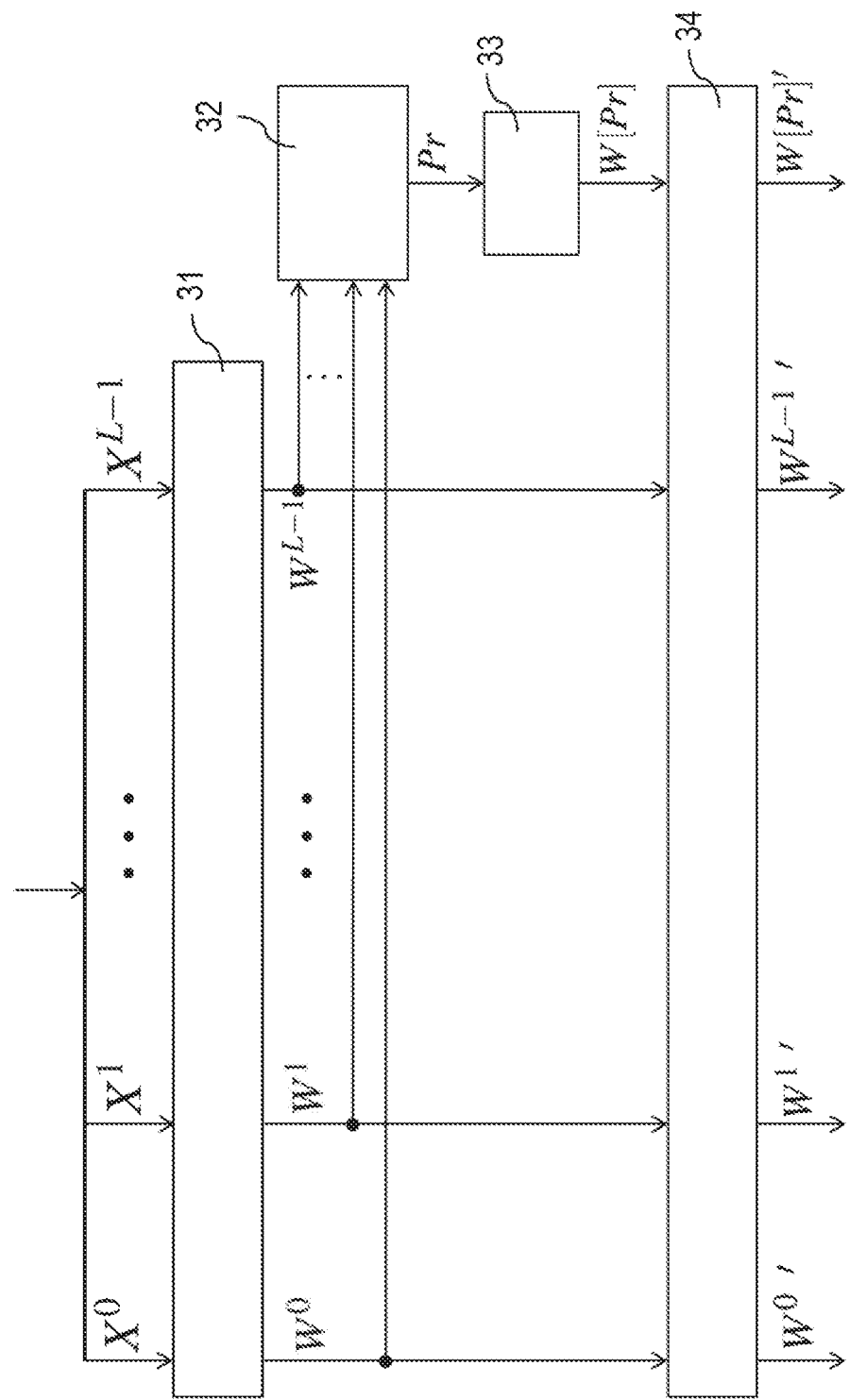
FIG. 3a shows a first portion of a schematic diagram that illustrates a correction of the data bits of a codeword, wherein in particular check bits are used for memory cell values.
Figure 3B:
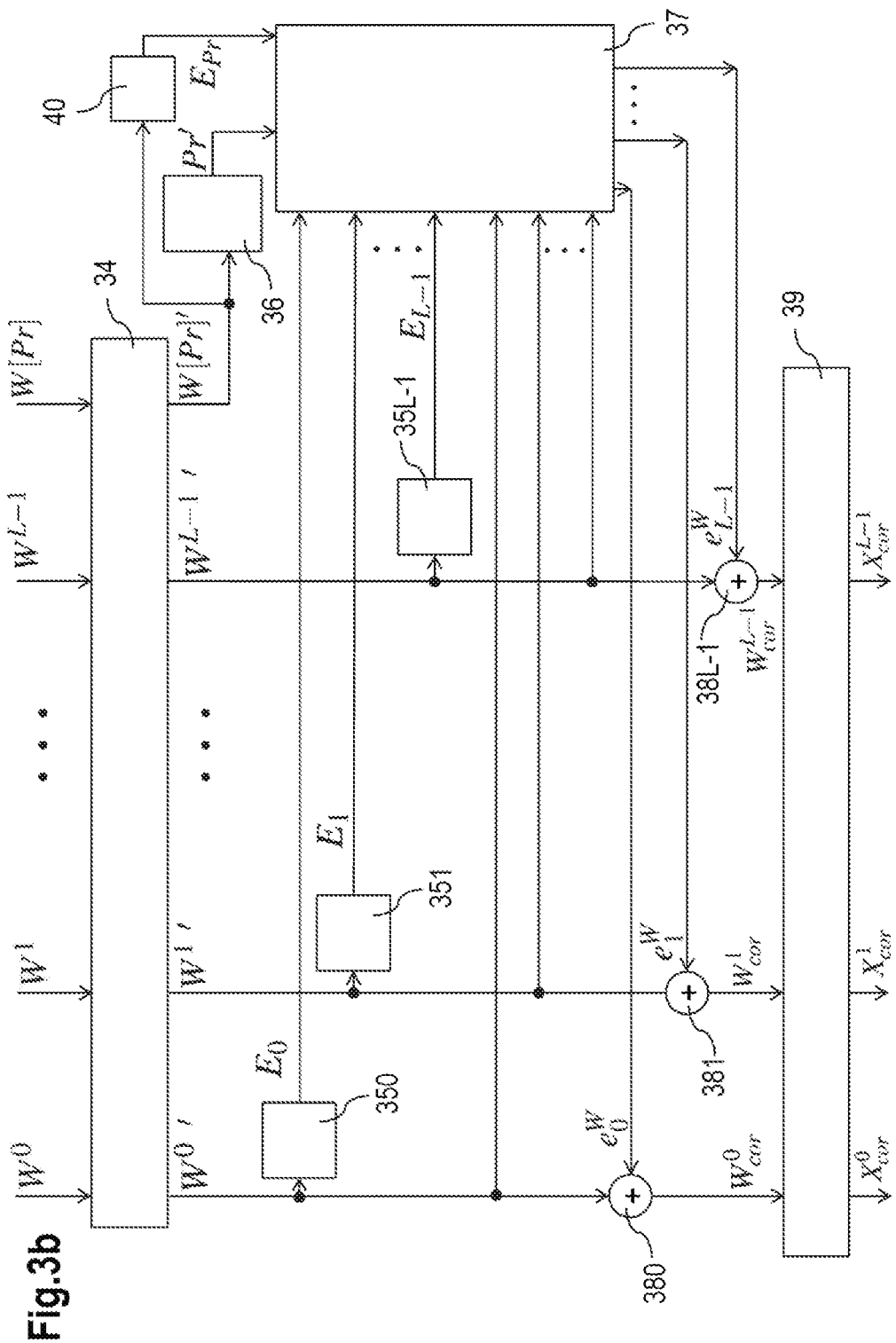
FIG. 3b shows a second portion of a schematic diagram that illustrates a correction of the data bits of a codeword, wherein particular check bits are used for memory cell values.

FIG. 3a and FIG. 3b: Check Bits for Memory Cell Values

Check bits Pr for memory cell values (in contrast to check bits for data bits as in FIG. 2a) are formed in example fashion below. The check bits of the memory cell values can be transformed, e.g. after they are formed, into memory cell values and then stored.

The check bits of the memory cell values can be transformed into memory cell values in the same or a different way as/from the data bits.

FIG. 3a shows a schematic circuit arrangement comprising a transformation circuit 31, a check bit formation unit 32, a check bit transformation circuit 33 and a memory 34.

The data bits of the codeword x of the error code C1 that are divided into bytes X, and in this case comprise, in example fashion, the useful data bits u and the check bits c, are applied to the input of the transformation circuit 31.

Alternatively, it is possible to supply only the useful data bits u, divided into bytes, to the transformation circuit 31.

The transformation circuit 31 provides bytes W0 to WL−1 of memory cell values to be stored at its output. The memory cell values W0 to WL−1 to be stored have a respective word length of n1 to nL−1. Furthermore, the memory cell values W0 to WL−1 to be stored are codewords of the respective block error codes CF0 to CFL−1.

The output side of the transformation circuit 31 is connected to the memory 34 and to the check bit formation unit 32.

The check bit formation unit 32 is configured so that it determines check bits Pr such that the memory cell values of the bytes W0, W1, . . . , WL−1 and the check bits Pr form a codeword $$W^0 W^1 \ldots W^{L-1} Pr$$

of an error code $C^2$.

The output of the check bit formation unit 32 is connected to the input of the check bit transformation circuit 33. The check bit transformation circuit 33 is configured such that it transforms the check bits Pr applied to its input into memory cell values W[Pr]. These memory cell values W[Pr] are stored in the memory 34 together with the memory cell values W0 to WL−1.

If for example the bytes X0 to XL−1 all have the same number of 4 bits, i.e. m0=m1= . . . =mL−1=4, and if for example all memory cell values W0 to WL−1 have a word length of 6 bits, i.e. n0=n1= . . . =nL−1=6, then the bytes X0 to XL−1 each form 4-bit bytes having 2⁴=16 possible assignments.

It is then possible that the block error codes CF0 to CFL−1 are each 3-of-6 codes having $\binom{6}{3}$=20 codewords. The 16 possible assignments of the 4-bit bytes can be reversibly uniquely mapped onto 16 of the 20 possible 3-of-6 codewords by the transformation circuit 31.

In this example, the check bit formation unit 32 determines the check bits Pr corresponding to the error code C2 from the 6·L bits of the memory cell values W0 to WL−1 that are applied to its input. By way of example, the check bit formation unit 32 can determine the first check bit as an XOR sum of the respective first bits of the memory cell values of the bytes W0 to WL−1, can determine the second check bit as an XOR sum of the respective second bits of the memory cell values of the bytes W0 to WL−1, etc., until the sixth check bit, which is formed as an XOR sum of the respective sixth bits of the memory cell values of the bytes W0 to WL−1. Therefore, six check bits are obtained $$Pr = Pr_0, Pr_1, Pr_2, Pr_3, Pr_4, Pr_5.$$

These can, but do not have to, form a codeword of the 3-of-6 code.

Furthermore, in this example, the transformation circuit is used to transform the six check bits Pr0 to Pr5 into two 3-of-6 codewords by virtue of the first three check bits being supplemented by means of a 0 to produce a 4-bit byte $$Pr_0, Pr_1, Pr_2, 0$$

and the last three check bits likewise being supplemented by means of a 0 to produce a further 4-bit byte $$Pr_3, Pr_4, Pr_5, 0.$$

These two 4-bit bytes are transformed into codewords of the 3-of-6 code using the check bit transformation circuit 33. According to this example, these two codewords of the 3-of-6 code are then written to the memory 34.

By way of example, it is also possible that the check bit transformation circuit 33 is used to transform the six check bits Pr0 to Pr5 into the following check bits:

$$Pr_0, \overline{Pr_0}, Pr_1, \overline{Pr_1}, Pr_2, \overline{Pr_2}, Pr_3, \overline{Pr_3}, Pr_4, \overline{Pr_4}, Pr_5, \overline{Pr_5}.$$

In this example, the check bits are doubled by virtue of an inverted check bit $\overline{Pr_0}$ to $\overline{Pr_5}$ being determined for each check bit Pr0 to Pr5. Hence, two memory cells per check bit are thus stored in the memory 34.

According to a further example, the check bits Pr0 to Pr5 can also be stored in triplicate:

$$Pr_0, Pr_0, Pr_0, Pr_1, Pr_1, Pr_1, Pr_2, Pr_2, Pr_2, Pr_3, Pr_3, Pr_3, Pr_4, Pr_4, Pr_4, Pr_5, Pr_5, Pr_5.$$

When reading possibly erroneous check bits from the memory 34, for example a correction for possibly erroneous check bits can then be effected by applying a majority decision.

It is also an example that the check bit transformation circuit 33 is configured such that the check bits Pr0 to Pr5 are supplemented by (at least) an additional parity bit Pa according to $$Pa = Pr_0 + Pr_1 + Pr_2 + Pr_3 + Pr_4 + Pr_5,$$

in which case $$W[Pr] = Pr_0, Pr_1, Pr_2, Pr_3, Pr_4, Pr_5, Pa$$

is written to the memory 34. In this case, "+" denotes addition modulo 2. When reading possibly erroneous check bits, an uneven error in the check bits can be detected from the parity bit. If an error in the check bits is detected, such an error can be indicated, for example, but correction of memory cell values can be dispensed with.

The check bits Pr of the error code C2 are in this case formed, in example fashion, using the memory cell values of the bytes W0 to WL−1 and not directly from the bytes X0 to XL−1. The check bits Pr can be transformed into appropriate memory cell values before they are stored.

When reading from the memory 34, possibly erroneous memory cell values W0', W1', . . . , WL−1', W[Pr]' are output at the applicable outputs of the memory 34.

FIG. 3b shows a schematic circuit diagram having components for correcting the possibly erroneous memory cell values W0', W1', . . . , WL−1', W[Pr]'.

FIG. 3b shows the memory 34, a multiplicity of L error detection circuits 350 to 35L−1, an error detection circuit 40, an inverse check bit transformation circuit 36, a number of L XOR circuits 380 to 38L−1, an inverse transformation circuit 39 and a byte correction value formation unit 37.

The byte correction value formation unit 37 has L inputs for inputting L error signals E0 to EL−1, an input for inputting an error signal EPr, L inputs for inputting possibly erroneous memory cell values W0' to WL−1' and an input for inputting possibly erroneous check bits Pr'. Furthermore, the byte correction value formation unit 37 has L outputs for outputting L byte correction values $$e_0^W, e_1^W, \ldots, e_{L-1}^W$$

for correcting the possibly erroneous memory cell values W0', W1', ..., W$^{L-1}$'.

The possibly erroneous memory cell values W0', W1', ..., WL−1' and W[Pr]' are read from the memory 34.

The read memory cell values W0' to WL−1' are firstly routed to the byte correction value formation unit 37, and secondly each of these memory cell values is routed to a first input of an XOR circuit 380 to 38L−1, each of the memory cell values having an associated XOR circuit.

The read memory cell value W[Pr]' is connected to the input of the inverse check bit transformation circuit 36 and to the input of the error detection circuit 40.

The error detection circuits 350 to 35L−1 provide the error signals E0 to EL−1, and the error detection circuit 40 provides an error signal EPr. All of these error signals are applied to the byte correction value formation unit 37.

The output of the inverse check bit transformation circuit 36 provides the possibly erroneous check bits Pr' to the byte correction value formation unit 37.

If the error signal EPr indicates an error, then the byte correction value formation unit 37 can determine that the error is indicated and that an error is not corrected.

The byte correction value formation unit 37 is configured such that, if the error signal EPr indicates an error, it determines byte correction values $e_0^W, e_1^W, \ldots, e_{L-1}^W$ according to the error code C2 for correcting the possibly erroneous memory cell values W0', W1', ..., WL−1' and provides them at its L outputs. Each of the L outputs is connected to a second input of one of the XOR circuits 380 to 38L−1.

The XOR circuits 380, 381, ..., 38L−1 provide the correct memory cell values $$W_{cor}^0 = W^{0'} + e_0^W,$$
$$W_{cor}^1 = W^{1'} + e_1^W,$$
$$\vdots$$
$$W_{cor}^{L-1} = W^{L-1'} + e_{L-1}^W$$

at their outputs. If an error is corrigible by the error code $C^2$, then $$W_{cor}^0 = W^0,$$
$$W_{cor}^1 = W^1,$$
$$\vdots$$
$$W_{cor}^{L1} = W^{L-1}$$

is obtained.

The outputs of the XOR circuits 380 to 38L−1 are connected to appropriate inputs of the inverse transformation circuit 39. This inverse transformation circuit 39 provides the corrected bytes $X_{cor}^0$ to $X_{cor}^{L-1}$ at its outputs. If the error is corrigible by the error code C2, then $$X_{cor}^0 = X^0,$$
$$X_{cor}^1 = X^1,$$
$$\vdots$$
$$X_{cor}^{L-1} = X^{L-1}$$

is obtained.

Figure 4:
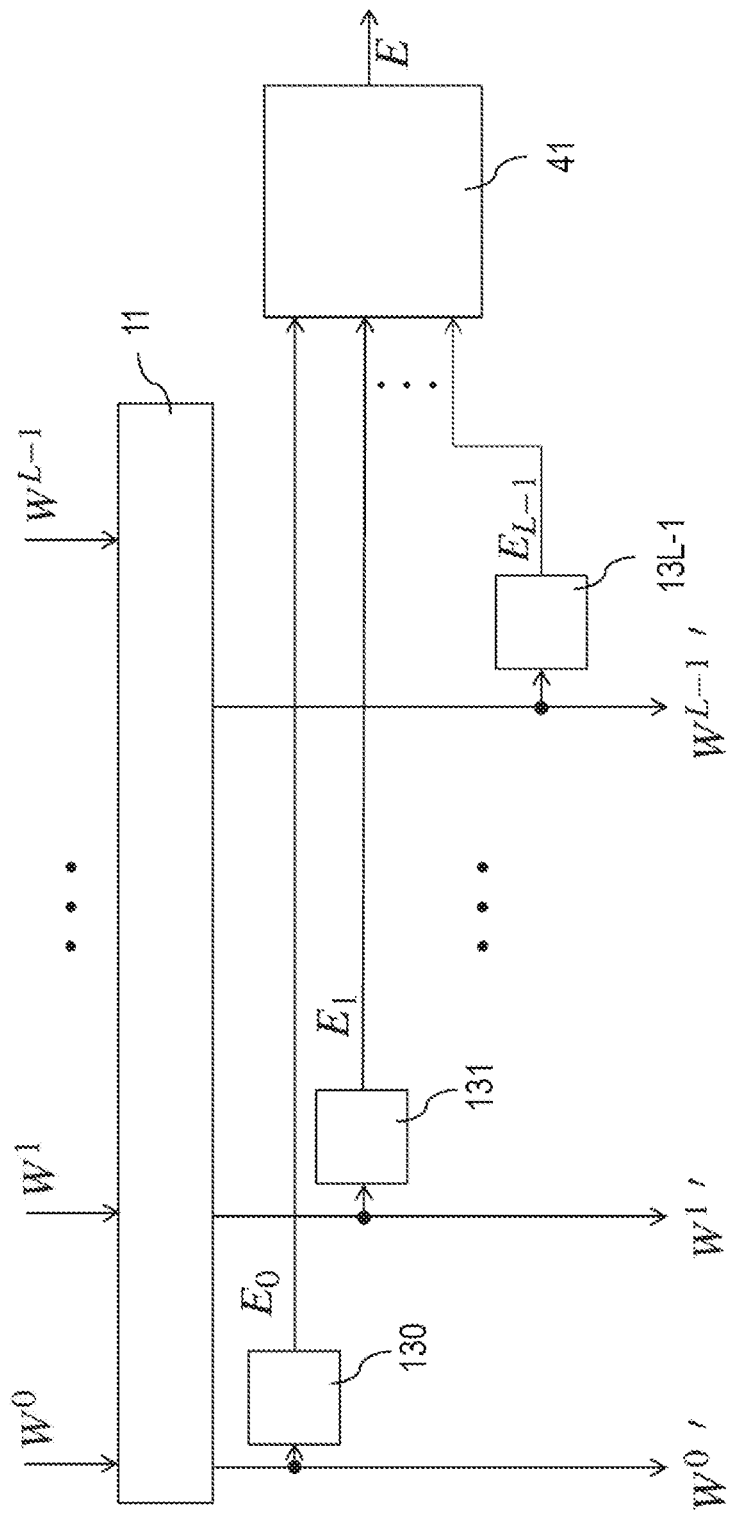
FIG. 4 shows an example circuit arrangement for determining a combined error signal E.

FIG. 4: Formation of the Error Signal

The text below explains how a combined error signal E is determined from the individual error signals E0 to EL−1.

FIG. 4 shows an example circuit arrangement having the memory 11 and the error detection circuits 130 to 13L−1 from FIG. 1. In addition to the components already shown in FIG. 1, FIG. 4 depicts an error detection circuit 41, the L inputs of which have the error signals E0, E1, ..., EL−1 of the error detection circuits 130 to 13L−1 applied to them. The error detection circuit 41 provides the combined error signal E at its output.

The error detection circuit 41 is configured such that the combined error signal E assumes a first value and hence indicates that an error has not been detected by the error detection circuits 130 to 13L−1 if all the error signals $E_0$ to $E_{L-1}$ applied to their inputs assume their first value, or the combined error signal E assumes a second value and hence indicates that at least one error has been detected by the error detection circuits 130 to 13L−1 if at least one of the error signals $E_0$ to $E_{L-1}$ applied to their inputs assumes its second value.

If the binary value 0 is used as the first value and the binary value 1 is used as the second value for the error signals E0 to EL−1, the error detection circuit 41 can be realized as an OR circuit having L inputs and one output. In this example, the first value obtained for the combined error signal E is the binary value 0 and the second value obtained therefor is the binary value 1.

It is also possible that the error detection circuit 41 outputs at its output a combined error signal E that can assume more than two different values. By way of example, the error detection circuit 41 could be configured such that it determines a number of the second values of the error signals $E_0$ to $E_{L-1}$ and outputs it as error signal E, or it outputs a binary value 1 if more than a prescribed number Sw of the error signals $E_0$ to $E_{L-1}$ assume the second value and hence indicate an error in the respective bytes of the read memory cell values W$^{0'}$ to W$^{L-1'}$ that are checked by the error detection circuit 41, the prescribed number Sw being able to be greater than or equal to 1.

In particular, the error detection circuit 41 used can be any circuit that provides the combined error signal E on the basis of the error signals applied to its inputs. Preferably, the error signals are determined at the inputs of the error detection circuit 41 as error signals from errors in bytes (i.e. groups) of memory cell values. As has already been explained, each byte comprises at least two bits in this case.

Figure 5A:
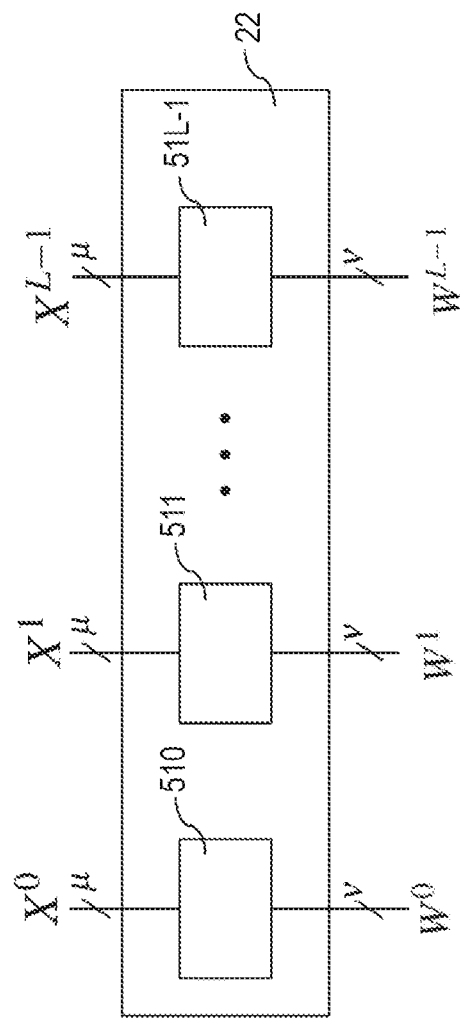
Figure 5B:
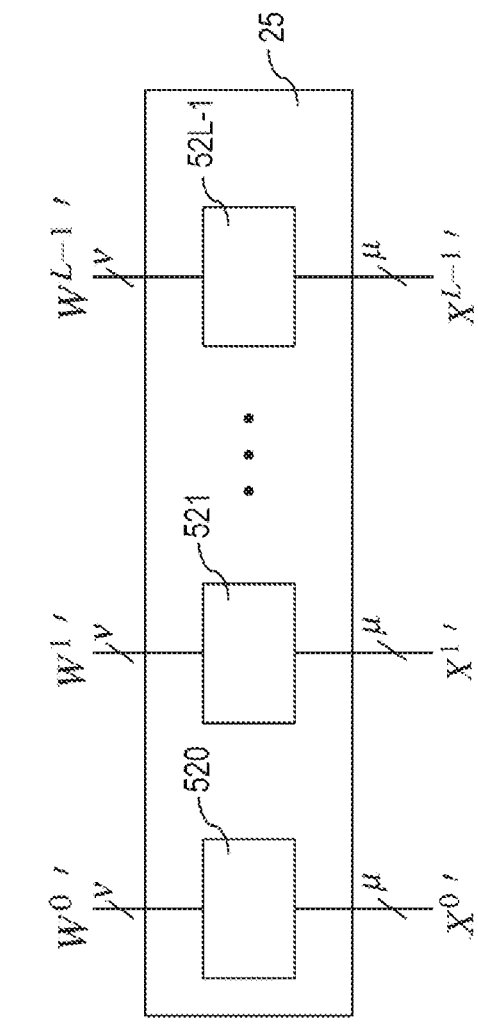
FIG. 5b shows an example implementation of the inverse transformation circuit 25 shown in FIG. 2b.

FIG. 5a and FIG. 5b: Transformation Circuits

FIG. 5a shows an example implementation of the transformation circuit 22 shown in FIG. 2a. As has already been explained, the transformation circuit 22 transforms the bytes of the data bits of the codeword $$X = X^0, X^1, \ldots, X^{L-1}$$

into bytes of memory cell values $$W = W^0, W^1, \ldots, W^{L-1}.$$

In this example, the bytes X0 to XL−1 each have an identical number μ of data bits. Also, in example fashion, the bytes W0 to WL−1 each have an identical number ν of memory cell values. The memory cell values are, in example fashion, binary.

Furthermore, in example fashion, the same block error code CF is used for the block error codes CF0 to CFL−1, so that each of the bytes X0 to XL−1 can be transformed into the bytes of memory cell values by a functionally identical transformation in each case. In this spirit, FIG. 5a shows functionally identical transformation circuits 510 to 51L−1: for each of the bytes X0 to XL−1, the μ applied bits are transformed into one byte W0 to WL−1 each having in each case ν memory cell values (in this case, in example fashion, binary memory cell values).

FIG. 5b shows an example implementation of the inverse transformation circuit 25 shown in FIG. 2b. As has already been explained, the inverse transformation circuit 25 transforms the read bytes of the memory cell values $$W' = W^{0'}, W^{1'}, \ldots, W^{L-1'}$$

into read bytes of the codeword $$X' = X^{0'}, X^{1'}, \ldots, X^{L-1'}.$$

Both the read bytes of the memory cell values W' and the read bytes of the codeword X' can have errors. These errors are detected owing to there being no codeword, for example.

The inverse transformation circuit 25 has functionally identical inverse transformation circuits 520 to 52L−1. For each of the read (possibly erroneous) bytes W0' to WL−1', the ν applied bits are transformed into one byte X0' to XL−1' each of the read bytes having in each case μ bits of the codeword that is possibly erroneous.

Example: 3-of-6 Code

An example that will be considered is bytes X0 to XL−1 of codewords having μ=4 bits each and bytes W0 to WL−1 having ν=6 (binary) memory cell values each. The block error code CF used is a subset of 16 6-bit words, each of these words having precisely three ones and precisely three zeroes.

In the case of the 3-of-6 code, there are $$\binom{6}{3} = 20$$

words having 6 bits each, in which the value 1 occurs precisely three times and the value 0 three times. The set of these 20 words is also referred to as a 3-of-6 code.

The block error code CF used in this example is a subset having only 16 of these 20 possible codewords.

A table 1 depicted below describes an example transformation T of the 16 possible assignments of the 4 bits of the bytes X0 to XL−1 into the 16 of the in total 20 possible codewords of the 6 bit memory cell bytes W0 to WL−1, so that the 16 codewords of the block error code CF are obtained. Each of the 16 assignments of the four data bits is reversibly uniquely associated with one of the 16 codewords of the block error code CF. A codeword of the block error code CF is a codeword of the 3-of-6 code and forms a byte of memory cell values.

TABLE 1

Example of a transformation T

| $x_1$ | $x_2$ | $x_3$ | $x_4$ | $w_1$ | $w_2$ | $w_3$ | $w_4$ | $w_5$ | $w_6$ |
|---|---|---|---|---|---|---|---|---|---|
| 0 | 0 | 0 | 0 | 1 | 1 | 1 | 0 | 0 | 0 |
| 1 | 1 | 1 | 1 | 0 | 0 | 0 | 1 | 1 | 1 |
| 0 | 0 | 0 | 1 | 1 | 1 | 0 | 1 | 0 | 0 |
| 1 | 1 | 1 | 0 | 0 | 0 | 1 | 0 | 1 | 1 |
| 0 | 0 | 1 | 0 | 1 | 1 | 0 | 0 | 1 | 0 |
| 1 | 1 | 0 | 1 | 0 | 0 | 1 | 1 | 0 | 1 |
| 0 | 0 | 1 | 1 | 1 | 1 | 0 | 1 | 0 | 0 |
| 1 | 1 | 0 | 0 | 0 | 0 | 1 | 0 | 1 | 1 |
| 0 | 1 | 0 | 0 | 1 | 0 | 1 | 0 | 1 | 0 |
| 1 | 0 | 1 | 1 | 0 | 1 | 0 | 1 | 0 | 1 |
| 0 | 1 | 0 | 1 | 1 | 0 | 1 | 0 | 1 | 0 |
| 1 | 0 | 1 | 0 | 0 | 1 | 0 | 1 | 0 | 1 |
| 0 | 1 | 1 | 0 | 1 | 0 | 1 | 0 | 0 | 1 |
| 1 | 0 | 0 | 1 | 0 | 1 | 0 | 1 | 1 | 0 |
| 0 | 1 | 1 | 1 | 1 | 0 | 0 | 1 | 1 | 0 |
| 1 | 0 | 0 | 0 | 0 | 1 | 1 | 0 | 0 | 1 |

The transformation T described by table 1 has the following property: if the bits x1 to x4 of one of the bytes X0 to XL−1 are transformed into the memory cell values w1 to w6 of one of the bytes W0 to WL−1 of memory cell values, then the inverted bits $$\bar{x}_1, \bar{x}_2, \bar{x}_3, \bar{x}_4$$

are also transformed into the inverted memory cell values $$\bar{w}_1, \bar{w}_2, \bar{w}_3, \bar{w}_4, \bar{w}_5, \bar{w}_6.$$

It should be noted that in this example each of the bytes W0' to WL−1' read from the memory has six possibly erroneous bits w'1 to w'6 and that each of the transformed possibly erroneous bytes X0' to XL−1' has four possibly erroneous bits x'1 to x'4.

A table 2 depicted below describes a possible inverse transformation T−1 per read byte of (binary) memory cells w'1 to w'6 into bytes of possibly erroneous bits x'1 to x'4. In this case, it should be noted that table 2 shows only an excerpt with 16 of the in total 64 possible assignments of the bits w'1 to w'6. All the assignments of the bits w'1 to w'6 that table 2 shows are codewords. The remaining 64−16=48 (undepicted) assignments of the bits w'1 to w'6 are not codewords. For these 48 assignments, the bits x'1 to x'4 are each 0.

TABLE 2

Inverse transformation $T^{-1}$, excerpt

| $w'_1$ | $w'_2$ | $w'_3$ | $w'_4$ | $w'_5$ | $w'_6$ | $x'_1$ | $x'_2$ | $x'_3$ | $x'_4$ |
|---|---|---|---|---|---|---|---|---|---|
| 1 | 1 | 1 | 0 | 0 | 0 | 0 | 0 | 0 | 0 |
| 0 | 0 | 0 | 1 | 1 | 1 | 1 | 1 | 1 | 1 |
| 1 | 1 | 0 | 1 | 0 | 0 | 0 | 0 | 0 | 1 |
| 0 | 0 | 1 | 0 | 1 | 1 | 1 | 1 | 1 | 0 |
| 1 | 1 | 0 | 0 | 1 | 0 | 0 | 0 | 1 | 0 |
| 0 | 0 | 1 | 1 | 0 | 1 | 1 | 1 | 0 | 1 |
| 1 | 1 | 0 | 0 | 0 | 1 | 0 | 0 | 1 | 1 |
| 0 | 0 | 1 | 1 | 1 | 0 | 1 | 1 | 0 | 0 |
| 1 | 0 | 1 | 1 | 0 | 0 | 0 | 1 | 0 | 0 |
| 0 | 1 | 0 | 0 | 1 | 1 | 1 | 0 | 1 | 1 |
| 1 | 0 | 1 | 0 | 1 | 0 | 0 | 1 | 0 | 1 |
| 0 | 1 | 0 | 1 | 0 | 1 | 1 | 0 | 1 | 0 |
| 1 | 0 | 0 | 1 | 1 | 0 | 0 | 1 | 1 | 0 |
| 0 | 1 | 1 | 0 | 0 | 1 | 1 | 0 | 0 | 1 |

TABLE 2-continued

Inverse transformation $T^{-1}$, excerpt

| $w'_1$ | $w'_2$ | $w'_3$ | $w'_4$ | $w'_5$ | $w'_6$ | $x'_1$ | $x'_2$ | $x'_3$ | $x'_4$ |
|---|---|---|---|---|---|---|---|---|---|
| 1 | 0 | 0 | 1 | 1 | 0 | 0 | 1 | 1 | 1 |
| 0 | 1 | 1 | 0 | 0 | 1 | 1 | 0 | 0 | 0 |

For the values of the memory cell values w'1 to w'6 that are not shown in table 2, associated values of bits x'1, x'2, x'3, x'4 can be prescribed for the synthesis of the inverse transformation circuit T−1 as desired. By way of example, it is possible to have these values stipulated as indefinite values (also referred to as "don't care" values) for an optimization by means of a synthesis tool. By way of example, it is also possible to set these values to 0.

Figure 6:
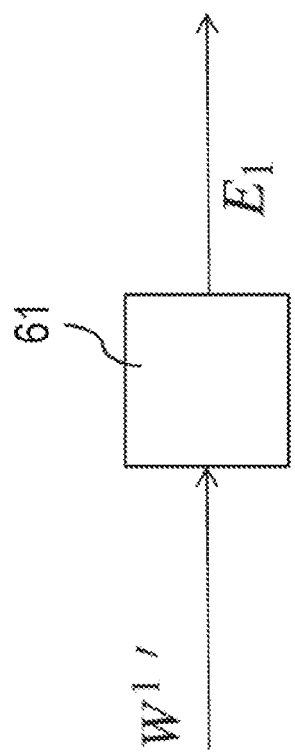
FIG. 6 shows an example error detection circuit.

FIG. 6: Error Detection Circuit for a Block Error Code

FIG. 6 shows an example error detection circuit 61, for the byte W1' of possibly erroneous 6 memory cell values $$W^{1\prime} = w'_1, w'_2, w'_3, w'_4, w'_5, w'_6$$

according to the example above. In this case, the block error code CF is a 3-of-6 code having 16 codewords.

The input of the error detection circuit 61 has the memory cell values W1' applied to it. The error detection circuit 61 is, in example fashion, configured such that, when its input has a codeword of the block error code CF applied to it, it outputs an error signal E1=0 indicating that there is no error. If the input of the error detection circuit 61 does not have a codeword of the block error code CF applied to it, it outputs an error signal E1=1, which is used to indicate the presence of an error.

A table 3 shows the 16 assignments of the memory cell values w'1 to w'6 for which the error signal E1 is equal to 0 (off-set of the Boolean function). For all other assignments of the memory cell values, not shown in table 3, the error signal E1 is equal to 1; this corresponds to an on-set of the Boolean function (this on-set is not depicted in table 3).

TABLE 3

Error signal $E_1 = 0$ (off-set)

| $w'_1$ | $w'_2$ | $w'_3$ | $w'_4$ | $w'_5$ | $w'_6$ | $E_1$ |
|---|---|---|---|---|---|---|
| 1 | 1 | 1 | 0 | 0 | 0 | 0 |
| 0 | 0 | 0 | 1 | 1 | 1 | 0 |
| 1 | 1 | 0 | 1 | 0 | 0 | 0 |
| 0 | 0 | 1 | 0 | 1 | 1 | 0 |
| 1 | 1 | 0 | 0 | 1 | 0 | 0 |
| 0 | 0 | 1 | 1 | 0 | 1 | 0 |
| 1 | 1 | 0 | 0 | 0 | 1 | 0 |
| 0 | 0 | 1 | 1 | 1 | 0 | 0 |
| 1 | 0 | 1 | 1 | 0 | 0 | 0 |
| 0 | 1 | 0 | 0 | 1 | 1 | 0 |
| 1 | 0 | 1 | 0 | 1 | 0 | 0 |
| 0 | 1 | 0 | 1 | 0 | 1 | 0 |
| 1 | 0 | 1 | 0 | 0 | 1 | 0 |
| 0 | 1 | 0 | 1 | 1 | 0 | 0 |
| 1 | 0 | 0 | 1 | 1 | 0 | 0 |
| 0 | 1 | 1 | 0 | 0 | 1 | 0 |

According to table 3, the error detection circuit 61 indicates an error
if one of the 16 codewords of the block error code CF is distorted into a 6-bit word, which is not a codeword, or
if one of the 16 codewords of the block error code CF is distorted into one of the four 3-of-6 words, none of which is a codeword of the block error code.

Figure 7:
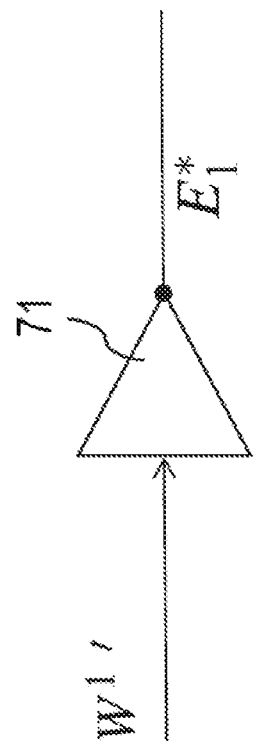
FIG. 7 shows an example error detection circuit that detects all uneven bit errors in the bits of the byte W1'.

FIG. 7: Error Detection Circuit for 1-Bit Errors

FIG. 7 shows an example error detection circuit 71 that detects all uneven bit errors in the bits of the byte W1'. To this end, the error detection circuit 71 comprises an inverted XOR circuit, so that for an error signal present at the output of the error detection circuit 71, it holds that:

$$E_1^* = \overline{w_1^{1\prime} + w_2^{1\prime} + w_3^{1\prime} + w_4^{1\prime} + w_5^{1\prime} + w_6^{1\prime}}.$$

Here, "+" denotes addition modulo 2.

For the assignments of the memory cell values w'1 to w'6 that are shown in table 3 and for an uneven number of bit errors in these memory cell values, the error signals E1 and $E_1^*$ are concordant. For an even number of bit errors distorting a codeword of the 3-of-6 code into a bit combination that is not a codeword of this 3-of-6 code, on the other hand, it holds that: E1=1 and $E_1^*$=0. The error detection circuit 71 can advantageously be used if (almost) exclusively 1-bit errors occur.

Figure 8:
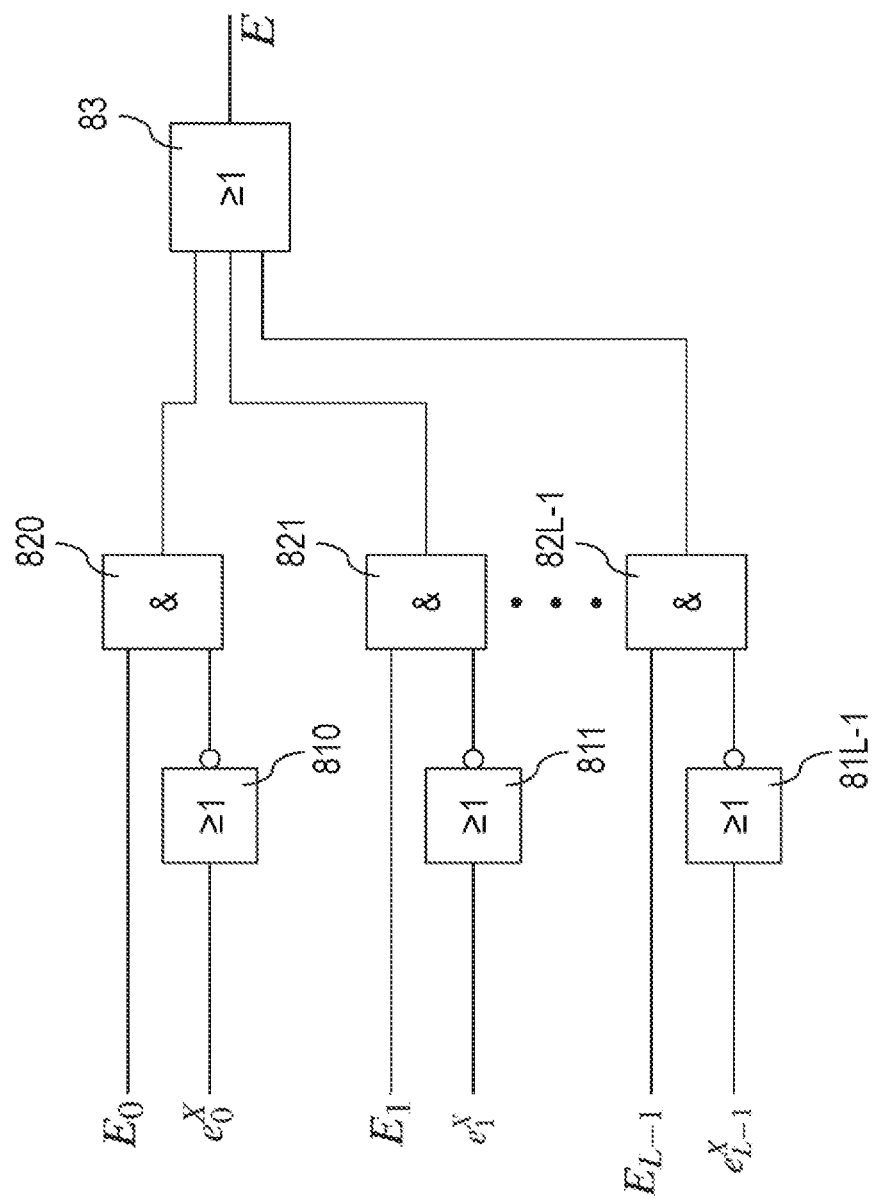
FIG. 8 shows an example circuit arrangement for examining an error correction, wherein in particular it is possible to check whether the byte correction value formation unit for determining the correction values $e_0^X$ to $e_{L-1}^X$ is working correctly.

FIG. 8: Examination of Whether Correction is Possible

FIG. 8 shows an example circuit arrangement for examining an error correction. In particular, this can be used to check whether the byte correction value formation unit 26 for determining the correction values $e_0^X$ to $e_{L-1}^X$ is working correctly.

To this end, the circuit arrangement shown in FIG. 8 has a multiplicity of L NOR circuits 810 to 81L−1, a multiplicity of AND circuits 820 to 82L−1 and an OR circuit 83.

An AND function is also abbreviated with the symbol "∧" below. Accordingly, an OR function is abbreviated with the symbol "∨".

Each byte correction value $e_0^X$ to $e_{L-1}^X$ is routed to an input of an associated NOR circuit 810 to 81L−1. The output of these NOR circuits 810 to 81L−1 is connected to a first input of an associated AND circuit 820 to 82L−1. Each of the error signals E0 to EL−1 is applied to the second input of the AND circuits 820 to 82L−1. The outputs of the AND circuits 820 to 82L−1 are connected to the inputs of the OR circuit 83. A combined error signal E is provided at the output of the OR circuit 83.

The error signals E0, E1, . . . , EL−1 are the error signals of the error detection circuits 240 to 24L−1 shown in FIG. 2b.

If for example the error signal E0 indicates by means of a value E0=1 that the data bits of the byte X0' are not a codeword of the block error code CF0, then a successful error correction requires the byte X0' to be corrected with the byte correction value $e_0^X \neq 0$. A successful correction can be made only if the correction value formation unit 26 provides a byte correction value $e_0^X \neq 0$, so that the XOR circuit 270 provides the corrected byte value $$X_{cor}^0 = X^{0\prime} + e_0^X.$$

It holds that $X^0 = X_{cor}^0$ if the error that has occurred is corrigible by the error code C1.

If it holds that the error signal E0=1 and that the byte correction value $e_0^X \neq 0$, then an error is detected in X0' by the error detection circuit 240, and the byte correction value formation unit 26 generates the correction signal $e_0^X \neq 0$ for X0'. In this case, the AND circuit 820 delivers the value 0 at its output.

If it holds that the error signal E0=1 and that the byte correction value $e_0^X \neq 0$, then an error is detected in X0' by the error detection circuit 240, and the byte correction value formation unit 26 generates the correction signal $e_0^X = 0$ for X0', so that the byte X0', although erroneous, is not corrected. In this case, although the error is detected, a correction is not possible. The AND circuit 820 delivers the value 1 at its output. The combined error signal E assumes the value E=1. Thus, the combined error signal indicates by means of a value 1 that there is an error in the correction or a correction at least for one of the bytes X0' to XL−1' is not possible. A possible cause is that the byte correction value formation unit 26 is erroneous and/or that there is an error that is not corrigible using the error code C1.

If an error is not detected by the error detection circuit 240 and if the error signal E1=0, then the value 0 is also present at the output of the AND circuit 820.

The explanations above hold for the further error signals E2 to EL−1 and the further byte correction values $e_1^X$ to $e_{L-1}^X$ with reference to the circuits 811 to 81L−1, 821 to 82L−1 and 83 accordingly.

Therefore, the OR circuit 83 outputs the value 0 for the combined error signal E at its output only if all of its L inputs have the value 0 applied to them. If the OR circuit 83 delivers the value 1 at its output, then this means that at least one of the bytes X0' to X−1L' has been detected as erroneous by one of the error detection circuits 240 to 24L−1 and is not corrigible by the byte correction value formation unit 26. It is thus possible for the operability of the byte correction value formation unit 26 to be checked in the course of operation, for example.

These explanations can be applied to the byte correction value formation unit 37 analogously.

Reed-Solomon Code

A Reed-Solomon code will be used below as an example.

A 1-byte-error-correcting Reed-Solomon code can be described for example according to Fujiwara, E.: "Code Design for Dependable Systems", Wiley 2006, page 65 by an H-matrix $$H_{Byte} = \begin{pmatrix} \alpha^0 & \alpha^0 & \alpha^0 & \cdots & \alpha^0 \\ \alpha^0 & \alpha^1 & \alpha^2 & \cdots & \alpha^{n-1} \end{pmatrix} = \begin{pmatrix} H_1 \\ H_2 \end{pmatrix} \quad (5)$$

with $n=2^m-1$, where $$H_1=(\alpha^0,\alpha^0,\alpha^0,\ldots,\alpha^0)$$

and $$H_2=(\alpha^0,\alpha^1,\alpha^2,\ldots,\alpha^{n-1}).$$

In this case, αi are elements of the Galois field GF(2r), for example in the exponential representation. α is a generating element of the Galois field and is chosen as a primitive element of the Galois field GF(2r) in this case. In equation (5), the 1-element of the Galois field is denoted as α0. The 1-element of the Galois field can also be denoted by 1.

The Reed-Solomon code described by the H-matrix according to equation (5) can correct a 1-byte error at an unknown byte position or a 2-byte error in two known erroneous byte positions or two group errors.

The exponents of α are intended to be interpreted modulo 2r−1, and an exponent i can assume the values 0, 1, . . . , 2r−2.

In one example embodiment, it is assumed that r=4, which means that the Galois field consists of 24=16 elements. The exponents of αi are intended to be interpreted modulo 15 and the H-matrix according to equation (5) has 24−1=15 columns. A column corresponds to a 4-bit byte in each case.

The data bits of a codeword x=x1, . . . , xk, where k=60, of the error code C1 form 15 bytes X0, X1, . . . , X14 having 4 bits each. It therefore holds that:

$$x_1, \ldots, x_k = X^0, X^1, \ldots, X^{14}$$

where $$X^0 = x_1, x_2, x_3, x_4$$

$$X^1 = x_5, x_6, x_7, x_8$$

$$\vdots$$

$$X^{14} = x_{57}, x_{58}, x_{59}, x_{60}.$$

When there is no error, x=X0, . . . , X14 is a codeword of the Reed-Solomon code, so that for an error syndrome s, where s=[s1,s2]T, it holds that $$s_1=H_1\cdot x=\alpha^0 X^0+\alpha^0 X^1+\ldots+\alpha^0 X^{14}=X^0+X^1+\ldots +X^{14}=0 \quad (6)$$

$$s_2=H_2\cdot x=\alpha^0 X^0+\alpha^1 X^1+\ldots+\alpha^{14}\cdot X^{14}=0, \quad (7)$$

where $s_1$ is referred to as a first subsyndrome and $s_2$ is referred to as a second subsyndrome of the error syndrome s.

If a vector is multiplied from the right by a matrix, it can be understood as a column vector. If a vector is supposed to be particularly highlighted to be a column vector, then this vector can be referred to as a transposed vector. If a vector is multiplied from the left by a matrix, it can be understood as a row vector.

Bytes X0 to X14, as elements of the Galois field GF(24), can be described as 4-bit vectors in their vector representation. To calculate the subsyndromes s1 and s2 according to equation (6) and equation (7), these bytes can be used in their polynomial representation or in their exponential representation.

Various representations of elements of the Galois field GF(24) and their use for multiplication and addition in a Galois field are described in Lin, S.; Costello, D.: "Error Control Coding", Prentice Hall 1983, pages 32 and 33, for example.

By way of example, the codeword x may be disrupted by an error e≠0 according to $$x+e = X^0 + e^0, X^1 + e^1, \ldots, X^{14} + e^{14}$$

where $$e^0 = e_1, e_2, e_3, e_4$$

$$e^1 = e_5, e_6, e_7, e_8$$

$$\vdots$$

$$e^{14} = e_{57}, e_{58}, e_{59}, e_{60}.$$

On the basis of H1·xT=0 and H2·xT=0, equation (6) and equation (7) thus result in:

$$s_1=H_1\cdot(x+e)=H_1\cdot e=\alpha^0\cdot e^0+\ldots+\alpha^0\cdot e^{14}=e^0+\ldots +e^{14}, \quad (8)$$

$$s_2=H_2\cdot(x+e)=H_1\cdot e=\alpha^0\cdot e^0+\alpha^1\cdot e^1+\ldots+\alpha^{14}\cdot e^{14}. \quad (9)$$

In this case, the 4-bit bytes e0, . . . , e14 are supposed to be referred to as byte correction values for the byte positions 0 to 14.

For a 1-byte error, in the case of which 1 bit, 2 bits, 3 bits or 4 bits of a byte at the byte position i are erroneous, it holds that:

$$s_1 = e^i, \quad (10)$$

$$s_2 = \alpha^i \cdot e^i. \quad (11)$$

Accordingly, for a 2-byte error in the byte positions i and j, it holds that:

$$s_1 = e^i + e^j, \quad (12)$$

$$s_2 = \alpha^i \cdot e^i + \alpha^j \cdot e^j. \quad (13)$$

In the case of a 1-byte error, the erroneous byte position i and the byte correction value ei can be determined from the two subsyndromes according to equations (10) and (11).

The byte correction value ei is the same as the first syndrome component s1, and the erroneous byte position i in its exponential representation αi can be determined for example as a solution y to the equation $$s_1 \cdot y + s_2 = 0.$$

The two unknowns αi and ei can be determined from the two equations (10) and (11).

In the case of a 2-byte error, it is not possible to determine the two byte correction values ei and ej and the two erroneous byte positions i and j, for example in their exponential representation αi and αj, from the two equations (12) and (13), since there are four unknowns for just two equations.

However, it is possible, given known erroneous byte positions i and j and the therefore known exponential representations αi and αj, to determine the applicable byte correction values ei and ej using the two equations (12) and (13). If the erroneous byte position is known and if, further, the applicable byte correction value is intended to be determined, this corresponds to a group error.

By way of example, the erroneous byte positions can be detected by the block error signals of the error detection circuits 140 to 14L–1 from FIG. 1. The known erroneous byte positions, for example two erroneous byte positions i and j, can then be used to determine the byte correction values ei and ej simply by means of the two equations (12) and (13). The error syndromes s1 and s2 in this example each have only 4 bits; there are thus 2 bytes having 8 bits in total.

For a 2-byte error at the byte positions i and j or two group errors in the byte positions i and j, it holds for the byte correction values ei and ej that:

$$e^i = s_1 + \frac{s_2 + \alpha^i s_1}{\alpha^i + \alpha^j} = s_1 + s_2 \cdot (\alpha^i + \alpha^j)^{-1} + \alpha^i \cdot s_1 \cdot (\alpha^i + \alpha^j)^{-1} \quad (14)$$

$$e^j = s_1 + \frac{s_2 + \alpha^j s_1}{\alpha^i + \alpha^j} = s_1 + s_2 \cdot (\alpha^i + \alpha^j)^{-1} + \alpha^j \cdot s_1 \cdot (\alpha^i + \alpha^j)^{-1}. \quad (15)$$

Equation (14) can be derived as follows:

$$s_1 = e^i + e^j;$$

$$s_2 = \alpha^i e^i + \alpha^j e^j;$$

$$e^j = s_1 + e^i;$$

$$s_2 = \alpha^i e^i + \alpha^j (s_1 + e^i) = \alpha^i e^i + \alpha^j e^j + \alpha^j s_1 =$$

$$= e^i (\alpha^i + \alpha^j) + \alpha^j s_1;$$

$$e^i (\alpha^i + \alpha^j) = s_2 + \alpha^j s_1;$$

$$e^j = \frac{s_2 + \alpha^j s_1}{\alpha^i + \alpha^j} = \frac{s_2 + \alpha^j s_1 + \overbrace{\alpha^i s_1 + \alpha^i s_1}^{=0}}{\alpha^i + \alpha^j} =$$

$$= \frac{s_2 + s_1(\alpha^i + \alpha^j) + \alpha^i s_1}{\alpha^i + \alpha^j} =$$

$$= s_1 + \frac{s_2 + \alpha^i s_1}{\alpha^i + \alpha^j};$$

Analogously, formula (15) is obtained.

For a 1-byte error in the byte position i, the byte correction value ei can be determined by $$e^i = s_1 + \frac{s_2 + \alpha^i \cdot s_1}{\alpha^i} = s_1 + s_2 \cdot (\alpha^i)^{-1} + \alpha^i \cdot s_1 \cdot (\alpha^i)^{-1} = s_2 \cdot \alpha^{-i}. \quad (16)$$

This follows directly from s1=ei and s2=αi·ei.

A sum Σ where $$\Sigma = E_0 \cdot \alpha^0 + E_1 \cdot \alpha^1 + \ldots + E_{14} \cdot \alpha^{14}$$

results in $$\Sigma = \alpha^i$$

for a 1-byte error in the byte position i and in $$\Sigma = \alpha^i + \alpha^j$$

for a 2-byte error in the byte positions i and j.

Using the inverse value Σ−1 of the sum Σ, for the byte correction value ei in the byte position i, it holds both for a 1-byte error in the byte position i and for a 2-byte error in the byte positions i and j that $$e^i = s_1 + s_2 \cdot \Sigma^{-1} + \alpha^i \cdot s_1 \cdot \Sigma^{-1}, \quad (17)$$

so that in the event of a byte error in the byte position i, on the basis of a 1-byte error in this byte position i or of a 2-byte error in this byte position i and another byte position, the byte correction value $e^i$ according to equation (17) is determined by the subsyndromes $s_1$ and $s_2$, the value of $\Sigma^{-1}$ and the error position i in its exponential representation $\alpha^i$.

Three Group Errors

For a Reed-Solomon code for correcting 3 byte errors for which the erroneous three byte positions are known, an H-matrix $$H_{Byte} = \begin{pmatrix} \alpha^0 & \alpha^0 & \alpha^0 & \ldots & \alpha^0 \\ \alpha^0 & \alpha^1 & \alpha^2 & \ldots & \alpha^{n-1} \\ \alpha^0 & \alpha^2 & \alpha^4 & \ldots & \alpha^{2(n-1)} \end{pmatrix} \quad (18)$$

where n=2^m−1 can be used, as is depicted for example in [Fujiwara, E.: "Code Design for Dependable Systems", Wiley, 2006, page 65], including a general form for an H-matrix of a Reed-Solomon code.

If columns in the H-matrix according to equation (18) are deleted, then it is possible to refer to a shortened code. In order to match the length of the code used to the required word length, it is possible to use such shortened codes.

The 1-element of the Galois field, denoted by 1 in Fujiwara, E.: "Code Design for Dependable Systems", Wiley 2006, page 65, is denoted by α0 in equation (18).

Byte errors for which the erroneous byte positions are known can, as has already been explained, be referred to as group errors.

In the case of 3 group errors, i.e. byte errors at the erroneous byte positions j and k with the byte correction values ei, ej and ek, it then holds that:

$$s_1 = e^i + e^j + e^k, \quad (19)$$

$$s_2 = \alpha^i \cdot e^i + \alpha^j \cdot e^j + \alpha^k \cdot e^k, \quad (20)$$

$$s_3 = \alpha^{2 \cdot i} \cdot e^i + \alpha^{2 \cdot j} \cdot e^j + \alpha^{2 \cdot k} \cdot e^k. \quad (21)$$

Resolving equations (19) to (21) according to ei, ej and ek results in:

$$e^i = \frac{s_3 + \alpha^j \cdot \alpha^k \cdot s_1 + (\alpha^j + \alpha^k)s_2}{(\alpha^j + \alpha^i) \cdot (\alpha^k + \alpha^i)}, \quad (22)$$

$$e^j = \frac{s_3 + \alpha^i \cdot \alpha^k \cdot s_1 + (\alpha^i + \alpha^k)s_2}{(\alpha^i + \alpha^j) \cdot (\alpha^k + \alpha^j)}, \quad (23)$$

$$e^k = \frac{s_3 + \alpha^i \cdot \alpha^j \cdot s_1 + (\alpha^i + \alpha^j)s_2}{(\alpha^i + \alpha^k) \cdot (\alpha^j + \alpha^k)}. \quad (24)$$

Equation (24) can be derived as follows:
From equation (19), it follows for ei that $$e^i = s_1 + e^j + e^k. \quad (25)$$

Equation (25) is inserted into equation (20), to give:

$$s_2 = \alpha^i \cdot (s_1 + e^j + e^k) + \alpha^j \cdot e^j + \alpha^k \cdot e^k,$$

$$s_2 = \alpha^i s_1 + \alpha^i e^j + \alpha^i e^k + \alpha^j e^j + \alpha^k e^k,$$

$$e^j(\alpha^i + \alpha^j) = s_2 + \alpha^i s_1 + \alpha^i e^k + \alpha^k e^k. \quad (26)$$

Accordingly, equation (25) is inserted into equation (21), so that it holds that:

$$s_3 = \alpha^{2i} \cdot (s_1 + e^j + e^k) + \alpha^{2j} \cdot e^j + \alpha^{2k} \cdot e^k,$$

$$s_3 = \alpha^{2i} s_1 + \alpha^{2i} e^j + \alpha^{2i} e^k + \alpha^{2j} e^j + \alpha^{2k} e^k,$$

$$e^j(\alpha^{2i} + \alpha^{2j}) = s_3 + \alpha^{2i} s_1 + \alpha^{2i} e^k + \alpha^{2k} e^k. \quad (27)$$

Equation (27) can then be divided by equation (26), so that $$(\alpha^i + \alpha^j)^2 = (\alpha^i + \alpha^j)(\alpha^i + \alpha^j) = \alpha^{2i} + \alpha^i \alpha^j + \alpha^i \alpha^j + \alpha^{2j} = \alpha^{2i} + \alpha^{2j}$$

gives:

$$\frac{e^j(\alpha^{2i} + \alpha^{2j})}{e^j(\alpha^i + \alpha^j)} = \frac{(\alpha^i + \alpha^j)^2}{\alpha^i + \alpha^j} == \alpha^i + \alpha^j = \frac{s_3 + \alpha^{2j} s_1 + \alpha^{2i} e^k + \alpha^{2k} e^k}{s_2 + \alpha^i s_1 + \alpha^i e^k + \alpha^k e^k}.$$

When $$(\alpha^i \alpha^k + \alpha^i \alpha^j + \alpha^j \alpha^k + \alpha^{2k}) = (\alpha^i + \alpha^k)(\alpha^j + \alpha^k),$$

multiplying out, combining and resolving according to $e^k$ result in:

$$\alpha^i s_2 + \alpha^{2i} s_1 + \alpha^{2i} e^k + \alpha^i \alpha^k e^k + \alpha^j s_2 + \alpha^i \alpha^j s_1 +$$

$$\alpha^i \alpha^j e^k + \alpha^j \alpha^k e^k + s_3 + \alpha^{2i} s_1 + \alpha^{2i} e^k + \alpha^{2k} e^k = 0,$$

$$e^k(\alpha^i \alpha^k + \alpha^i \alpha^j + \alpha^j \alpha^k + \alpha^{2k}) == s_3 + \alpha^i s_2 + \alpha^j s_2 + \alpha^i \alpha^j s_1,$$

$$e^k + \frac{s_3 + (\alpha^i + \alpha^j)s_2 + \alpha^i \alpha^j s_1}{(\alpha^i + \alpha^k)(\alpha^j + \alpha^k)}.$$

This corresponds to equation (24). The other two equations (22) and (23) can be derived accordingly.

The sum Σ, where $$\Sigma = E_0 \cdot \alpha^0 + E_1 \cdot \alpha^1 + \ldots + E_{14} \cdot \alpha^{14},$$

for a 3-byte error in the byte positions i, j, k, results in:

$$\Sigma = \alpha^i + \alpha^j + \alpha^k.$$

In the case of a byte error in the three byte positions i, j and k, the product Π of the erroneous byte positions in their exponential representation can also be used:

$$\Pi = \alpha^i \cdot \alpha^j \cdot \alpha_k. \quad (28)$$

The case in which the three byte positions i, j, k with their exponential representation αi, αj, αk are erroneous is considered below.

From the sum Σ and the erroneous byte position k in its exponential representation αk, the sum αi=αj is determinable for the other two erroneous byte positions i and j according to $$\alpha^i + \alpha^j = \Sigma + \alpha^k. \quad (29)$$

From the sum Σ and the erroneous byte position j in its exponential representation αj, the sum αi+αk is determinable for the other two erroneous byte positions i and k according to $$\alpha^i + \alpha^k = \Sigma + \alpha^j. \quad (30)$$

From the sum Σ and the erroneous byte position i in its exponential representation αi, the sum αj+αk is determinable for the other two erroneous byte positions j and k according to $$\alpha^j + \alpha^k = \Sigma + \alpha^i. \quad (31)$$

From the product Π and the erroneous byte position k in its exponential representation αk, the product αi·αj is determinable for the other two erroneous byte positions i and j according to $$\alpha^i + \alpha^j = \Pi \cdot \alpha^{-k}, \quad (32)$$

From the product Π and the erroneous byte position j in its exponential representation αj, the product αi·αk is determinable for the other two erroneous byte positions i and j according to $$\alpha^i + \alpha^k = \Pi \cdot \alpha^{-j}. \quad (33)$$

From the product Π and the erroneous byte position i in its exponential representation αi, the product αj·αk is then determinable for the other two erroneous byte positions j and k according to $$\alpha^j \cdot \alpha^k = \Pi \cdot \alpha^{-i}. \quad (34)$$

In example fashion, the representation of the byte correction value ek in the erroneous byte position k according to equation (24)

$$e^k = \frac{s_3 + \alpha^i \cdot \alpha^j \cdot s_1 + (\alpha^i + \alpha^j)s_2}{(\alpha^i + \alpha^k) \cdot (\alpha^j + \alpha^k)},$$

is considered. It holds for the denominator of equation (24) that $$(\alpha^i + \alpha^k)\cdot(\alpha^j + \alpha^k) = (\alpha^i + \alpha^j)\cdot\alpha^k + \alpha^i\cdot\alpha^j + \alpha^{2k} \quad (35)$$

$$= \left(\sum + \alpha^k\right)\cdot\alpha^k + \prod\cdot\alpha^{-k} + \alpha^{2k}$$

$$= \sum\cdot\alpha^k + \prod\cdot\alpha^{-k}$$

and hence for the byte correction value $e^k$ that $$e^k = \frac{s_3 + \prod\cdot\alpha^{-k}s_1 + \left(\sum + \alpha^k\right)\cdot s_2}{\sum\cdot\alpha^k + \prod\cdot\alpha^{-k}}. \quad (36)$$

According to equation (36), it is therefore possible to determine the byte correction value ek for the k-th byte by means of the syndrome components s1, s2, s3, the values of Σ and Π and by means of the byte error position k that is to be determined. The erroneous byte positions i and j are not required for determining the byte correction value ek for the k-th byte.

It is thus possible to use for example centrally determined and provided values of the syndrome components s1, s2, s3 and the values Σ and Π to determine an applicable byte correction value locally for each possible byte error position k and, on the basis of the value of the applicable byte error position signal, to determine whether the byte correction value ek thus determined is actually supposed to be used for error correction. In this case, the byte error position signal of a byte (e.g. a group of bits) indicates whether (or not) there is a group error for this byte.

Correction of a Group Error when there are Three Group Errors

Figure 9A:
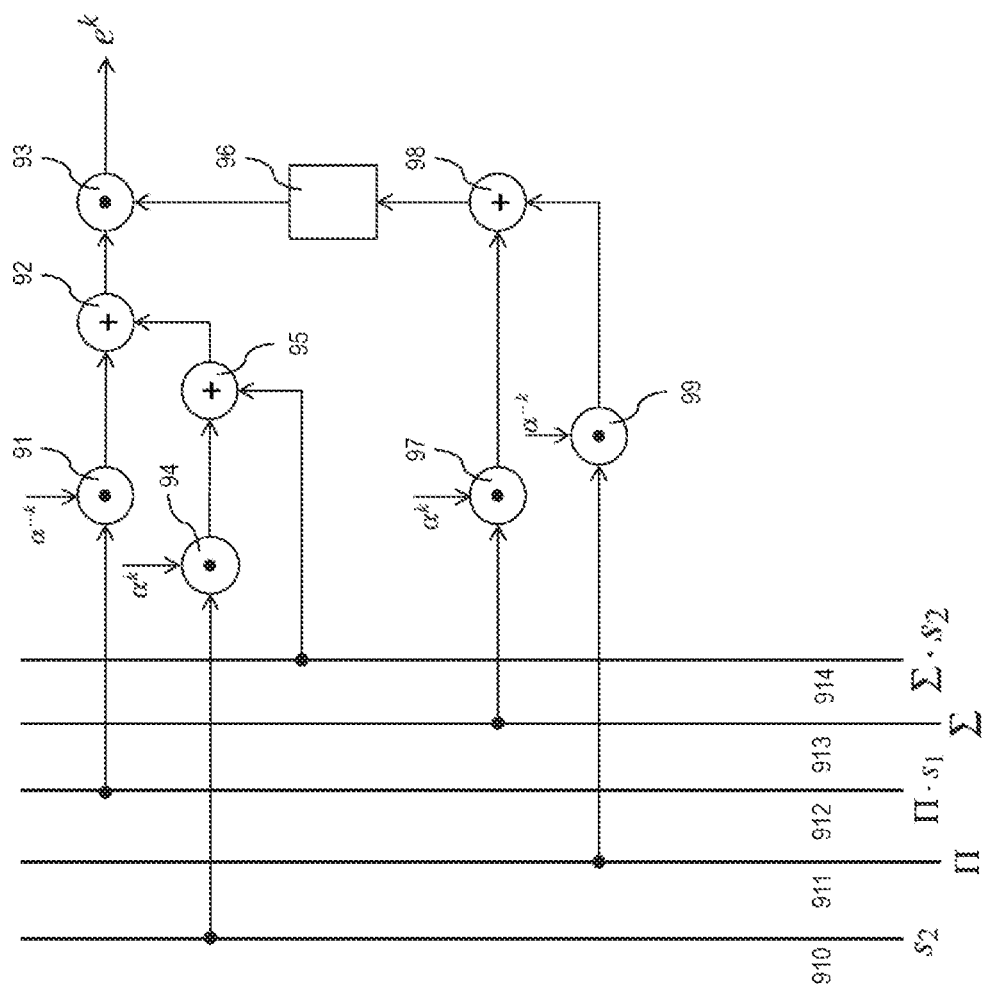
FIG. 9a shows an example circuit arrangement for determining a byte correction value ek for correcting an erroneous k-th byte.

FIG. 9a shows an example circuit arrangement for determining a byte correction value ek for correcting an erroneous k-th byte. This is used to correct a group error when there are three group errors in total.

In example fashion, the i-th, the j-th and the k-th byte are erroneous. The error signals Ei=Ej=Ek=1 accordingly indicate that there are three group errors. In this example, the remaining error signals are equal to 0, that is to say there are no further group errors. As an example, the Galois field GF(2⁴) is considered.

The arrangement shown in FIG. 9a comprises
four constant multipliers 91, 94, 97 and 99 having in each case a first 4-bit input, a second 4-bit input and a 4-bit output,
three XOR circuits 92, 95, 98 having in each case a first 4-bit input, a second 4-bit input and a 4-bit output,
an inverter 96 in the Galois field $GF(2^4)$ having a 4-bit input and a 4-bit output,
a Galois field multiplier 93 having a first 4-bit input, a second 4-bit input and a 4-bit output, and
five in each case 4-bit inputs 910, 911, 912, 913, 914 to which the values $s_2$, Π, Π·$s_1$, Σ, Σ·$s_2$ are applied.

The input 912 is connected to the first input of the constant multiplier 91, the second input of which has the value α-k applied to it and the output of which is routed to the first input of the XOR circuit 92.

The input 910 is connected to the first input of the constant multiplier 94, the second input of which has the value αk applied to it and the output of which is connected to the first input of the XOR circuit 95.

The input 914 is connected to the second input of the XOR circuit 95, the output of which is connected to the second input of the XOR circuit 92. The output of the XOR circuit 92 is connected to the first input of the Galois field multiplier 93.

The input 913 is connected to the first input of the constant multiplier 97, the second input of which has the value αk applied to it and the output of which is connected to the first input of the XOR circuit 98.

The input 911 is connected to the first input of the constant multiplier 99, the second input of which has the value α-k applied to it and the output of which is connected to the second input of the XOR circuit 98. The output of the XOR circuit 98 is connected to the input of the inverter 96.

The output of the inverter 96 is connected to the second input of the Galois field multiplier 93, the output of which provides the byte correction value ek.

The values s2, Π, Π·s1, Σ, Σ·s2 applied to the circuit inputs 910, 911, 912, 913 and 914 can be used for forming different byte correction values e0, e1, . . . , ek, . . . . It may therefore be efficient to determine these only once.

Figure 9B:
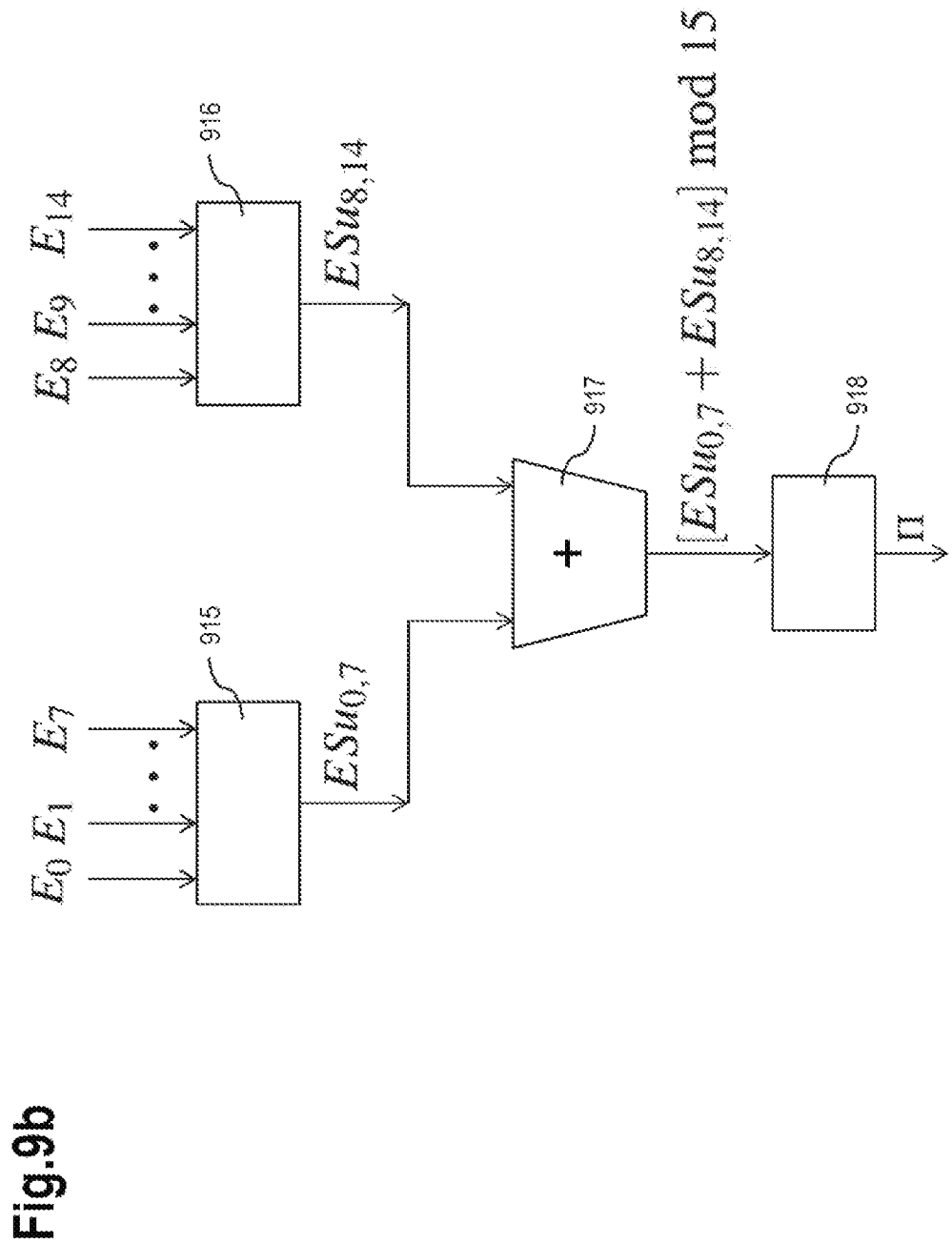
FIG. 9b shows an example circuit arrangement for forming the product $$\Pi = \alpha^i \cdot \alpha^j \cdot \alpha^k = \alpha^{(i+j+k) \bmod 15}$$

FIG. 9b shows an example circuit arrangement for forming the product $$\Pi = \alpha^i\cdot\alpha^j\cdot\alpha^k = \alpha^{(i+j+k)\bmod 15}$$

when a byte error in the i-th, j-th and k-th bytes is indicated by the error signals $E_i=E_j=E_k=1$. Thus, in example fashion, the same error situation exists as in the example for FIG. 9a above.

The arrangement shown in FIG. 9b comprises
a circuit section 915 having an 8-bit input for inputting the error signals $E_0$ to $E_7$ and a 4-bit output for outputting a 4-bit signal $ESu_{0,7}$,
a circuit section 916 having a 7-bit input for inputting the error signals $E_8$, $E_9$, . . . , $E_{14}$ and a 4-bit output for outputting a 4-bit signal $ESu_{8,14}$,
an adder 917 having a first 4-bit input, a second 4-bit input and a 4-bit output at which a value $$[ESu_{0,7} + ESu_{8,14}] \bmod 15$$

is provided, and
a combination circuit 918 having a 4-bit input and a 4-bit output for outputting the value $\Pi = \alpha^i\cdot\alpha^j\cdot\alpha^k$.

The output of the circuit section 915 is connected to the first input of the adder 917. The output of the circuit section 916 is connected to the second input of the adder 917. The output of the adder 917 is connected to the input of the combination circuit 918.

The adder 917 performs an addition modulo 15. It can be implemented as a 4-bit adder, for example, such that the outband carry bit of the fourth adding stage is routed to the inband carry bit of the first adding stage. The adder 917 can be embodied as what is known as a carry end around adder.

The first circuit section 915 is configured such that it responds to input of the error signals E0 to E7 by providing the signal $$ESu_{0,7} = [0\cdot E_0 + 1\cdot E_1 + 2\cdot E_2 + \ldots + 7\cdot E_7] \bmod 15 \quad (37)$$

at its output.

As a result of equation (37), each binary 8-tuple E0, E1, . . . , E7 has an associated 4-bit value or an associated 4-tuple ESu0,7, this association being representable as a table and being able to be produced as a combination circuit, for example using a synthesis tool.

The second circuit section 916 is configured such that it responds to input of the error signals E8 to E14 by outputting $$ESu_{8,14} = [8\cdot E_8 + 9\cdot E_9 \ldots + 14\cdot E_{14}] \bmod 15 \quad (38)$$

at its output.

As a result of equation (38), each binary 7-tuple E8, E9, ..., E14 has an associated 4-bit value or 4-tuple $ESu_{8,14}$, this association being representable as a table and being able to be produced as a combination circuit, for example using a synthesis tool.

The adder 917 provides the value $$[ESu_{0,7} + ESu_{8,14}] \bmod 15 = [0 \cdot E_0 30\ 1 \cdot E_1 + 2 \cdot E_2 + \ldots + 14 \cdot E_{14}] \bmod 15 \quad (39)$$

at its output. If it holds that the error signals $E_i = E_j = E_k = 1$ and $E_l = 0$ for $l \neq i, j, k$, the output of the adder 917 has the value $$[i+j+k] \bmod 15$$

present, which corresponds to the exponent of $$\alpha^i \cdot \alpha^j \cdot \alpha^k = \alpha^{[i+j+k] \bmod 15}.$$

The combination circuit 918 is fashioned such that it assigns the element $$\alpha^{[ESu_{0,7} + ESu_{8,14}] \bmod 15} = \alpha^{[i+j+k] \bmod 15} = \alpha^i \cdot \alpha^j \cdot \alpha^k$$

in the exponential representation to the value $[ESu_{0,7} + ESu_{8,14}] \bmod 15$ applied to its input, so that the value $$\Pi = \alpha^i \cdot \alpha^j \cdot \alpha^k$$

is provided at its output.

FIG. 10: Correction of One Group Error or Two Group Errors

FIG. 10 shows an example circuit arrangement that determines the byte correction value for an arbitrary, possibly erroneous, I-th byte on the assumption that an erroneous byte position or two erroneous byte positions is/are known and hence a group error or two group errors has/have occurred. The erroneous at least one byte position is known in this case as a result of the values of the error signals.

For each byte to be corrected, the byte correction value is ascertained using the two values $$s_1 + s_2 \cdot \Sigma^{-1},$$

$$s_1 \cdot \Sigma^{-1},$$

which each need to be determined only once (e.g. centrally) and can be used for correcting all bytes. The formation of these values requires a relatively large amount of hardware outlay in the form of a Galois field multiplier. Advantageously, only two Galois field multipliers in total can be used for all byte corrections in the various byte positions.

The byte correction value, which is different for the different byte positions, results merely from the use of a constant multiplier, corresponding to the respective byte position, which is realizable with less hardware outlay than the Galois field multiplier (for the I-th byte a multiplication by $\alpha I$ is performed using the constant multiplier 102).

It is also advantageous that the same circuit can be used both for a 1-byte error with a known byte error position and for 2-byte errors with known byte error positions. Therefore, one or two group errors are corrected. As has already been explained, a group error is a byte error with a known byte position and correction value to be determined (that is to say the correction of the bits within the erroneous byte position).

In contrast to FIG. 10, the correction of 3 group errors as shown in FIG. 9a requires a Galois field multiplier 93 in each byte position to be corrected.

FIG. 10 shows an example implementation based on equation (17) for determining the byte correction value eI for correcting a possibly erroneous I-th data byte XI'. In the present example, a data byte comprises 4 bits and the Galois field is GF($2^4$). FIG. 10 comprises a byte correction value formation unit 101 having a constant multiplier 102, an XOR circuit 103 and an AND circuit 104. Furthermore, FIG. 10 shows an XOR circuit 105.

An input line 106 has the 4-bit signal $s1 + s2 \cdot \Sigma - 1$ present on it. The input line 106 is connected to a first 4-bit input of the XOR circuit 103.

An input line 107 has the 4-bit signal $s1 \cdot \Sigma - 1$ present on it. The input line 107 is connected to a first input of the constant multiplier 102. The second input of the constant multiplier 102 has the constant $\alpha I$ applied to it.

The value $$\alpha^I \cdot s_1 \cdot \Sigma^{-1}$$

is therefore provided at the 4-bit output of the constant multiplier 102. The output of the constant multiplier 102 is connected to the second input of the XOR circuit 103. The signal $$s_1 + s_2 \cdot \Sigma^{-1} + \alpha^I \cdot s_1 \cdot \Sigma^{-1}$$

is provided at the 4-bit output of the XOR circuit 103.

The output of the XOR circuit 103 is connected to the first 4-bit input of the AND circuit 104. The second input of the AND circuit 104 has the error signal EI applied to it. The byte correction value eI for correcting the possibly erroneous I-th byte XI' is provided at the 4-bit output of the AND circuit 104, wherein it holds that $$e^I = E_I [s_1 + s_2 \cdot \Sigma^{-1} + \alpha^I \cdot s_1 \cdot \Sigma^{-1}].$$

The output of the AND circuit 104 is connected to the first 4-bit input of the XOR circuit 105. The second 4-bit input of the XOR circuit 105 has the byte XI' to be corrected applied to it. The corrected I-th byte $$X_{cor}^I = X^{I'} + e^I$$

is output at the 4-bit output of the XOR circuit 105.

If the error signal EI is equal to 0, then the I-th byte is not corrected.

The XOR circuits form the component-by-component XOR sum of the 4-bit input signals applied to their respective inputs.

The AND circuit 104 realizes component-by-component ANDing of its four binary values applied to its first input with the error signal EI. If the error signal EI is equal to 0, then the AND circuit 104 outputs the respective value 0 at its 4-bit output. If the error signal EI is equal to 1, then the AND circuit 104 outputs the values applied to its first input at its 4-bit output.

The byte correction value formation unit 101 realizes a Galois field multiplication for the signal $s1 \cdot \Sigma - 1$ by the constant $\alpha I$. Such a Galois field multiplication can be realized by means of a linear circuit using XOR gates, as will be explained in more detail below.

The byte correction value formation unit 101 therefore provides the function of a byte correction for the I-th byte. The byte correction value formation unit provides a byte correction value eI at its output when the error signal EI=1 indicates an error for the I-th byte, i.e. for the I-th byte position. The byte correction value eI is equal to 0 when the error signal EI is equal to 0.

The signals $s1 + s2 \cdot \Sigma - 1$ and $s1 \cdot \Sigma - 1$ to be input can be determined once and used for multiple byte correction value formation units and hence for different bytes that possibly need to be corrected.

One advantage is also that the circuit arrangement can be used both for correcting 1-byte errors and for correcting 2-byte errors if the at least one erroneous byte position of the one erroneous byte or of the two erroneous bytes is known from the values of the error signals.

Byte correction values can therefore efficiently be determined in parallel for different bytes that are possibly erroneous.

In this context, in parallel means in particular that the determination and/or provision of the byte correction values can be effected with overlapping timing, in particular substantially at the same times, at least in some cases. Therefore, one advantageous option is that the correction requires only one constant multiplier, two XOR circuits and one AND circuit per byte, as depicted in example fashion for the I-th byte in FIG. 10.

In particular, multiple byte correction value formation units can be implemented in parallel for bytes to be corrected. In particular, the byte correction values can be determined during at least one clock cycle, for example during a succession of common clock cycles or during a succession of a portion of common clock cycles (that is to say with overlapping timing). The at least partially overlapping timing allows parallel processing. In this case, it should be noted that the term parallel determination in particular also covers partially parallel (that is to say e.g. partially simultaneous) handling.

If there is no error, all the error signals E0, . . . , E14 are equal to 0 and all the byte correction values are equal to 0, which means that no errors are corrected.

FIG. 11: Parallel Realization of the Correction Value Formation Units

FIG. 11 shows an example circuit arrangement for a parallel realization of 15 byte correction value formation units. Therefore, 15 possibly erroneous bytes X0', X1', . . . , X14' can be corrected. Each byte has, in example fashion, a word length of 4.

For each of the 15 bytes X0', X1', . . . , X14', FIG. 11 shows a byte correction value formation unit BK0 111, BK1 112 to BK14 113 for forming the byte correction values e0 to e14. The byte correction values e0 to e14 are logically combined with the read and possibly erroneous bytes X0' to X14' in 15 XOR circuits 114, 115, 116 on a component-by-component basis to produce the corrected bytes $X_{cor}^0$ to $X_{cor}^{14}$.

In this context, it should be noted that there are 15 byte correction value formation units and 15 XOR circuits in each case, three of which are depicted in each case to provide a better overview. The byte correction value formation units 111 to 113 in this case can be designed according to the byte correction value formation unit 101 depicted in FIG. 10.

FIG. 12: Formation of Σ−1

FIG. 12 shows an example circuit arrangement for determining Σ−1, where Σ−1 is the inverse value of Σ in the Galois field GF(24) assumed in example fashion.

FIG. 12 comprises a combination circuit 121 and an inverter 122.

The combination circuit 121 delivers the value Σ at its 4-bit output according to $$\Sigma = E_0 \cdot \alpha^0 + E_1 \cdot \alpha^1 + \ldots + E_{14} \cdot \alpha^{14} \qquad (40)$$

on the basis of the binary error signals $E_0$ to $E_{14}$ described here in example fashion. In this case, $\alpha^0$ to $\alpha^{14}$ in their respective vector representation are 4-component binary vectors.

The output of the combination circuit 121 is connected to a 4-bit input of the inverter 122. The inverter 122 is an inverter in the Galois field GF(24). The 4-bit value Σ−1 is provided at the 4-bit output of the inverter according to $$\Sigma \cdot \Sigma^{-1} = \alpha^0 \qquad (41).$$

An inverter 122 in the Galois field GF(24) can be realized as a combination circuit having 4 inputs and 4 outputs.

FIG. 13: Formation of Σ

FIG. 13 shows an example implementation of the combination circuit 121 from FIG. 12 for forming Σ from the error signals E0 to E14 using XOR circuits. The example shown here again relates to the Galois field GF(24).

The 4 components Σ0, Σ1, Σ2, Σ3 from $$\Sigma = (\Sigma_0, \Sigma_1, \Sigma_2, \Sigma_3)$$

are determined by XOR functions for the error signals $E_0$ to $E_{14}$.

The arrangement for FIG. 13 shows four outputs, wherein a first output provides the signal Σ0, a second output provides the signal Σ1, a third output provides the signal Σ2 and a fourth output provides the signal Σ3.

If the error signal Ei is equal to 1 for 0≤i≤14, then the components of αi that are equal to 1 in equation (40) make a contribution to the applicable components of Σ. The components αi that are equal to 0 make no contribution to the applicable components of Σ.

If it holds for example that the error signal E0=1 with α0=[1000]T, then the error signal E0 makes a contribution in the XOR sum for the first component Σ0 of Σ. The input that carries E0 is therefore connected to the first output. The error signal E0 makes no contribution in the XOR sum for the second component Σ1, the third component Σ2 and the fourth component Σ3 of Σ. Accordingly, the line carrying the error signal E0 is not connected to these outputs.

If it holds for example that the error signal E5=1 with α5=[0110]T, then the error signal E5 makes a contribution for the second component Σ1 and the third component Σ2 of Σ. Accordingly, the line carrying the error signal E5 is connected via an XOR circuit 1325 to the second output, which carries the value Σ1, and via an XOR circuit 1335 to the third output, which carries the value Σ2. The error signal E5 makes no contribution in the XOR sum for the first component Σ0 and the fourth component Σ3 of Σ. Accordingly, the line carrying the error signal E5 is not connected to these outputs.

For Σ0, it holds that:

$$\Sigma_0 = E_0 + E_4 + E_7 + E_8 + E_{10} + E_{12} + E_{13} + E_{14}. \qquad (42)$$

The XOR functions for the error signals E0, E4, E7, E8, E10, E12, E13, E14 according to equation (42) for Σ0 are provided by the XOR circuits 1314, 1317, 1318, 13110, 13112, 13113, 13114 with two inputs and one output in each case.

For Σ1, it holds that:

$$\Sigma_1 = E_1 + E_4 + E_5 + E_7 + E_9 + E_{10} + E_{11} + E_{12}. \qquad (43)$$

The XOR functions for the error signals E1, E4, E5, E7, E9, E10, E11, E12 according to equation (43) for Σ1 are provided by the XOR circuits 1324, 1325, 1328, 1329, 13210, 13211, 13212 with two inputs and one output in each case.

For Σ2, it holds that:

$$\Sigma_2 = E_2 + E_5 + E_6 + E_8 + E_{10} + E_{11} + E_{12} + E_{13}. \qquad (44)$$

The XOR functions for the error signals E2, E5, E6, E8, E10, E11, E12, E13 according to equation (44) for Σ2 are provided by the XOR circuits 1335, 1336, 1338, 13310,

13311, 13312, 13313 with two inputs and one output in each case.

For $\Sigma 3$, it holds that:

$$\Sigma_3 = E_3 + E_6 + E_7 + E_9 + E_{11} + E_{12} + E_{13} + E_{14}. \quad (45)$$

The XOR functions for the error signals E3, E6, E7, E9, E11, E12, E13, E14 according to equation (45) for $\Sigma 3$ are provided by the XOR circuits 1346, 1347, 1349, 13411, 13412, 13413, 13414 with two inputs and one output in each case.

FIG. 14: Formation of the Byte Correction Signal

A combination of the correction of a byte error for a known erroneous byte position (group error correction) with a correction of a byte error when the erroneous byte position is not known (correction of general byte errors) is described below.

If the erroneous byte position is known by means of the group error, it is sufficient to determine only the byte correction value for the erroneous byte.

If the erroneous byte position is not known, then it is necessary to check whether the byte position is erroneous and it is also necessary to determine the byte correction value if the byte position is erroneous.

In example fashion, a Reed-Solomon code is used that can correct two group errors or one byte error. The one byte error is corrected if no group error has been detected.

In the example used here, the combined error signal E is formed from the error signals E0 to E14. The combined error signal E indicates whether any error signal indicates a group error for one of the bytes. If that is the case, then either one group error or two group errors is/are corrected.

If the combined error signal E indicates that a group error has not been determined by one of the error signals E0 to E14, then an error correction is made with an indefinite byte error position; this results in no correction if there is no error.

According to one example, the error code C1 in combination with the block error codes CF0 to CF14 can correct the following errors:
  one or two group errors detected by the block error codes can be corrected as follows:
  The error signals $E_0$ to $E_{14}$ of the error detection circuits 130 to 13L−1 (where L=14) shown in FIG. 1 determine the position of the one byte or the positions of the two bytes that has/(each) have a group error.
  For those byte positions for which a group error has been determined, the error code $C^1$ is used to determine the byte correction value (that is to say the correction value for the affected byte identified as erroneous). In particular, it is advantageous if such an error is corrected at the previously determined position of the group error.
  It is also possible for a single byte error, which has not been detected as a group error by one of the error detection circuits 130 to 13L−1, to be corrected using the error code $C^1$.

In that case, the error code C1 is used to determine both the byte position of the one erroneous byte and the applicable byte correction value, wherein the error is corrected.

In that case, the error code C1 needs to be used to determine both the byte position of the erroneous byte and the byte correction value for the erroneous byte. Thus, in contrast to the preceding case, in which the positions of one erroneous byte or of two erroneous bytes has (have) been determined as a group error, it is now possible for only a single byte error to be corrected with this error code C1.

In this case, the error signals E0 to E14 of the error detection circuits FE0 to FE14 do not indicate an error. A possible cause is that a codeword of the block error code has been distorted into a different codeword of this block error code. If for example the block error code is a 3-of-6 code, then the error detection circuit cannot find an error if a particular codeword has been changed into a different codeword of this 3-of-6 code.

In the example explained in more detail here, a combined error signal is formed from an OR function for the error signals E0 to E14, wherein each of the error signals assumes the value 1 when there is an error and assumes the value 0 when no error has been detected.

Therefore, the combined error signal $$E = E_0 \vee E_1 \vee \ldots \vee E_{14}$$

indicates whether any of the error signals $E_0$ to $E_{14}$ has determined a group error.

If one group error is indicated, then this group error is corrected by means of the error code C1. If two group errors are indicated, then these two group errors are corrected using the error code C1.

If none of the error signals E0 to E14 indicates a group error, then the combined error signal E also indicates no error. In that case, there is either no error or there is at least one byte error at an unknown error position, with a codeword of the block error code having been distorted into a different codeword of this block error code.

If there is at least one such byte error, then it is corrected solely using the error code C1, provided that this is possible. As explained, both the erroneous byte position and the applicable byte correction value need to be determined solely by means of the error code C1 in this case (because a group error has not been indicated by the block error codes, of course).

The error signals E0 to E14 determined by the error detection circuits FE0 to FE14, and the combined error signal E derived from said error signals, determine whether a correction to a single group error or to two group errors or a correction to a byte error with a byte position to be determined is made.

If errors that distort codewords of a block code into none codewords of the same block code and that are therefore detectable as group errors using the error detection circuits of the block error codes arise more frequently than errors that distort codewords of one block error code into different codewords of the same block error code, then it can be advantageous to use a circuit arrangement that can use a fixed number of check bits to correct more group errors than byte errors for which the erroneous byte position has not been determined in advance. In other words, it is advantageous that in the case of at least one group error detected by means of the block error codes the error code C1 can correct a larger number of byte errors than if no group error has been detected, even though there is (at least) one byte error that then needs to be detected and corrected solely by the error code C1.

A relatively small number of check bits of the error code C1 can therefore be used in the example explained here to correct up to two group errors or else one byte error without an error position being known beforehand.

In the circuit arrangement shown in FIG. 14 that is specified in example fashion below, error signals E0 to EL−1 determined by the error detection circuits 130 to 13L−1 are taken as a basis for correcting a first number of errors, what are known as the group errors, and a second number of errors, which are not detectable as group errors by the error detection circuits 130 to 13L−1, using the error code C1.

Optionally, it is possible to determine whether more than two of the error signals E0 to E14 indicate an error. In such a case, at least three group errors are detected and, according to the present example, an incorrigible error can be indicated (in the example chosen here, up to two byte errors detected as group errors or one byte error, provided that it has not been detected as a group error, can be corrected by means of the error code C1).

Fundamentally, depending on the example, the field of use and the chosen block error codes and error codes, it is possible for different combinations of numbers of detected group errors, undetected group errors and byte errors to be detected and/or corrected.

By way of example, it is possible to use a circuit arrangement for the error code C1 that, using error signals E0 to EL−1, permits at least one of the following corrections:
- a correction for up to a first number of group errors and no further byte errors;
- a correction for up to a second number of group errors and up to a third number of byte errors, with no group errors being indicated for the third number of byte errors;
- a correction for up to a fourth number of byte errors for which no group errors are indicated.

FIG. 14 shows an example circuit arrangement for forming a byte correction signal for a possibly erroneous data byte XI'. In example fashion, a byte-error-correcting code having an H-matrix according to equation (5) is used. Furthermore in example fashion, the Galois field GF(24) is assumed.

It is possible that the error signal EI indicates an error in the I-th byte and that a correction of this error is made by virtue of a byte correction value formation unit KBI, described in FIG. 10, providing a byte correction signal eI, according to the byte correction value formation unit 101, that is XORed on a component-by-component basis with the data byte XI' to be corrected to give $X_{cor}^i$=XI'+eI.

In example fashion, it is assumed that EI=1 indicates an error in the I-th byte and EI=0 indicates no error in the I-th byte.

A combined error signal E can be provided according to FIG. 4 as an output signal of the error detection circuit 41. In this case, the error detection circuit 41 is configured such that it holds for the combined error signal E that:

$$E=E_0 \vee E_1 \vee \ldots \vee E_{14}. \tag{46}$$

If it holds that the error signal EI=1, then the combined error signal E=1 is also obtained. The data byte XI is in this case a 4-bit byte that has been coded for example into a codeword WI of a 3-of-6 code from memory cell values using the block error code BFI. The error signal EI indicates by means of the value 1 that the codeword WI of the 3-of-6 code has been disrupted by an error to produce a bit sequence WI' that is not a codeword of the 3-of-6 code.

In particular, an error is indicated by the error signal EI=1 if there is a 1-bit error and the byte WI' has precisely two ones instead of three ones.

However, it is also possible that the byte WI is disrupted to produce an erroneous byte WI' that is a codeword of the block error code BCI. By way of example, a correct byte WI=111000 can be disrupted to produce an erroneous byte WI'=100101; both are codewords of the block error code BCI. In that case, the error signal EI is equal to 0, and an error is not detected. The erroneous byte WI' from memory cell values can be transformed by an appropriate transformation circuit into an erroneous data byte XI'.

If the error code C1 is a byte-error-correcting code, the possibly erroneous data byte XI' can be corrected using this error code, even though the error signal EI is equal to 0.

A correction for the possibly erroneous byte XI' when the byte error position is unknown can be made using the error code C1 if the byte error signal EI=0 and also no other byte error signal is not equal to 0.

If a combined error signal E is determined by equation (46), then the value 0 for the combined error signal E indicates that none of the error signals E0 to E14 indicates an error in one of the bytes of the memory cell values.

Using the circuit arrangement shown in FIG. 14, it is possible to correct an error in an I-th erroneous data byte XI' if the applicable byte error signal EI of the block error code CFI indicates a byte error in the I-th read byte WI' from memory cell values. In this case, it is possible that no more than one further byte error signal indicates a byte error in a byte other than the I-th byte or that no further byte error signal of a further block error code indicates a byte error. To correct the erroneous byte XI' using the error code C1, it is known from the value of the error signal EI in this case that an error needs to be corrected in the I-th data byte. This corresponds to the correction of a group error. Byte-error-correcting codes used here in example fashion allow one or two group errors to be corrected.

The block error code CFI is used by the error detection circuit FEI to determine the error signal EI for I∈{0, . . . , L−1} (see e.g. FIG. 1). The byte correction value eI or the byte correction value eI' is determined using the error code C1. If the error signal EI=1, then there is a group error and in that case the error code C1 determines only the byte correction value eI≠0 provided at the output of the byte correction value formation unit 101. If the error signal EI=0, then the byte correction value formation unit 101 outputs the byte correction value eI=0.

If, when the error signal EI=0, there is a byte error at the I+1-th byte position, then the I+1-th byte, which, when there is no error, is a particular codeword of the block error code CFI, is erroneously distorted into a different codeword of this block error code CFI. The NOR circuit 144 outputs the value 1, which is routed via the AND circuit 148 on account of the combined error signal E=0. Therefore, the AND circuit 145 provides the value s1 at its output, said value being the same as the byte correction value eI' that is output at the output of the XOR circuit 146 on account of eI=0 and is XORed in the XOR circuit 147 with the byte XI' to be corrected to produce the corrected byte $X_{cor}^I$.

It is also possible for the erroneous data byte to be corrected, provided that the error is corrigible using the error code C1, if the I-th data byte is erroneously disrupted to produce XI' and if no byte error signal of a block error code indicates a byte error. In that case, the circuit arrangement shown in FIG. 14 is used to determine that there is an error in the I-th byte position. The byte-error-correcting error code C1 used here in example fashion can be used to correct a byte error at a byte position to be determined.

The error correction for the I-th data byte XI' using the byte correction value eI is made if the error signal EI is equal to 1; accordingly, a correction is made using a byte correction value eI' if the combined error signal E is equal to 0 and if it holds that $$s_1 \cdot \alpha^I + s_2 = 0, \text{ where } s_1 \neq 0 \tag{47}.$$

FIG. 14 comprises
the byte correction value formation unit 101 having two 4-bit inputs, one 1-bit input, to which the error signal $E_I$ is applied, and one 4-bit output, which provides the byte correction value $e^I$,
4-bit input lines 1410 to 1413,
a constant multiplier 142 having a 4-bit input, a 1-bit second input and a 4-bit output,
XOR circuits 143, 146 and 147, each having two 4-bit inputs and one 4-bit output,
a NOR circuit 144 having a 4-bit input and a 1-bit output,
an AND circuit 145 having a 4-bit first input, a 1-bit second input and a 4-bit output,
an AND circuit 148 having two 1-bit inputs and one 1-bit output, and
an inverter 149 having a 1-bit input and a 1-bit output.

The byte correction value formation unit 101 is for example also depicted in FIG. 10.

If it holds that the error signal EI=0, then the 4-bit byte correction value eI is equal to 0000.

The input lines 1410 to 1413 have (in the order of the cited connections) the 4-bit signal values: s1+s2·Σ−1, s1·Σ−1, s2 and s1 present on them.

The two inputs of the byte correction value formation unit 101 are connected to the input lines 1410 and 1411.

The input line 1412 is connected to the first input of the XOR circuit 143, the second input of which has the output of the constant multiplier 142 connected to it. The first input of the constant multiplier 142 is connected to the input line 1413 and the second input of the constant multiplier 142 has the constant αI applied to it. The output of the XOR circuit 143 is connected to the input of the NOR circuit 144.

The NOR circuit 144 outputs the value 1 if its input has the value 0000 applied to it, and it outputs the value 0 if its input has a value not equal to 0000 applied to it.

The output of the NOR circuit 144 is connected to the first input of the AND circuit 148; the second input of the AND circuit 148 is connected to the output of the inverter 149, the input of which has the combined error signal E applied to it.

The output of the AND circuit 148 is connected to the 1-bit second input of the AND circuit 145, the 4-bit first input of which is connected to the input line 1413. The output of the AND circuit 145 is connected to the first input of the XOR circuit 146. The second input of the XOR circuit 146 is connected to the output of the byte correction value formation unit 101.

The AND circuit 145 is configured such that it outputs the value 0000 at its 4-bit output if its second input has the binary signal 0 applied to it. Accordingly, the AND circuit 145 provides the value s1 at its output if its second input has the binary signal 1 applied to it.

The output of the XOR circuit 146 is connected to the first input of the XOR circuit 147. The second input of the XOR circuit 147 has the possibly erroneous data byte XI', which may need to be corrected, applied to it. The corrected data byte $X_{cor}^I$ is output at the output of the XOR circuit 147.

If the value of the error signal EI=1 indicates an error in the I-th byte WI' of the memory cell values, a correction for the applicable I-th data byte XI' can be made using the byte correction value eI determined by the byte correction value formation unit 101. In that case, the combined error signal E=1 and the AND circuit 145 outputs the value 0000. If there is only one error in the I-th byte of the memory cell values or one error in the I-th byte and one further byte of the memory cell values, then the corrected value $X_{cor}^I$ is the same as the error-free value XI, since the error code C1 used here in example fashion is a byte-correcting code that can correct one or two byte errors with known erroneous byte positions or, in other words, two group errors.

If the value of the error signal EI=0, then the block error code CFI does not detect an error in the I-th byte, and the byte error correction value eI is equal to 0000.

If it thus holds that the combined error signal E=0, then an error has not been detected in any of the bytes of the memory cell values by the applicable block error codes. If additionally the condition according to equation (47) is satisfied, then the second 1-bit input of the AND circuit 145 has the value 1 applied to it, so that the AND circuit 145 provides the value eI'=s1 at its output. In that case, the data byte XI' is erroneous and the read byte WI' of the memory cell vales is an erroneous codeword (i.e. a codeword of the block error code that has come from the actually correct codeword as a result of multiple bit errors) of the block error code CFI, which means that the error cannot be detected by the block error code CFI. The XOR circuit 146 then outputs the value eI'=s1, which is logically combined in the XOR circuit 147 with the data byte XI' to be corrected to produce $X_{cor}^I = X^{I\prime} + e^{I\prime}$. The data bit error code C1 used is in this example embodiment a 1-byte-error-correcting code that corrects an erroneous data byte XI' to the error-free value XI, provided that there is no further error.

It is possible to provide the circuit arrangement depicted in FIG. 14 for I, where 0≤I≤14, for correcting the possibly erroneous bytes X0' to X14' in parallel, or to implement it in parallel, for the byte positions 0, . . . , 14 to be corrected so that the determination of the required byte correction values for different bytes is performed in parallel. In regard to the interpretation of the term "in parallel", reference is made to the explanations above.

If it holds that the error signal EI=1 and if the error signals for the other bytes are equal to 0, then the I-th circuit arrangement provides the byte correction value eI≠0000 at its output, while all the remaining circuit arrangements provide the byte correction value 0000 in parallel.

If it holds that
the error signal $E^I=1$,
a further error signal $E^K=1$, where I≠K and
all other error signals are equal to 0,
then
the I-th circuit arrangement provides the byte correction value $e^I \neq 0000$ at its output and
the K-th circuit arrangement provides the byte correction value $e^K \neq 0000$ at its output,
whereas all the other remaining circuit arrangements provide the byte correction value 0000 (in parallel).

If all the error signals E0, . . . , E14 are equal to 0 and if there is a 1-byte error in the N-th byte XN', then the N-th circuit arrangement provides the byte correction value eN'≠0000 at its output, while all the remaining circuit arrangements provide a byte correction value 0000 in parallel.

In the present example, a word length of 4 bits and the Galois field GF($2^4$) have been assumed in example fashion. These are merely examples used for the purposes of illustration. It is accordingly possible to use other word lengths and other Galois fields. Furthermore, other error codes, in particular error codes that detect and/or correct multiple byte errors, can be used.

Furthermore, an unshortened code has been used as the error code in example fashion. It is accordingly possible to use a shortened code in which columns of the H-matrix of the unshortened code have been deleted.

Galois Field

The examples below relate in particular to a Galois field $GF(2^4)$ that is cited here as an example.

For a Galois field $GF(2r)$, in the present example where r=4, a few basic concepts from Galois fields, e.g. different representations of the elements of the Galois field, and from operations in the Galois field are described below. By way of example, in this connection, reference is made to Okano, H.; Imai, H.: "A Construction Method for High-Speed Decoders Using ROM's for Bose-Chaudhuri-Hocquenghem and Reed-Solomon Codes", Trans. Computers, C-36, pages 1165 to 1171, 1987. That document describes implementations of Galois field operations using read-only memories (ROMs).

In regard to the Galois field $GF(2^4)$, table 4 shows the $(2^4=)16$ elements of the Galois field in their exponential representation as a power of a generating element $\alpha$, as a third-degree polynomial and as a binary vector having four components. The modular polynomial used is a polynomial $$M(z)=z^4+z+1.$$

TABLE 4

Elements of the Galois field $GF(2^4)$

| Exponential representation | Polynomial representation | Vector representation |
|---|---|---|
| 0 | 0 | 0000 |
| $\alpha^0$ | $z^0 \bmod M(z) = 1$ | 1000 |
| $\alpha^1$ | $z^1 \bmod M(z) = z$ | 0100 |
| $\alpha^2$ | $z^2 \bmod M(z) = z^2$ | 0010 |
| $\alpha^3$ | $z^3 \bmod M(z) = z^3$ | 0001 |
| $\alpha^4$ | $z^4 \bmod M(z) = 1 + z$ | 1100 |
| $\alpha^5$ | $z^5 \bmod M(z) = z + z^2$ | 0110 |
| $\alpha^6$ | $z^6 \bmod M(z) = z^2 + z^3$ | 0011 |
| $\alpha^7$ | $z^7 \bmod M(z) = 1 + z + z^3$ | 1101 |
| $\alpha^8$ | $z^8 \bmod M(z) = 1 + z^2$ | 1010 |
| $\alpha^9$ | $z^9 \bmod M(z) = z + z^3$ | 0101 |
| $\alpha^{10}$ | $z^{10} \bmod M(z) = 1 + z + z^2$ | 1110 |
| $\alpha^{11}$ | $z^{11} \bmod M(z) = z + z^2 + z^3$ | 0111 |
| $\alpha^{12}$ | $z^{12} \bmod M(z) = 1 + z + z^2 + z^3$ | 1111 |
| $\alpha^{13}$ | $z^{13} \bmod M(z) = 1 + z^2 + z^3$ | 1011 |
| $\alpha^{14}$ | $z^{14} \bmod M(z) = 1 + z^3$ | 1001 |

A representation of the elements of a Galois field as powers of the accompany matrix of a for example primitive modular polynomial is known from Rao, T.; Fujiwara, E.: "Error Control codes for Computer Systems", Prentice Hall 1989, pages 222 to 226, for example. This permits advantageous manifestations of the H-matrix and the G-matrix of a byte-error-detecting and byte-error-correcting code in specific instances of application.

All 16 third-degree polynomials with binary coefficients represent a respective element of the Galois field $GF(2^4)$. They are listed as polynomials in z in the second column of table 4. The binary coefficients of the powers z0, z1, z2, z3 of the polynomials are the components of the vector representation.

The first column of table 4 shows the exponential representation of the elements of the Galois field $GF(2^4)$ as powers $\alpha 0$ to $\alpha 14$ of a generating element $\alpha$. For the element 0 in the polynomial representation or 0000 in the vector representation, there is no representation in the exponential representation.

The element $\alpha i$ in the exponential representation has the corresponding polynomial $$z^i \bmod(M(z))$$

in the polynomial representation, where M(z) is the modular polynomial of the Galois field, in this case the modular polynomial $M(z)=z^4+z+1$.

Thus, for example $\alpha 3$ in the exponential representation corresponds to the polynomial $$z^3 \bmod(z^4+z+1)=z^3$$

in the polynomial representation.

For the multiplication of two elements $\alpha i$ and $\alpha j$ in the exponential representation, it holds that, when 2r−1=15:

$$\alpha_i \cdot \alpha^j = \alpha^{[i+j] \bmod (2^r-1)} = \alpha^{[i+j] \bmod 15}, \quad (48)$$

so that the multiplication of two elements in the exponential representation corresponds to an addition of their exponents modulo $(2^r-1)$. As such, for example it also holds that:

$$\alpha^9 \cdot \alpha^{10} = \alpha^{19 \bmod 15} = \alpha^4.$$

The inverse element $\alpha q$ of the element $\alpha i$ is determined by the relationship $$\alpha^i \cdot \alpha^q = \alpha^{[0] \bmod (2^r-1)} = \alpha^{[0] \bmod 15} \quad (49)$$

or $$i+q=[0] \bmod(2^r-1)=[0] \bmod 15 \quad (50).$$

The inverse element of an element $\alpha i$ is also referred to as $\alpha$-i.

For example it holds that $$\alpha^{-5}=\alpha^{10}$$

on account of $$\alpha^5 \cdot \alpha^{10} = \alpha^{[15] \bmod 15} = \alpha^0.$$

Table 5 shows a representation of mutually inverse elements in the vector representation for the Galois field $GF(2^4)$, wherein the element 0000 of the vector representation has no inverse element.

TABLE 5

Inverses in vector representation of the Galois field $GF(2^4)$

| Element | Inverse element |
|---|---|
| 1000 | 1000 |
| 0100 | 1001 |
| 0010 | 1011 |
| 0001 | 1111 |
| 1100 | 0111 |
| 0110 | 1110 |
| 0011 | 0101 |
| 1101 | 1010 |
| 1010 | 1101 |
| 0101 | 0011 |
| 1110 | 0110 |
| 0111 | 1100 |
| 1111 | 0001 |
| 1011 | 0010 |
| 1001 | 0100 |

As such, for example according to the fourth row of table 5, "0001" and "1111" are the vector representations of mutually inverse elements. According to table 4, the vector representation of 0001 is α3, and the vector representation of 1111 is α12; it holds that:

$$\alpha^3 \cdot \alpha^{12} = \alpha^{01} \text{ or } 3+12=15 \mod 15=0.$$

Table 6 shows, for the vector representation of the elements of the Galois field GF($2^4$), values of the exponents of the elements in the exponential representation. This association will be referred to as the LOG function. The inverse association, which associates the applicable vector representation with an exponent of an element in the exponential representation shown in table 6, would be referred to as the EXP function.

TABLE 6

LOG function for the Galois field GF($2^4$)

| Element | LOG |
|---------|-----|
| 1000    | 0   |
| 0100    | 1   |
| 0010    | 2   |
| 0001    | 3   |
| 1100    | 4   |
| 0110    | 5   |
| 0011    | 6   |
| 1101    | 7   |
| 1010    | 8   |
| 0101    | 9   |
| 1110    | 10  |
| 0111    | 11  |
| 1111    | 12  |
| 1011    | 13  |
| 1001    | 14  |

As such, for example the element 0001 in the vector representation is assigned the value 3 by the function LOG(0001)=3, since α3 has the vector representation 0001. Accordingly, it holds that EXP(3)=0001, since LOG(001)=3.

The LOG function therefore maps the vector representation of the elements into the exponents of the exponential representation. The EXP function is the inverse transformation of the LOG function. It maps the exponents of the elements in their exponential representation into the vector representation of these elements.

In the polynomial representation, the 16 elements are represented by the 16 third-degree polynomials with binary coefficients. The multiplication of two elements in the Galois field can also be performed in their polynomial representation. The multiplication of two elements P1(z) and P2(z) of the polynomial representation has the corresponding multiplication of the polynomials modulo the modular polynomial M(z), so that when M(z)=z4+z+1 it holds that:

$$P_1(z) \cdot P_2(z) = [P_1(z) \cdot P_2(z)] \mod(z^4+z+1). \quad (51)$$

For example it thus holds that:

$$[(z+z^2+z^3) \cdot z] \mod(z^4+z+1) = [z^2+z^3+z^4] \mod (z^4+z+1) = 1+z+z^2+z^3.$$

The addition of two elements in the vector representation has the corresponding component-by-component addition modulo 2 of the components. The addition of two elements in the polynomial representation has the corresponding addition of the coefficients of the polynomials modulo 2.

FIG. 15: Galois Field Multiplier in GF($2^4$)

An example realization of a Galois field multiplier in GF(24) is described below. The vector representation is transformed into the exponential representation, the exponents are added modulo 15 and the exponent is transformed back into the vector representation. In this case, the element 0, for which there is no exponential representation, needs to be taken into consideration separately.

FIG. 15 shows an example circuit arrangement for multiplying two elements of a Galois field, these elements being provided in their vector representation. As an example, the Galois field GF(24) is again used. Such a circuit arrangement can be referred to as a Galois field multiplier.

The circuit arrangement shown in FIG. 15 comprises
two transformation circuits 151, 152 having a 4-bit input and a 4-bit output in each case for realizing the LOG function,
an adding circuit 153 having two 4-bit inputs and one 4-bit output,
a transformation circuit 156 having a 4-bit input and a 4-bit output for realizing the EXP function,
an AND circuit 158 having a first 4-bit input, a second 1-bit input and a 4-bit output,
two NOR circuits 154, 155 having a 4-bit input and a 1-bit output in each case,
a NOR circuit 157 having two 1-bit inputs and one 1-bit output.

The input of the transformation circuit 151 is connected to the input of the NOR circuit 154. The input of the transformation circuit 151 has the four components v1, v2, v3, v4 of an element $$v = v_1, v_2, v_3, v_4$$

of the Galois field GF($2^4$) in vector representation applied to it. The transformation circuit 151 outputs the 4-bit signal LOG(v) at its output, which is connected to the first input of the adding circuit 153.

The input of the transformation circuit 152 is connected to the input of the NOR circuit 155. The input of the transformation circuit 152 has the four components $v_1^*, v_2^*, v_3^*, v_4^*$ of an element $$v^* = v_1^*, v_2^*, v_3^*, v_4^*$$

of the Galois field GF($2^4$) in vector representation applied to it. The transformation circuit 152 outputs the 4-bit signal LOG(v*) at its output, which is connected to the second input of the adding circuit 153.

The adding circuit 153 is configured such that it forms a sum $$[LOG(v)+LOG(v^*)] \mod 15$$

for $$v \neq 0000 \text{ and } v^* \neq 0000$$

and provides said sum at its output. The output of the adding circuit 153 is connected to the input of the transformation circuit 156, which forms a value $$EXP([LOG(v)+LOG(v^*)] \mod 15)$$

for $$v \neq 0000 \text{ and } v^* \neq 0000$$

and provides said value at its output. This value is equal to the product of v and v* in the Galois field GF($2^4$), provided that it holds that v, v*≠0.

The output of the transformation circuit 156 is connected to the first input of the AND circuit 158, which provides the result of the multiplication v·v* in the Galois field GF(24) at its output.

The output of the NOR circuit 154 is connected to the first input of the NOR circuit 157, and the output of the NOR circuit 155 is connected to the second input of the NOR circuit 157. The output of the NOR circuit 157 is connected to the second input of the AND circuit 158.

The AND circuit 158 is therefore configured such that when its second input has the binary value 0 applied to it, it outputs the value 0000 at its output, and such that when its second input has the binary value 1 applied to it, it provides the value applied to the first input at its output.

If v=0000, then the NOR circuit 154 outputs the value 1 and the NOR circuit 157 outputs the signal 0 at its output, so that the AND circuit 158 outputs the value 0000.

If v*=0000, then the NOR circuit 155 outputs the value 1 and the NOR circuit 157 outputs the signal 0 at its output, so that the AND circuit 158 outputs the value 0000.

If the two multipliers v and v* are different from the value 0000, then the NOR circuits 154 and 155 each deliver the value 0. Consequently, the NOR circuit 157 delivers the binary value 1 at its output, so that the AND circuit 158 outputs the value applied to its first input at its output.

In other words, the NOR circuits 154, 155 and 157 are therefore used to mask the undefined case in which at least one of the multipliers is equal to 0000.

If the value of the multiplier v* is constant, v is multiplied by a constant in the Galois field.

Constant Multipliers in the Galois Field

Examples of constant multipliers in the Galois field are shown below that are embodied as linear circuits by means of XOR circuits.

The multiplication of an arbitrary element by a constant is described in the polynomial representation. The polynomial of the arbitrary element and the polynomial of the constant are multiplied modulo the modular polynomial of the Galois field. The components of the resulting polynomial form the components of the vector representation of the product. The components of the vector representation of the product are XOR functions for the coefficients, as shown below.

Therefore, the constant multiplier can be described as a linear circuit. In this case, the outputs of the respective constant multiplier can be determined as XOR functions for inputs.

An arbitrary element of the Galois field GF(2r) that needs to be multiplied by a constant in the Galois field is denoted by v in example fashion. In vector representation, it holds that:

$$v=v_1,\ldots,v_r.$$

As an example of the Galois field, GF(24) is chosen. Thus, v is obtained in its vector representation as a 4-bit vector (binary vector)

$$v=v_1,v_2,v_3,v_4.$$

In this case, v1 to v4 are referred to as components of v. The constant by which v is multiplied is denoted by a, wherein it holds in vector representation that $$a=a_1,a_2,a_3,a_4$$

and in exponential representation that $$a=\alpha^i.$$

The product of the multiplication is specified in vector representation by $$y=y_1,y_2,y_3,y_4,$$

where $y_1$ to $y_4$ are the components of the product y.

As has already been explained, a multiplication of two elements in the Galois field GF(2r) can also be realized using the polynomial representation. In example fashion, we again consider the Galois field GF(24).

The element v will be multiplied by the constant element a (both in vector representation) below. In polynomial representation, it holds that:

$$v(z)=v_1+v_2z+v_3z^2+v_4z^3,$$

$$a(z)=a_1+a_2z+a_3z^2+a_4z^3,$$

$$y(z)=y_1+y_2z+y_3z^2+y_4z^3.$$

As a result of the multiplication of the elements v and a, it follows that:

$$v(z)\cdot a(z)\bmod [M(z)]=(v_1+v_2z+v_3z^2+v_4z^3)\cdot(a_1+a_2z+a_3z^2+a_4z^3)\bmod [z^4+z+1]. \quad (52)$$

In this case, the components a1 to a4 are binary values, i.e. either 0 or 1.

If for example a1,a2,a3,a4=1,0,0,0 is the vector representation of α0, then the polynomial representation of α0 is equal to 1. Therefore, it holds in the polynomial representation that $$y_1+y_1z+y_3z^2+y_4z^3=(v_1+v_2z+v_3z^2+v_4z^3)\cdot(1)\bmod [z^4+z+1]=v_1+v_2z^2+v_4z^3$$

and hence $$y_1=v_1$$

$$y_2=v_2$$

$$y_3=v_3$$

$$y_4=v_4, \quad (53)$$

so that in this case the vector v remains unchanged and it holds that y=v. The outputs of the constant multiplier for the constant $\alpha^0$ are connected directly to the applicable inputs.

FIG. 16a shows a possible realization for a constant multiplier corresponding to Equation (53) for the constant α0 with the vector representation a=1000.

In this case, the inputs of the constant multiplier that carry the components v1,v2,v3,v4 of the vector representation of the element v of the Galois field that needs to be multiplied by the constant α0 are connected directly to the outputs provided in the components y1,y2,y3,y4 of the product y.

As a further example, the multiplication by the constant α1 is considered. The vector representation of α1 is a=0100 and the polynomial representation of α1 is z. It therefore holds in polynomial representation that:

$$y_1+y_2z+y_3z^3+y_4z^3=(v_1+v_2z+v_3z^2+v_4z^3)\cdot(z)\bmod [z^4+z+1]=v_1z+v_2z^2+v_3z^3+v_4z^4 \bmod [z^4+z+1]=v_4+(v_1+v_4)z+v_2z^2+v_3z^3.$$

The following is thus obtained:

$$y_1=v_4$$

$$y_2=v_2+v_4$$

$$y_3=v_2$$

$$y_4=v_3. \quad (54)$$

FIG. 16b shows a possible realization for the constant multiplier corresponding to Equation (54) for the constant α1 with the vector representation a=0100.

The input carrying the component v1 is connected to the first input of an XOR circuit 161. The second input of the XOR circuit 161 is connected to the component v4. The component v4 is also present at the output carrying the component y1. The output of the XOR circuit 161 is connected to the output carrying the component y2.

The input carrying the component v2 is connected to the output carrying the component y3, and the input carrying the component v3 is connected to the output carrying the component y4.

As an additional example, the multiplication with the constant α6 is considered. The vector representation of α6 is a=0011 and the polynomial representation of α6 is z2+z3. It therefore holds in polynomial representation that:

$$y_1+y_2z+y_3z^2+y_4z^3=(v_1+v_2z+v_3z^2+v_4z^3)\cdot(z^2+z^3) \bmod [z^4+z+1]=v_1z^2+v_2z^3+v_3z^4+v_4z^5+v_1z^3+v_2z^4+v_3z^5+v_4z^6 \bmod [z^4+z+1]=v_1^2v_2z^3+v_3(1+z)+v_4(z+z^2)+v_1z^3+v_2(1+z)+v_3(z+z^2)+v_4(z^2+z^3)=v_2+v_3+(v_2+v_4)z+(v_1+v_3)z^2+(v_1+v_2+v_4)z^3.$$

The following is thus obtained:

$$y_1=v_2+v_3$$

$$y_2=v_2+v_4$$

$$y_3=v_1+v_3$$

$$y_4=v_1+v_2+v_4. \quad (55)$$

FIG. 16c shows a possible realization of the constant multiplier corresponding to Equation (55) for the constant α6 with the vector representation a=0011.

In this regard, the constant multiplier comprises five XOR circuits 162, 163, 164, 165, 166.

The input carrying the component v1 is connected to the first input of the XOR circuit 164 and to the first input of the XOR circuit 165. The output of the XOR circuit 165 is routed to the first input of the XOR circuit 166. The input carrying the component v2 is connected to the first input of the XOR circuit 162, to the first input of the XOR circuit 163 and to the second input of the XOR circuit 165. The input carrying the component v3 is connected to the second input of the XOR circuit 162 and to the second input of the XOR circuit 164. The input carrying the component v4 is connected to the second input of the XOR circuit 163 and to the second input of the XOR circuit 166.

The output of the XOR circuit 162 is connected to the output of the constant multiplier carrying the component y1. The output of the XOR circuit 163 is connected to the output of the constant multiplier carrying the component y2. The output of the XOR circuit 164 is connected to the output of the constant multiplier carrying the component y3. The output of the XOR circuit 166 is connected to the output of the constant multiplier carrying the component y4.

Address Error Detection

One option is that the data bits comprise address information. The address information can be address bits, groups of address bits, bits derived from address bits or groups of bits derived from address bits. The group of address bits can also be referred to as an address byte.

This allows even address errors to be detected efficiently.

A memory address ad can have in particular n address bits ad0, . . . , adn−1, so that it holds that $$ad=ad_0, \ldots ,ad_{n-1},$$

where n is for example greater than or equal to 2 m. In this case, m is the number of bits in a byte.

The memory address ad is transformed by a transformation Tr into L address bytes $$Ad=Ad^0, \ldots ,Ad^{L-1},$$

where it holds that L≥2. Furthermore, it holds that:

$$Ad=Ad^0, \ldots ,Ad^{L-1}=Tr(ad)=Tr(ad_0, \ldots ,ad_{n-1}). \quad (56)$$

An address byte in this case has m bits in example fashion.

The data bits to be stored form data bytes U. From these data bytes U and from the address bytes Ad, check bytes C are determined such that the data bytes, the address bytes and the check bytes form a codeword of an error code Cod. The check bytes C are therefore dependent both on the data bytes U and on the address bytes Ad.

The error code Cod can be an error code that either corrects byte errors or detects and corrects byte errors. By way of example, the error code can be a Reed Solomon code or a generalized Reed Solomon Code.

When writing to an addressable memory, data bytes U and corresponding check bytes C are stored at the address ad. The check bytes C are determined such that the data bytes U, the address bytes Ad and the check bytes C form a codeword of the error code Cod.

In this case, the address bits ad0, . . . , adn−1 of the write address ad are transformed by a transformation Tr into the L address bytes Ad0 . . . , AdL−1.

Address bytes or address bits or bits derived from the address bits are not stored in this case in example fashion, because the address is provided during read access and hence can be taken into consideration during back-transformation accordingly.

During read access, the memory is accessed at a read address ad'. In this case, possibly erroneous data bytes U' and corresponding possibly erroneous check bytes C' are read. The address bits $ad_0'$, . . . , $ad_{n-1}'$ of the read address ad' are provided during read access and transformed by means of the transformation Tr into L address bytes Ad'. In this case too, it again holds that L≥2.

If there is an error in the data bytes, then the error is corrected in at least one of the data bytes, provided that this error is corrigible (and also supposed to be corrected) using the error code.

If there is an error in the check bytes, one option is also to correct an error in at least one check byte, provided that the error is corrigible by the error code.

Additionally, an arbitrary error in the L address bytes is also detected using the error code.

There is an address error if the read access to the memory address ad is supposed to take place, but is actually diverted to the memory address ad'≠ad. Such an error is detected because the coded memory address ad is not the same as the actually used memory address ad' in this case. In other words, it is thus possible for an address error to be found if the two memory addresses ad and ad' are not the same.

If the error code Cod is a τ-byte-error-correcting code, where τ≥2, and if there are L=τ address bytes into which the erroneous address bits are transformed by the transformation Tr, then an address error is detected in the following manner: if a byte error position signal indicating a byte error is determined for at least one of the τ address bytes, then the error is detected. Since the error code is a τ-byte-error-correcting code, any address error that distorts at least one of the L=τ address bytes is detected.

The address bytes are bytes of the error code for which byte error position signals are determined and no byte correction values need to be determined If an address error occurs that distorts at least one of the address bytes, then the address error is explicitly identifiable as an address error from the byte error position signals for the address bytes.

If the error code Cod is a t-byte-error-correcting and (t+1)-byte-error-detecting code, where t≥1 and L=t+1≥2 and, and if there are L=t+1 address bytes into which the erroneous address bits are transformed by the transformation Tr, then an address error can be detected as follows:

1. If a byte error position signal indicating a byte error is determined for at least one of the t+1 address bytes, then the error is detected. Since the error code is a t-byte-error-correcting code, any address error that distorts no more than t address bytes is detected.
2. If all L=t+1 address bytes are distorted by an address error, then there is a (t+1)-byte error. Since the error code is a (t+1)-byte error-detecting code, the (t+1)-byte error is detected in this case. In this instance, a distinction is not drawn between a possible other (t+1)-byte error, for example in the data bytes or the check bytes, and an error in the address bytes. Since it is a detectable but incorrigible error, such a distinction is also not necessary.

The address bytes are, as explained, bytes of the error code for which byte error position signals are determined but no byte correction values need to be determined. In this case, it is sufficient to detect that there is an address error, that is to say access to an incorrect address.

Byte error position signals for the L address bytes can be determined at the same time (that is to say at parallel times in the broader sense) at least in some cases. Accordingly, it is also possible for at least two of the byte error position signals to be determined at the same time.

Hitherto, a variant has been described in which the address bits ad are transformed by a transformation Tr into L address bytes Ad and the address bits of the transformed address bytes are not stored in the memory. Rather, the address is provided when the data are read, for example by an address generator.

Another variant is to also store the address bits (fully or in part) in the memory. Alternatively or additionally, it is also possible for bits derived from the address bits, e.g. parity bits of the address bits, to be stored in the memory.

Furthermore, one option is to store a byte comprising address bits and/or a byte based on bits derived from the address bits in the memory.

Further, one option is to logically combine bits from address bytes with bits from data bytes and/or with bits from check bits, for example by means of a component-by-component XOR operation, and to store the combined bits in the memory.

The transformation of the memory address into address bytes can be effected by different circuits, for example a combination circuit or a sequential circuit, for example using feedback shift registers or using a processing unit, e.g. a processor unit, a microprocessor and/or a microcontroller.

As such, one option is to transform the address bits into address bytes by means of a linear circuit using XOR gates.

One option is also to transform the address bits into address bytes by means of a nonlinear circuit in the form of a Read-Only Memory (ROM).

Furthermore, one option is to transform the address bits into address bytes by using a processor unit, a microprocessor and/or a microcontroller.

Further, one option is to transform the address bits into address bytes by means of a computer program.

Therefore, it is thus also possible, by way of example, for a method to be proposed for processing data bits, so that detection of address errors is enabled,
 in which the data bits are transformed into first data bytes by means of a first transformation,
 in which address bits of a first memory address are transformed into first address bytes,
 in which first check bytes are determined by using the first data bytes and the first address bytes such that the first data bytes, the first address bytes and the first check bytes form a codeword of an error code,
 in which the first data bytes and the first check bytes are stored in a memory,
 in which second data bytes and second check bytes are read from the memory at a prescribed second memory address,
 in which address bits of the second memory address are transformed into second address bytes,
 in which a check is performed to determine whether the second data bytes, the second address bytes and the second check bytes form a codeword of the error code,
 in which if there is no codeword then a byte error position signal is determined for the address bytes.

On the basis of the byte error position signal for the address bytes, it is possible to determine whether or not there is an address error.

One option is that byte error position signals are determined for at least two address bytes.

Another option is that at least two of the byte error position signals are determined with overlapping timing or at the same time at least in some cases. Accordingly, one possibility is also that at least two of the byte error position signals are determined at successive times.

Further, one option is that the transformation of the address bits into the address bytes is effected by using a linear transformation. The linear transformation can be implemented as a combination circuit.

In this case, it is advantageous that the address error detection described efficiently prevents the wrong data from being accessed on the basis of an erroneous address, which would otherwise not be spotted by a downstream error detection circuit, since the incorrectly selected data are inherently correct, of course.

The approach described here allows additionally multiple errors within a group of address bits or errors in multiple groups of address bits to be detected.

Terminology

Some of the designations and relations used herein are reproduced below for an overview:

| | |
|---|---|
| Error code | $C$, $C^l$ |
| Block error code | $CF^l$ |
| Information bits (also: useful data bits) | $u = u_1, \ldots, u_q$ |
| Codeword | $x = x_1, \ldots, x_k$ |
| Check bits | $c_1, \ldots, c_p$ |
|  | $k = q + p$ |
| Error syndrome | $s$ |
| Subsyndrome (syndrome component) | $s_1, s_2, \ldots$ |
| Memory cell values | $w = w_1, \ldots, w_n$ |
| Number of memory cells | $n$ |
| Zeroth byte comprising $m_0$ data bits | $X^0 = x_1^0, \ldots, x_{m01}^0$ |
| (L − 1)-th byte comprising $m_{L-1}$ data bits | $X^{L-1} = x_1^{L-1}, \ldots, x_{mL-1}^{L-1}$ |
| Zeroth byte from memory cell values | $W^0 = w_1^0, \ldots, w_{n01}^0$ |
| Block error code | $CF^0$ |
| Length of the codewords of the block error code $CF^0$ | $n_0$ |

-continued

| | |
|---|---|
| (L − 1)-th byte from memory cell values | $W^{L-1} = w_1^{L-1}, \ldots, w_{nL1}^{L-1}$ |
| Block error code | $CF^{L-1}$ |
| Length of the codewords of the block error code $CF^{L-1}$ | $n_{L-1}$ |
| Zeroth byte from read memory cell values | $W^{0\prime} = w_1^{0\prime}, \ldots, w_{n0}^{0\prime}$ |
| Bytes of the codeword | $X = X^0, X^1, \ldots, X^{L-1}$ |
| Bytes of read (possibly erroneous) data bits | $X' = X^{0\prime}, X^{1\prime}, \ldots, X^{L-1\prime}$ |
| Error signals | $E_0$ to $E_{L-1}$ |
| Combined error signal | $E$ |
| Byte correction values | $e_0^X, e_1^X, \ldots, e_{L-1}^X$ |
| Corrected bytes | $X_{cor} = X_{cor}^0, X_{cor}^1, \ldots, X_{cor}^{L-1}$ |
| Check bits for the memory cell values | $Pr$ |
| Memory cell values for check bits to be written | $W[Pr]$ |
| Read memory cell values of the check bits | $W[Pr]'$ |
| Byte correction values | $e_0^W, e_1^W, \ldots, e_{L-1}^W$ |
| Corrected memory cell values | $W_{cor}^0, W_{cor}^1, \ldots, W_{cor}^{L-1}$ |

The invention claimed is:

1. A method for processing data bits, comprising:
transforming the data bits into first data bytes using a first transformation,
storing the first data bytes in a memory,
reading second data bytes from the memory,
wherein each of the second data bytes, when there is no error, is a codeword of at least one block error code,
determining at least one error signal per second data byte that indicates whether or not this second data byte is a codeword.

2. The method according to claim 1, wherein the data bits are transformed into first data bytes using the at least one block error code.

3. The method according to claim 2, wherein the at least one block error code is an m-of-n code.

4. The method according to claim 1, wherein the at least one error signal is taken as a basis for performing an error correction.

5. The method according to claim 1, wherein the data bits were coded using an error code.

6. The method according to claim 5, wherein the second data bytes are transformed into inverse second data bytes using a second transformation, which is the inverse of the first transformation.

7. The method according to claim 6, wherein the at least one error signal is used to correct the inverse second data byte using the at least one block error code, provided that the second data byte is not a codeword of the at least one block error code.

8. The method according to claim 6, wherein at least one inverse second data byte is corrected on the basis of the error signal using the error code if the error signal indicates that the second data byte on which the inverse second data byte is based is not a codeword of the block error code.

9. The method according to claim 6, wherein if error signals indicate an erroneous i-th and an erroneous j-th second data byte, then a byte correction value $e^i$ is determined for an i-th inverse second data byte $X^{i\prime}$ on the basis of subsyndromes $S_1$ and $s_2$ of an error syndrome, a byte position i and a component-by-component XOR sum $\alpha^i + \alpha^j$, where $\alpha$ is the generating element of the Galois field used.

10. The method according to claim 9, wherein the byte correction value $e^i$ for correcting the i-th inverse second data byte $X^{i\prime}$ is determined such that it holds that:

$$e^i = s_1 + \frac{s_2 + \alpha^j \cdot s_1}{\alpha^i + \alpha^j}.$$

11. The method according to claim 9, wherein the byte correction value $e^i$ is determined according to:

$$e^i = s_1 + s_2 \cdot \Sigma^{-1} + \alpha^i \cdot s_1 \cdot \Sigma^{-1},$$

where it holds that $$\Sigma = E_0 \cdot \alpha^0 + E_1 \cdot \alpha^1 + \ldots + E_{L-1} \cdot \alpha^{L-1},$$

and where $E_0$, $E_1$, $E_{L-1}$ denote the block error signals for the (L−1) second data bytes.

12. The method according to claim 9, wherein at least two byte correction values are determined in parallel, wherein at least one byte correction value is determined for an inverse second data byte that is correct and requires no correction.

13. The method according to claim 1,
wherein the first data bytes and first check bits, which are determined based on the first data bytes, are stored in the memory,
wherein second data bytes and second check bits are read from the memory,
wherein the at least one error signal and the second check bits are used to correct the second data byte, provided that the second data byte is not a codeword of the at least one block error code.

14. The method according to claim 13, wherein the corrected second data bytes are transformed into inverse corrected second data bytes by means of a second transformation, which is the inverse of the first transformation.

15. The method according to claim 13, wherein at least two byte correction values are determined for at least two second data bytes in parallel, wherein at least one byte correction value is determined for a second data byte that is correct and does not require correction.

16. The method according to claim 1, wherein an error correction is performed for at least two group errors or for an error at an unknown byte position.

17. The method according to claim 16, wherein if the at least one error signal indicates that a particular second data byte is not a codeword of the applicable block error code, then at least one erroneous bit of this second data byte is corrected taking into consideration the group error.

18. The method according to claim 13, wherein erroneous second data bytes are corrected in parallel or substantially in parallel.

19. The method according to claim 1, wherein neither the first data byte nor the second data byte comprises more than 12 bits each time.

20. The method according to claim 1, wherein at least two error signals are determined for at least two of the second data bytes in parallel or substantially in parallel.

21. An apparatus for processing data bits, comprising:
a processing unit, wherein the processing unit is configured to:
transform the data bits into first data bytes using a first transformation,
store the first data bytes in a memory,
read second data bytes from the memory, wherein each of the second data bytes, when there is no error, is a codeword of a block error code, determine one error signal per second data byte, wherein the error signal indicates whether or not this second data byte is a codeword.

22. The apparatus according to claim 21, wherein the memory comprises at least one of the following components:
a cache memory,
a register or a register array,
a flash memory,
an MRAM,
an SRAM,
a RE-RAM,
a PC-RAM,
an FE-RAM,
a CB-RAM,
a multibit memory,
a multilevel memory.

23. The apparatus according to claim 21, wherein the memory is part of the apparatus or is embodied separately therefrom.

24. The apparatus according to claim 21, wherein the processing unit is further configured to transform the second data bytes into inverse second data bytes by means of a second transformation, which is the inverse of the first transformation.

25. The apparatus according to claim 21, wherein the processing unit is further configured to:
store the first data bytes and first check bits, wherein the first check bits are determined based on the first data bytes,
read the second data bytes and second check bits from the memory,
correct the second data byte on the basis of the error signal and on the basis of the second check bits, provided that the second data byte is not a codeword of the block error code.

26. An apparatus for processing data bits, comprising
means for transforming the data bits into first data bytes using a first transformation,
means for storing the first data bytes in a memory,
means for reading second data bytes from the memory, wherein each of the second data bytes, when there is no error, is a codeword of a block error code,
means for determining one error signal per second data byte, wherein the error signal indicates whether or not this second data byte is a codeword.

* * * * *